(12) United States Patent
Yoshida et al.

(10) Patent No.: US 6,710,608 B2
(45) Date of Patent: Mar. 23, 2004

(54) CONTACT PROBE AND PROBE DEVICE

(75) Inventors: Hideaki Yoshida, Sanda (JP); Toshinori Ishii, Sanda (JP); Atushi Matsuda, Sanda (JP); Mituyoshi Ueki, Sanda (JP); Noriyoshi Tachikawa, Sanda (JP); Tadashi Nakamura, Sanda (JP); Naoki Katou, Sanda (JP); Shou Tai, Sanda (JP); Hayato Sasaki, Sanda (JP); Naohumi Iwamoto, Sanda (JP); Akihumi Mishima, Omiya (JP); Toshiharu Hiji, Omiya (JP); Akihiro Masuda, Omiya (JP)

(73) Assignee: Mitsubishi Materials Corporation, Tokyo (JP)

( * ) Notice: Subject to any disclaimer, the term of this patent is extended or adjusted under 35 U.S.C. 154(b) by 18 days.

(21) Appl. No.: 10/076,508

(22) Filed: Feb. 19, 2002

(65) Prior Publication Data
US 2002/0186030 A1 Dec. 12, 2002

Related U.S. Application Data

(62) Division of application No. 08/862,414, filed on May 23, 1997, now abandoned.

(30) Foreign Application Priority Data

| | | | |
|---|---|---|---|
| May 23, 1996 | (JP) | ............................................. | 8-128570 |
| Sep. 30, 1996 | (JP) | ............................................. | 8-259829 |
| Sep. 30, 1996 | (JP) | ............................................. | 8-259831 |

(51) Int. Cl.$^7$ ............................................. G01R 31/02
(52) U.S. Cl. ......................... 324/754; 324/761; 324/762
(58) Field of Search ........................ 324/72.5, 754–758, 324/761–762, 765, 158.1; 439/169, 174, 482, 912; 29/825, 827, 883–884

(56) References Cited

U.S. PATENT DOCUMENTS

| | | | | |
|---|---|---|---|---|
| 5,416,429 A | * | 5/1995 | McQuade et al. | ........... 324/762 |
| 5,521,518 A | * | 5/1996 | Higgins | ........................ 324/754 |
| 5,673,477 A | * | 10/1997 | Hattori et al. | ................. 29/825 |

* cited by examiner

Primary Examiner—Kamand Cuneo
Assistant Examiner—Minh N. Tang
(74) Attorney, Agent, or Firm—Oblon, Spivak, McClelland, Maier & Neustadt, P.C.

(57) ABSTRACT

A probe device having a contact probe including a film, a plurality of wiring patterns formed on the film with each wiring pattern having a front end portion projecting from the film so as to form contact pins, and a metal layer provided on the film. In one embodiment, the contact probe device includes first and second contact probes connected to each other, the first contact probe including a first film, and a plurality of first wiring patterns formed on the first film, each first wiring pattern having a front end portion projecting from the first film so as to form contact pins. The second contact probe includes a second film, and a plurality of second wiring patterns formed on the second film. The plurality of second wiring patterns are connected to the plurality of first wiring patterns, and the second contact probe is formed separately from the first contact probe.

2 Claims, 84 Drawing Sheets

(a)

(b)

PERIPHERALLY ARRANGED
TERMINALS
(a)

PLANARLY ARRANGED
TERMINALS
(b)

ARRANGEMENT OF ELECTRODE TERMINALS

HORIZONTAL NEEDLE TYPE PROBE CARD

VERTICAL NEEDLE TYPE PROBE CARD

CONTACT PROBE AND PROBE DEVICE

CROSS REFERENCES TO RELATED APPLICATIONS

This application claims priority to Japanese Patent Application 8-128570 filed May 23, 1996, Japanese Patent Application 8-259829 filed Sep. 30, 1996, Japanese Patent Application 8-259831 filed Sep. 30, 1996, Japanese Patent Application 8-303322 filed Nov. 14, 1996, Japanese Patent Application 8-306829 filed Nov. 18, 1996, Japanese Patent Application 8-324430 filed Dec. 4, 1996, and Japanese Patent Application 8-349119 filed Dec. 26, 1996, all of which are incorporated herein by reference.

BACKGROUND OF THE INVENTION

1. Field of the Invention

The present invention relates to a contact probe used as a probe pin, or a socket pin etc., for electrical testing of devices, such as semiconductor IC (Integrated Circuit) chips, liquid crystal devices, etc., and more particularly to a contact probe integrated into a probe card, a probe device, a test socket, etc. and which are brought into contact with respective terminals of a device under test.

2. Description of Related Art

Contact pins are generally used for carrying out an electrical testing by being brought into contact with respective terminals of a device under test, for example, such as a semiconductor chip, such as an IC chip, an LSI (Large Scale Integrated Circuit) chip, an LCD (Liquid Crystal Display), etc.

In recent years, with high integration and miniaturization of devices, such as IC chips etc., contact pads configured as electrodes formed with a narrow pitch, multi pins, and narrow pitch contact pins have been required. According to one solution to the above requirements, a contact probe made of tungsten needles used as contact pins has been proposed. However; with this solution it is difficult to deal with multi pins and narrow pitch requirements due to a limitation in the diameter of the tungsten needles.

In Japanese Examined Patent Publication No. JP-B-7-82027, a contact probe technology where a plurality of wiring patterns are formed on a resin film and respective front end portions of the wiring patterns are arranged to project from the resin film to form contact pins is proposed. According to this technology, a probe device having multi pins and narrow pitch is possible and numerous complex parts are not required as compared to other technologies. As shown in FIG. 110, a conventional contact probe 1A has a structure where wiring patterns 3A formed from Ni (nickel) or a Ni alloy are attached on one face of a polyimide resin film 2A and front end portions of the wiring patterns 3A are projected from an end portion of the resin film 2A so as to form contact pins 3aA. In FIG. 110, positioning holes 4A are formed in the polyimide resin film 2A as will be described later.

Japanese Unexamined Patent Publication No. JP-A-6-324081 proposes a probe device (probe card) using contact probes having a flexible substrate, as in the previously discussed publication, where front end portions of wiring patterns constitute contact pins. According to this probe device, a matching is conducted with respect to a difference in pin pitches of an IC chip or device under test, etc. and a tester. The proposed probe device is suitable for probe testing an IC chip etc. having multi pins and narrow pitch.

FIGS. 111–113 will now be used to explain the operation of a conventional probe device 11A where a contact probe 1A is integrated with a mechanical parts 10A. The mechanical parts 10A include a mounting base 12A, a top clamp 13A and a bottom clamp 14A. The probe device 11A includes the top clamp 13A securing a printed circuit board 15A, the mounting base 12A, and the contact probe 1A via a bottom clamp 14A. The bottom clamp 14A is attached to the top clamp 13A by bolts 17A and bolt holes 16A. The contact probe 1A having wiring patterns 3A (FIG. 110) is pressed by the bottom clamp 14A, so that the wiring patterns 3A press against an IC chip under test while being maintained in a constant inclined state.

FIG. 112 illustrates the probe device 11A of FIG. 111 after assembly. FIG. 113 is a sectional view taken along a line E—E of FIG. 112. As shown in FIG. 113, the front ends of the wiring patterns 3A are brought into contact with an IC chip I by the mounting base 12A. The mounting base 12A is provided with positioning pins 18A for adjusting the position of the contact probe 1A, and the wiring patterns 3A. Thus, the IC chip I can be accurately positioned by inserting the positioning pins 18A into the positioning holes 4A of the contact probe 1A. Elastic bodies 20A of the bottom clamp 14A are pressed against portions of the wiring patterns 3A at windows 19A provided in the contact probe 1A. In this way, the wiring patterns 3A at the windows 19A are brought into contact with electrodes 21A of the printed circuit board 15A forming a signal path by which signals obtained from the wiring patterns 3A can be transmitted via the electrodes 21A of the printed circuit board 15A.

However, the above-described conventional contact probe 1A has the following problems. As shown in FIG. 114, the contact pins 3aA of the conventional contact probe 1A are attached on one face of the resin film 2A. However, the resin film 2A is fabricated from, for example, polyimide resin and therefore, the resin may be elongated by absorbed moisture changing an interval t between the contact pins 3aA. Accordingly, the contact pins 3aA may not accurately contact pads of an IC chip, or device under test, etc. and therefore, an accurate electrical test cannot be conducted. Furthermore, although the positioning holes 4A for integrating the contact probes 1A to the probe device 11A are provided in the resin film 2A of the contact probe 1A, the resin film 2A has a small hardness value and accordingly, the positioning holes 4A are susceptible to being deformed. Therefore, accurate positioning of the contact probe 1A cannot be performed.

Furthermore, according to the contact probe 1A (FIGS. 110–113), during testing of a device, an amount of pressure applied to contact pins of the contact probe is increased or decreased to provide a desired contact pressure. A large amount of pressure must be applied to the contact pins in order to provide a large contact pressure. However, according to the first type of contact probe, front end portions of wiring patterns of the contact probe are used to form the contact pins. The contact pins are made from a material such as Ni (nickel). Therefore, a hardness of the contact pins is typically about Hv 300. Due to the low hardness of the contact pins 3aA, the contact pins may be bent or deformed under excessive contact pressure. Accordingly, there is a limited amount of pressure that can be exerted on the contact pins so that a large contact pressure cannot be obtained. Therefore, a sufficient contact pressure cannot be obtained during electrical measurements of a device under test, resulting in contact failure.

To solve the above problem, there is provided a means of adding an additive agent, such as saccharin etc. in the Ni plating of the contact pins. Although at normal temperature the contact pins have a hardness of Hv 350 or more, the hardness of the contact pins drops rapidly to Hv 200 or less when the contact pins are heated to a high temperatures (e.g., 300° C.). This is due to the S (sulphur) content of the additive agent, such as saccharin etc. which reduces the contact pin hardness at high temperatures. Therefore, the above-described contact probe cannot typically be used at high temperatures, particularly when the contact probe is used as a chip carrier for a burn-in test, etc. which subjects the contact probe to high temperatures.

In addition, surfaces of respective terminals (pads) of an IC chip, etc. are typically made from a material, such as an Al (aluminum) alloy, etc. When such terminals are exposed to air, oxidation occurs and the terminals have a thin aluminum oxide film formed thereon. Therefore, during electrical testing, the aluminum oxide film formed on the surface of the pads of an IC chip, etc. must be removed in order to expose an aluminum matrix underneath the surface so as to ensure proper electrical conductivity between the pads and the contact pins. Accordingly, the contact pins of a contact probe are overdriven while being brought into contact with the surfaces of the pads (e.g., the contact pins are pulled across the pads during contact) so that the aluminum oxide film on the surfaces of the pads is scrubbed off by front end portions of the contact pins exposing the internal aluminum matrix of the pads. The above-described operation is referred to as scrubbing and is important for ensuring proper contact between the contact pins and the pads of the IC chip, etc. during electrical testing thereof.

In performing the scrubbing operation, it is necessary to prevent the contact pins from damaging the aluminum matrix underneath the aluminum oxide film on the surfaces of the pads. Accordingly, in fabricating the contact pins, a mask exposure technology is used and the front end portions of the contact pins are formed having circular arc (convex) faces in a plane view. This is due to the fact that it is difficult to form a fine pattern on a mask in accordance with a desired shape (see FIG. 110). In contrast, a conventional tungsten needle has a planer front end face due to a polishing operation which is performed on the front end portions of the needles in order to adjust the lengths of the respective needles. However, the above-described contact pins are provided with a convex circular face resulting in a small contact area with the pad of the IC chip, etc. so that the contact pins exert a large contact pressure on the pad due to the small contact area. Accordingly, the contact pins are liable to scrape off the aluminum matrix of the pad during the scrubbing operation as compared with the conventional tungsten needle contact probe.

Therefore, it is necessary to ensure a large enough contact angle of the contact pin with respect to the pad so that the aluminum matrix of the pad is not damaged during the scrubbing operation. This is due to the fact that when the contact angle is small, an amount of removed aluminum at the surface of the pad can significantly increase resulting in damage to the aluminum matrix of the pad. However, contact pins 3*a*A which are formed from a resin film 2A project along a face of the resin film 2A and the contact angle of the contact pin cannot be greater than the angle of the face of the resin film 2A (see FIG. 110). In other words, the angles of the contact pins 3*a*A are restricted by the angle of the face of the resin film 2A. Therefore, the angles of the contact pins 3*a*A cannot be set independently from the surface of the resin film 2A.

In the contact probe described above, it is possible to increase the contact angle of the contact pins by increasing the angle of the face of the resin film by devising a way of integrating the contact probe in a probe card which sets the angle of the resin film and the contact pins. In such a case, the scrubbing distance (i.e., length for scrubbing off a skin along the surface of the pad) is extended and depending on a magnitude of the contact angle since the contact angle determines how far the front end portions of the contact pins project over the pads during the scrubbing operation. For example, in the case of a pad having a substantially square form in a plane view with a sides of approximately 90 $\mu$m to 100 $\mu$m in length, when the scrubbing distance is set to 8 $\mu$m with an amount of overdriving of 75 $\mu$m and a contact angle of 15° to 20°, even with a slight increase in the contact angle of 5°, the scrubbing distance becomes 12 $\mu$m or more.

Furthermore, when the angle of the face of the resin film is increased as described above, the resin film is raised with respect to the contact face by an amount of the angle. In such a case, the resin film and contact probe constitute a probe device which is integrated with various mechanical parts to form a probe card (or prober). When the angle of the resin film is increased, the height dimension of the probe device also increase. However, the above-described probe device is mounted in a prober and the prober cannot be typically made so that it is of a variable height (i.e., a distance/height from the IC chip etc.). Therefore, when the height of the probe device exceeds a predetermined level, the probe device cannot be mounted in the prober.

However, the following problems remain in the above-described contact probe and probe device including the contact probe (contact probe 1A, FIGS. 110–113). Connection from electrodes of the IC chip I to the electrodes 21A of the printed circuit board 15A is conducted via the wiring patterns 3A integrated on the resin film 2A. Therefore, there is no degree of freedom in the pad arrangement of the electrodes 21A on the side of the printed wiring board 15A. Although no particular problem is caused in the case where the electrodes of the IC chip I are arranged uniformly at four sides thereof, it is difficult to deal with the case where the electrodes are arranged nonuniformly on the four sides. In other words, in the case where the electrodes are concentrated on one side of the IC chip, for example, in the case of a driver IC of an LCD, etc. (i.e., several hundreds pins are formed on the longer side of a 3 mm×1 mm size chip), there is no space for arranging pads of the electrodes 21A on the printed circuit board 15A. Therefore, it is difficult to connect the electrodes of the IC chip I to the printed wiring board 15A.

According to the previously described contact probe 1A, one side of the contact probe is typically arranged to align with the pad positions of an IC chip, etc., while the other side is connected to the printed wiring board 15A. In order to widen the pitch of the wiring patterns 3A of the contact probe 1A, the contact probe 1A is formed in a trapezoidal shape (see FIGS. 110–113). Furthermore, positioning holes 4A are provided in the contact probe 1A and the contact probe 1A is integrated with highly accurately fabricated mechanical parts by using the positioning holes 4A. In this way the mechanical parts are integrated with the printed wiring board 15A. In addition, according to the contact probe 1A, a photolithography technology capable of finely forming patterns is used for a fabricating and forming process of the wiring pattern 3A. Therefore, the contact probe 1A, advantageously, provides a narrowed pitch front end portion so that the contact probe 1A can be brought into contact with the narrow pitch of the contact pads of a device under test.

However, the accuracy of positioning the contact pins 3*a*A of the contact probe 1A with respect to the contact pads of an IC or an LCD, is dependent upon the accuracy of the fixing means with respect to the mechanical parts. In other words, the accuracy of fasteners using the positioning holes 4A. Accordingly, even if the pitch of the contact pins 3aA is narrowed or the diameter of the front end of each of the contact pins 3aA is considerably diminished, when the accuracy of positioning is poor, it is difficult to take advantage of the advantages of the contact probe 1A.

Furthermore, there are the following additional problems in the contact probe 1A. According to the contact probe 1A, the front end is provided with a portion where the pitch of the wiring patterns 3A is narrowed. Therefore, the yield is lowered in the photolithography or plating step, etc. used in fabricating the contact probe 1A due to the narrow pitch area. This means that in fabricating the contact probe 1A, the yield of the contact probe 1A is governed by the yield of the portion where the pitch is narrowed. In this case, the contact probe 1A is formed in a trapezoidal shape with the narrower front end portion having the narrower pitch wiring patterns 3A and the wider rear end portion having wiring patterns 3A that are coarse. Moreover, in integrating the contact probe 1A to the printed wiring board 15A, a considerably large area is required to accommodate the contact probe 1A. In this case, a necessity of a large area for the contact probe 1A results in a small number of the contact probes 1A being able to be formed from a resin film 2A used as a raw material and having limited area. Therefore, when the above-described contact probe 1A is fabricated, the yield is governed by the front end portion having the narrow area with the narrow pitch wiring, while the area per se of the contact probe is governed by the wider portion with the coarse pitch wiring.

Furthermore, in relation to the above-described problems, the front end portion or contact pin of the contact probe 1A is liable to be destroyed since the contact pins project from the resin film 2A. In this case, the entire contact probe 1A must be replaced even if only one contact pin is damaged. Accordingly, maintenance costs of a probe device using the contact probe 1A increase. Furthermore, the above-described contact probe 1A does not allow for ease of changing contact pressure of the contact pins.

A conventional probe card is shown in FIG. 116. According to the probe card, perforated portions are provided at measurement positions of the card comprising a glass epoxy plate with contact pins (needles) projecting from the measurement positions. A material, such as W (tungsten) having a small degree of wear is generally used as the material for fabricating the needle. The probe card is provided in a shape of a leaf spring where the contact pins are extended toward a direction inclined downwardly and is referred to as a horizontal arranged needle type probe card. In addition, as illustrated by FIGS. 115(a) and 115(b), terminals to be inspected by the probe card are peripherally arranged, wherein terminal electrodes are formed only at a periphery of a chip (FIG. 115(a)), and planarily arranged, wherein terminal electrodes are formed over the entire face of the chip (FIG. 115(b)). In this case, although the above-described horizontal arranged needle type probe card can deal with the peripherally arranged terminals, it cannot deal with the planarly arranged terminals. Furthermore, there is a limitation in multi pin formation of the probe card. In addition, according to the horizontal needle arranged type probe card, the total length of the contact pin is typically 40 mm to 30 mm. Therefore, there is a limitation in an inspection speed using the probe card. Hence, a vertically arranged probe card was devised as shown in FIG. 117 to overcome the deficiencies of the above-described horizontally arranged needle type contact probe. According to the vertically arranged type probe card, the card can deal with the planarly arranged terminals, multi pin formation can be realized, and the problem of the inspection speed is also improved since the length of the contact pin is approximately 11 mm to 7.5 mm which is comparatively short.

However, the vertically arranged type probe cards have the following problems. When there is a more or less a deviation with the respective total lengths of the contact pins, if all of the contact pins including contact pins of various lengths are brought into contact with respective terminals, the longer contact pins are bent during an overdriving operation (i.e., contact pins are pulled down further than from where they are brought into contact with the terminals). According to the above-described probe card, the material of the contact pins is tungsten which is highly rigid. Therefore, in overdriving the contact pin, the longer contact pins are not sufficiently bent and the shorter contact pins are not firmly brought into contact with the terminals. Particularly, in the case of the vertical needle type probe card, the contact pins are brought into contact with the terminals substantially in a vertical direction which makes the contact pins less likely to bend. In addition, the above-described contact pins made of tungsten are devoid of flexibility. Therefore, even if they are bent, the direction of bending does not stay constant. As a result, contiguous ones of the contact pins may erroneously be brought into contact with each other causing shorting between contact pins. Also, according to the above-described needle type contact probe, the integration of the contact pins, alignments of the heights and the positions of the respective pins must be performed manually, which is very difficult. Furthermore, it is difficult to deal with the multi pin and narrow pitch formation due to the limitation in the diameter of the tungsten needle.

SUMMARY OF THE INVENTION

Accordingly, it is an object of the present invention to provide a contact probe capable of carrying out accurate electrical tests by minimizing a change in intervals between contact pins due to a change in humidity and by firmly bringing the contact pins into contact with pads of a device under test (also referred to as object of measurement) with accurate positioning by minimizing deformation of positioning holes.

Another object of the present invention to provide a contact probe exhibiting a large amount of hardness and excellent thermal resistance during high temperature operation.

A further object of the present invention to provide a contact probe and a probe device including the contact probe which perform an adequate scrubbing operation but prevent the scrubbing distance from increasing more than is necessary and without damaging material under a film on a surface of a pad of a device under test (also referred to as an object of measurement).

An additional object of the present invention to provide a contact probe and a probe device including the contact probe allowing for multi pin and narrow pin pitch formation applicable to testing a semiconductor device, such as an IC chip, LCD, etc. having electrodes which are not arranged in uniform fashion along sides of the semiconductor device.

A still further object of the present invention to provide a contact probe having ease of positioning with respect to pads of a device under tests, such as an IC, or LCD, etc.

Yet another object of the present invention to provide a contact probe with reduced fabrication costs ease of maintenance, such as ease of replacing contact probes or changing contact pressure.

Yet a further object of the present invention to provide a contact probe and a probe device including the contact probe specified as follows:

(1) The contact probe can deal with planarly arranged terminals;
(2) The total length of the contact pin is short and the inspection speed is fast;
(3) The contact probe can deal with the multi pins and narrow pitch formation;
(4) The contact pin is flexible during an overdriving of the pin;
(5) The direction of bending the contact pin can be adjusted so as to be constant; and
(6) The contact probe exhibits excellent high frequency characteristic.

The above and other objects are achieved according to the present invention by providing by providing in a probe device, an improved contact probe including a film; a plurality of wiring patterns formed on the film, each wiring pattern having a front end portion projecting from the film so as to form contact pins; and a metal layer provided on the film.

According to the above-described probe device, the film, such as a resin film, etc. is liable to extend due to moisture absorption. Accordingly, a metal layer is provided on the film so that extension of the film is restrained by the metal layer under various humidity conditions. In other words, a small deviation in an interval between the respective contact pins occurs and the contact pins can be brought into contact with pads accurately and with fine precision. Accordingly, a proper scrubbing operation is ensured since the contact pins can brought into precise contact with pads of a device under test and the angle of the contact pin with respect to the pad does not deviate much from a desired value. Furthermore, the metal film can be used as a ground whereby a design taking an impedance matching up to the vicinity of the front end of the contact probe can be performed. In this way, adverse influences caused by reflection noise can be prevented in performing a test in a high frequency region. In other words, when the characteristic impedance between the side of the substrate wiring and the contact pins is not matched in the middle of a transmitting cable from a tester (also referred to as a prober), reflection noise results. In this case, the longer the transfer cable having different characteristic impedances, the more the reflection noise is increased. The reflection noise constitutes a signal distortion and is liable to cause erroneous operation in a high frequency region. According to the contact probe, by using the metal film as a ground, the characteristic impedance can be matched up to the vicinity of the front end of the contact pin by the side of the substrate wirings and erroneous operation caused by reflection noise can be restrained.

According to a second aspect of the present invention, there is provided the probe device of the first aspect, wherein the contact pins of the contact probe are made of a nickel-manganese alloy including manganese in a range from 0.05 wt. % to 1.5 wt. %.

According to the above-described probe device, the front end portion is made of a nickel-manganese alloy including manganese in a range of from 0.05 wt. % to 1.5 wt. %. Accordingly, the front end portion of the contact pins exhibit a hardness of Hv 350 or more even during high temperature operation (e.g., 500° C.). In other words, the hardness of the Ni—Mn alloy is not extremely lowered by high temperature heating. Furthermore, when the amount of manganese (Mn) is less than 0.05 wt. %, the hardness of Hv 350 or more cannot be obtained. When amount of manganese (Mn) exceeds 1.5 wt. %, the contact pins may be bend due to an increase in stresses at the front end portion thereof and the contact pins also become very brittle and toughness is lowered. Accordingly, by setting the manganese content in the above-specified range, the high hardness and toughness necessary for a contact probe can be provided.

According to a third aspect of the present invention, there is provided the probe device of the first aspect, wherein the contact pins of the contact probe are bent at a middle position thereof.

According to the above-described probe device, the contact pin is bent at the middle portion and therefore, the angle with respect to an object of measurement (pad) can be changed at the front end portion and the base end portion of the contact pin. Thereby, an angle (contact angle) of the front end portion of the contact pin with respect to the pad can be fixed to be large without enlarging an angle of the film with respect to the pad. Accordingly, a matrix of the pads can be prevented from impairing in the scrubbing operation without excessively enlarging the scrubbing distance and without enlarging the height of the probe device.

According to a fourth aspect of the present invention, there is provided the probe device of the third aspect, wherein each of the contact pins of the contact probe has a tip portion opposite an end portion, the tip portion configured such that when the tip portion is brought into contact with an object of measurement, an angle of the tip portion with respect to a contact face thereof is in a range of 60° to 90°, and the end portion configured such that an angle of the end portion with respect to the contact face is in a range of 0° to 30°.

According to the above-described probe device, the angle of the front end portion of the contact pin with respect to the contact face is provided to be 60° or more. Therefore, the matrix of the pad is not damaged. In addition, the angle of the front end portion of the contact pin with respect to the contact face is set to be smaller than 90°. This is because if the angle of the front end portion is 90° or more, the skin of the pad cannot be properly scrubbed off during the scrubbing operation and sufficient conductivity is not ensured resulting in contact failure during testing. Furthermore, the angle of the base end portion of the contact pin with respect to the contact face is set to be 30° or less. Therefore, the scrubbing distance is not excessively prolonged and the front end of the contact pin is not projected from the pad in the scrubbing operation. In addition, the angle of the base end portion of the contact pin with respect to the contact face is fixed to be 0° or more, because if this condition is not satisfied, a sufficient overdriving amount cannot be provided in the scrubbing operation.

Furthermore, according to the above-described probe device, a face having a parallel degree with respect to the contact face of the pad that is higher than that of the conventional contact pin, is formed at the front end portion by bending the contact pin as described above. This is required due to the following positioning operation. In positioning the contact pin with respect to the pad, a method where light is irradiated from the direction of the pad (normally, from below) toward the contact pin and light reflected from the contact pin is detected so that the position of the contact pin is recognized is used. However, according to a conventional contact pin, which is not bent, when the contact pin is integrated to a probe card, the contact pin only projects to the contact face of the pad with a low angle of, for example, about 15° to 20°. Accordingly, even if light is irradiated from the direction of the pad, the amount of reflected light is small. Therefore, positional detection of the contact pin is difficult. In respect thereto, according to the contact pin of the present invention, a face having a high vertical degree is formed with respect to a direction in which light is irradiated. Therefore, a sufficient amount of light is reflected whereby the positional detection is facilitated.

According to a fifth aspect of the present invention, there is provided the probe device of the fourth aspect, further including a substrate attached to the contact probe, the substrate having terminals connected to respective base ends of the wiring patterns; and an inclination holding member having a lower face inclined at angle in a range of 0° to 30° with respect to the contact face of an object of measurement and configured to maintain the end portion so that the angle of the end portion with respect to the contact face is in the range of 0° to 30°; wherein the contact probe is supported by the inclination holding member such that the metal layer of the film is brought into contact with the lower face of the inclination holding member.

According to the above-described probe device, the inclination holding member is installed and the lower face is gradually inclined downwardly toward the front end side by an angle in a range of 0° to 30° with respect to the contact face. The front end side of the film is supported by being brought into contact with the lower face. Therefore, the angle of the base end portion of the contact pin projected from the front end of the film with respect to the contact face is stably maintained to a value described in the fourth aspect of the present invention.

According to a sixth aspect of the present invention, there is provided the probe device of the first aspect, the contact probe further including a contact probe main body including a plurality of the wiring patterns disposed as main wiring patterns; and a contact probe branch portion which branches from the contact probe main body, integrally formed with the contact probe main body, and includes a plurality of the wiring patterns disposed as branch wiring patterns formed by dividing portions of the main wiring patterns.

The above-described probe device includes the contact probe main body where the main wiring patterns are formed and the contact probe branch portion that is branched from the contact probe main body and is integrally formed therewith. The contact probe branch portion is provided with the branch wiring patterns formed by branching portions of the main wiring patterns. Accordingly, the portions of the main wiring patterns are distributed to the branch wiring patterns by which the branch wiring patterns can be connected to locations other than those of the main wiring patterns. In other words, even if electrodes are concentrated on one side of a semiconductor chip, etc., the main wiring patterns connected to the one side of the electrodes are branched by the branch wiring patterns and are dispersed to the other locations. Also, the contact probe main body and the contact probe branch portion are integrally formed. Therefore, there is an advantage where the both the contact probe main body and the contact probe branch portion can be formed with equivalent high dimensional accuracy with minimal positional shifting in the main wiring patterns and the branch wiring patterns.

According to a seventh aspect of the present invention, there is provided the probe device of the sixth aspect, further including a wiring substrate having a plurality of substrate side wiring patterns respectively connected to middle portions or rear end portions of the main wiring patterns and the branch wiring patterns; and support members for supporting respective front end portions of the main wiring patterns.

According to the above-described probe device, the substrate side wiring patterns respectively connected to the main wiring patterns and the branch wiring patterns in the contact probe according to the sixth aspect, are formed at the wiring substrate. Therefore, the main wiring patterns are divided by the branch wiring patterns by which the substrate side wiring patterns connected thereto are also divided and are formed at separate locations and the arrangement space is wide and can be set with a high degree of freedom.

According to an eighth aspect of the present invention, there is provided the probe device of the seventh aspect, wherein the wiring substrate is provided with a rectangular opening for arranging the contact probe, a plurality of the contact pins of the contact probe are arranged along a diagonal line of the rectangular opening and the contact probe main body and the contact probe branch portion are respectively distributed to two sides of the rectangular opening opposed to the diagonal line; and wherein the main wiring patterns and the branch wiring patterns are respectively connected to the substrate side wiring patterns at the two sides of the rectangular opening.

According to the above-described probe device, the front end portions of the contact probe are arranged along the diagonal line of the rectangular opening. Therefore, an object of measurement such as an IC, etc. having electrodes which are particularly concentrated on one side can be arranged along the diagonal line. Therefore, the front end portions are correspondingly brought into contact with the one side of the electrodes. Then, the contact probe main body and the contact probe branch portion are distributed to left and right at the two sides of the rectangular opening and the main wiring patterns and the branch wiring patterns are separately connected to the substrate side wiring patterns at the two sides. Therefore, the wiring patterns concentrated on the one side of the electrodes of an IC, etc. can be distributed to left and right by which a number of wirings can be divided and arranged to two sides without concentrating on one side of the rectangular opening.

According to a ninth aspect of the present invention, there is provided the probe device of the seventh aspect, wherein the substrate side wiring patterns are respectively formed on a front face and a back face of the wiring substrate; wherein the contact probe main body and the contact probe branch portion are respectively distributed to the front face and the back face of the wiring substrate by folding a portion of either one thereof; and wherein the main wiring patterns and the branch wiring patterns are respectively connected to the substrate side wiring patterns at the two sides of the rectangular opening.

According to the above-described probe device, by folding, etc. the contact probe main body and the contact probe branch portion which are of a film-like shape and formed integrally with each other, are distributed to the front surface and the back face of the wiring substrate. Therefore, the main wiring patterns and the branch wiring patterns can be separately connected to the substrate side wiring patterns on two faces of the substrate. In this way, connection is facilitated by a doubled arrangement space of the substrate side wiring patterns without concentrating the wirings on one face of the wiring substrate.

According to a tenth aspect of the present invention, there is provided the probe device of the first aspect, the contact probe further including a contact probe main body including the wiring patterns disposed as a plurality main wiring patterns; and at least one of branch wiring plate connected to the contact probe main body by attaching a portion of the branch wiring plate to the contact probe main body, and including a plurality of branch wiring patterns; wherein the branch wiring patterns are each connected to portions of the plurality of main wiring patterns.

The above-described probe device includes the contact probe main body where the main wiring patterns are formed and the branch wiring plate connected to the contact probe main body. The branch wiring patterns connected to the main wiring patterns are formed at the branch wiring plate. Therefore, portions of the main wiring patterns are distributed to the branch wiring patterns by which the branch wiring patterns can be connected to locations other than those of the main wiring patterns. In other words, even if electrodes are concentrated on one side of a semiconductor chip, etc., the main wiring patterns connected to the one side of the electrodes, are branched and divided by the branch wiring patterns and are connected to other locations.

According to an eleventh aspect of the present invention, there is provided a probe device of the tenth aspect, further including a wiring substrate having a plurality of substrate side wiring patterns respectively connected to middle portions or rear end portions of the main wiring patterns and the branch wiring patterns; and supporting members for supporting the respective front end portions of the main wiring patterns; wherein the substrate side wiring patterns are respectively formed on a front face and a back face of the wiring substrate; wherein the contact probe main body and the branch wiring plate are respectively distributed to the front face and the back face of the wiring substrate; and wherein the main wiring patterns and the branch wiring patterns are respectively connected to the substrate side wiring patterns at the two sides of the rectangular opening.

According to the above-described probe device, the substrate side wiring patterns respectively connected to the main wiring patterns and the branch wiring patterns in the contact probe according to the tenth aspect of the present invention, are formed on the wiring substrate. Accordingly, the main wiring patterns are divided by the branch wiring patterns by which the substrate side wiring patterns connected thereto are also divided and are formed at separate locations, the arrangement space is wide and is set with a higher degree of freedom. Particularly, according to the above-described probe device, the contact probe main body and the branch wiring plate are distributed to the surface and the back face of the wiring substrate and the main wiring patterns and the branch wiring patterns can separately be connected to the substrate side wiring patterns at two faces of the surface and the back face of the wiring substrate. In this way, connection is facilitated by the doubled arrangement space of the substrate side wiring patterns without concentrating the wirings on one face of the wiring substrate.

According to a twelfth aspect of the present invention, there is provided a contact probe including a first contact probe including a first film, and a plurality of first wiring patterns formed on the first film, each first wiring pattern having a front end portion projecting from the first film so as to form contact pins; and a second contact probe connected to the first contact probe including a second film, and a plurality of second wiring patterns formed on the second film; wherein the plurality of second wiring patterns are connected to the plurality of first wiring patterns, and the second contact probe is formed separately from the first contact probe.

According to the above-described contact probe, the first contact probe and the second contact probe are formed by separate steps and thereafter, they are connected to each other such that the wiring patterns are connected.

According to a thirteenth aspect of the present invention, there is provided the contact probe of the twelfth aspect, wherein the plurality of first wiring patterns are densely formed, the plurality of second wiring patterns are densely formed at a vicinity of the connection to the plurality of first wiring patterns, and the plurality of second wiring patterns are coarsely formed at a position remote from the vicinity of the of the connection to the plurality of first wiring patterns.

According to a fourteenth aspect of the present invention, there is provided the contact probe of the twelfth aspect, wherein the plurality of first wiring patterns are formed densely at front end portions thereof and are coarsely formed at rear end portions thereof, and the plurality of second wiring patterns are coarsely formed and connected to the first wiring patterns at the rear end portions thereof.

According to the above-described contact probe, the first contact probe and the second contact probe are connected to each other where the wiring patterns of both of probes coarsely formed.

According to a fifteenth aspect of the present invention, there is provided the contact probe of the twelfth aspect, wherein an area of the first contact probe is configured to be smaller than an area of the second contact probe.

According to the above-described contact probe, the occupied area of the first contact probe where the wiring patterns are formed densely, is made smaller. Accordingly, an amount of yield at that portion is increased by decreasing the area where the densely formed expensive wiring patterns are present. Accordingly, fabrication cost of the contact probe formed by connecting the first contact probe and the second contact probe can be reduced.

According to a sixteenth aspect of the present invention, there is provided the contact probe of the twelfth aspect, further including an anisotropic conductive tape connecting the first contact probe and the second contact probe such that a face of the first contact probe where the plurality of first wiring patterns are formed is opposed to a face of the second contact probe where the plurality of second wiring patterns are formed.

According to the above-described contact probe, the first wiring pattern and the second wiring pattern are connected to each other by the anisotropic conductive tape. Therefore, the degree of allowance with respect to positional shift between the both wiring patterns is increased and positional matching is facilitated.

According to a seventeenth aspect of the present invention, there is provided the probe device of the first aspect, further including a plurality of the contact probes arranged such that axial lines of the contact pins are substantially vertical to a contact face of an object of measurement, and the plurality of contact probes are parallelly disposed so as to provide spaces between respective faces of the films of the plurality of contact probes.

According to an eighteenth aspect of the present invention, there is provided the probe device of seventeenth aspect, wherein a direction of bending of the contact pins of the plurality of the contact probes when a buckling load is applied is configured to be substantially constant.

According to the above-described probe device, when the contact pin is bent by receiving a buckling load in the overdriving operation, the direction of bending stays substantially constant. Therefore, contiguous ones of the contact pins are not erroneously brought into contact with each other.

According to a nineteenth aspect of the present invention, there is provided the probe device of the eighteenth aspect, wherein a position of buckling points in axial line directions of the contact pins of the plurality of the contact probes is configured to be substantially constant.

According to the above-described probe device, when the contact pin is bent, the position of a buckling point of the contact pin stays substantially constant. Therefore, contiguous ones of the contact pins are not erroneously brought into contact with each other.

According to a twentieth aspect of the present invention, there is provided the probe device of the eighteenth aspect, further including a metal film disposed on a back side the contact pins of the plurality of the contact probes at a specified position in an axial line direction, and which is subjected to a half-etching treatment.

According to the above-described probe device, the half-etching treatment is performed at a predetermined position of the metal film by a predetermined amount. In this way, the direction of bending and the position of bending the contact pin can be made constant. Furthermore, compared to the probe which is not subjected to the half-etching treatment, the contact probe of the present invention is liable to be bent by a smaller buckling load. Therefore, contact of a total of long and short pins with respect to the terminals can be ensured. In this case, a distortion caused in the contact pin in the overdriving operation, is shifted to the location of the half-etching treatment and occurrence of buckling (bending) at locations other than the portions can be prevented. Furthermore, if the contact pin per se is subjected to the half-etching treatment, the strength is weakened and the contact pin may be broken, however, there is no concern in the present invention.

BRIEF DESCRIPTION OF THE DRAWINGS

A more complete appreciation of the invention and many of the attendant advantages thereof will be readily obtained as the same becomes better understood by reference to the following detailed descriptions when considered in connection with the accompanying drawings, wherein:

FIG. 108(a) is a plane view, FIG. 108(b) is a sectional view taken along a line P—P of FIG. 108(a) and 108(c) is a sectional view taken along a line Q—Q of FIG. 108(a);

FIG. 115(a) illustrates peripherally arranged terminals and FIG. 115(b) illustrates planarly arranged terminals;

DETAILED DESCRIPTION OF THE PREFERRED EMBODIMENTS

Figure 1:
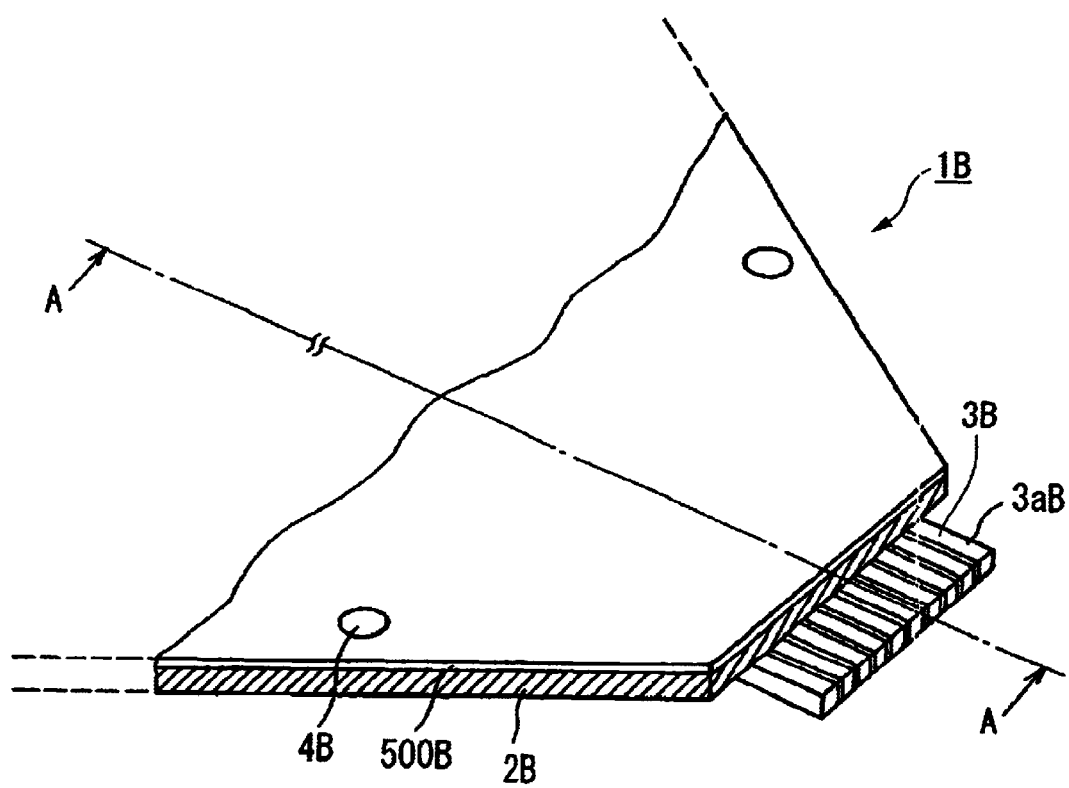
FIG. 1 is a perspective view magnifying essential portions and showing a first embodiment of a contact probe according to the present invention.
Figure 2:
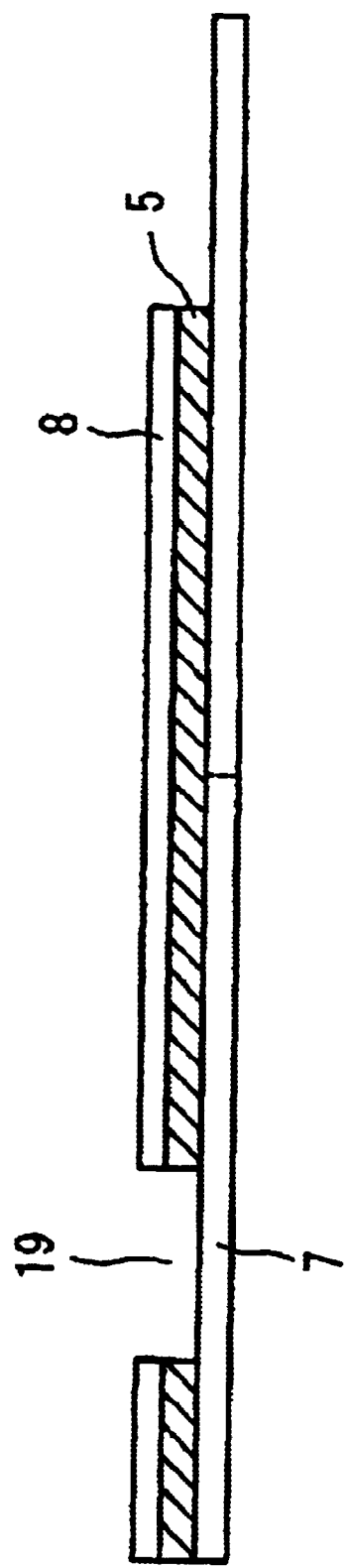
FIG. 2 is a sectional view taken along a line A—A of FIG. 1.
Figure 110:
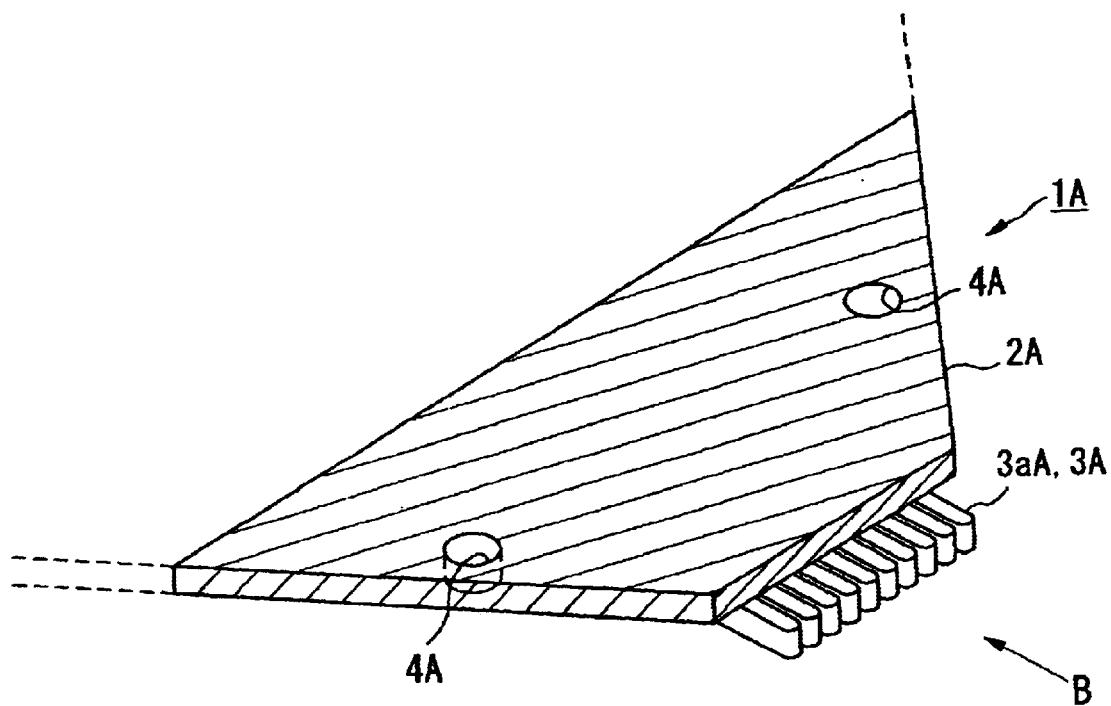
FIG. 110 is a perspective view of essential portions showing a conventional contact probe.
Figure 111:
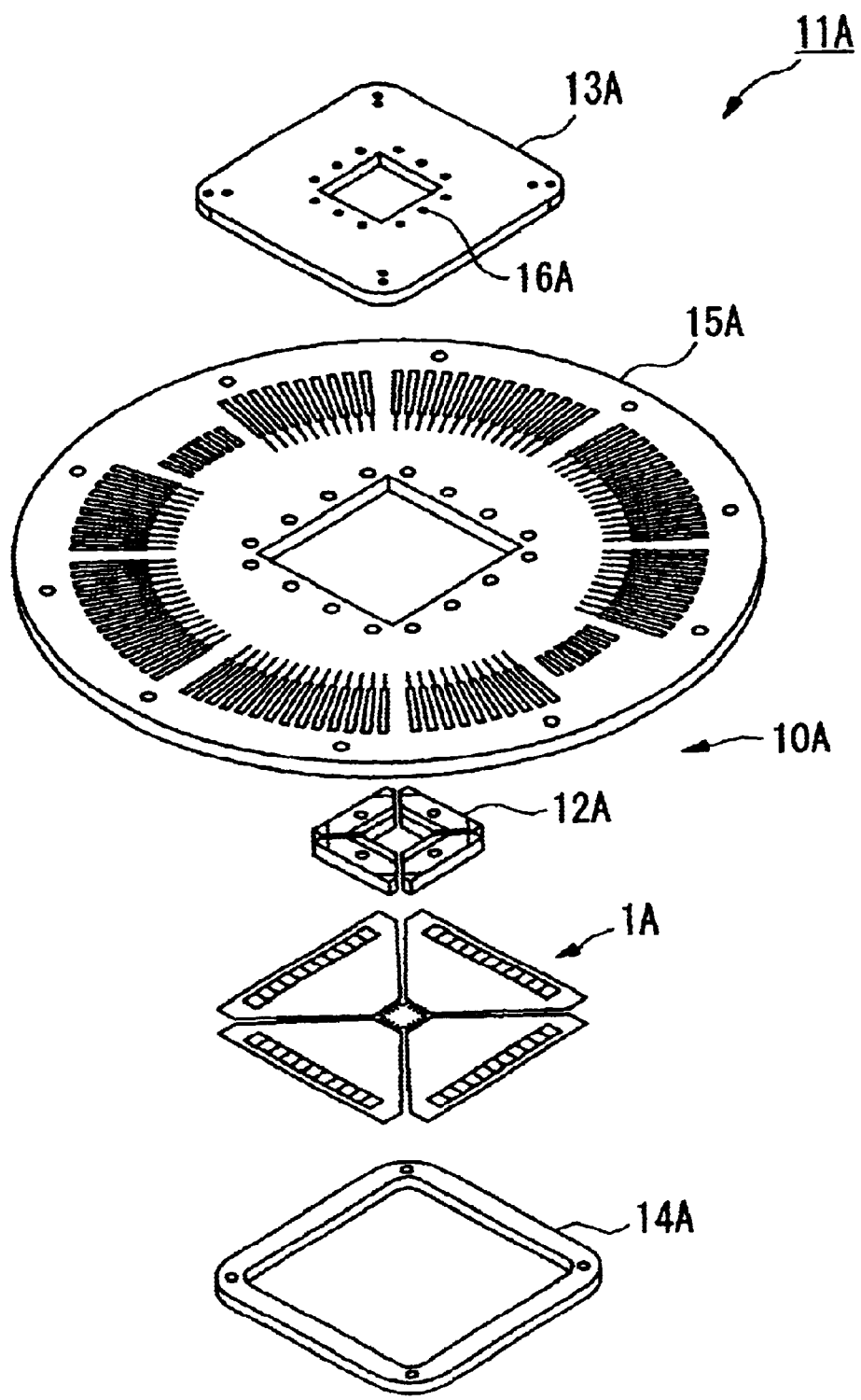
FIG. 111 is an exploded perspective view showing a probe device integrated with the contact probe of FIG. 110.
Figure 112:
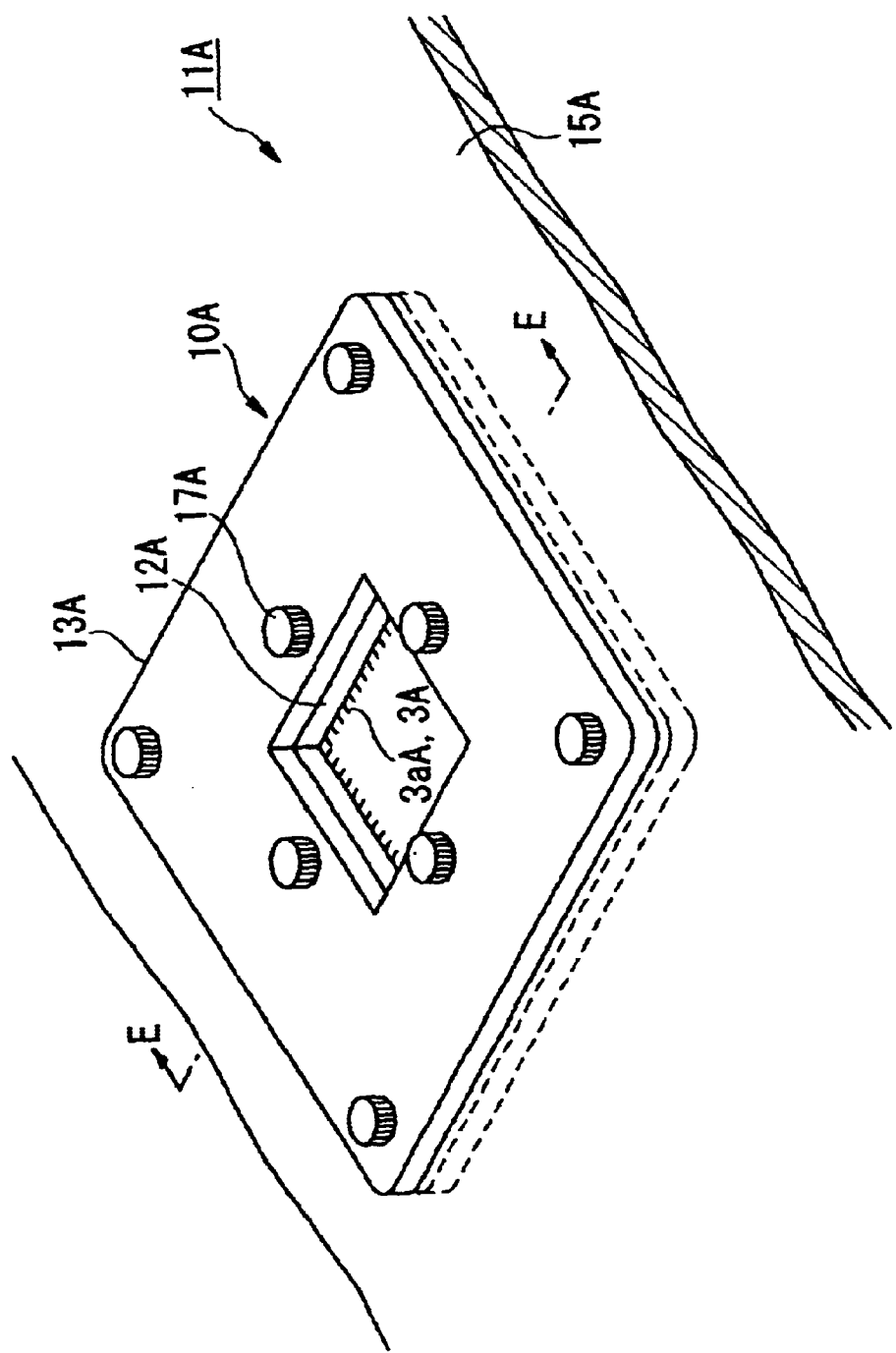
FIG. 112 is a perspective view of essential portions of the probe device of FIG. 111.
Figure 113:
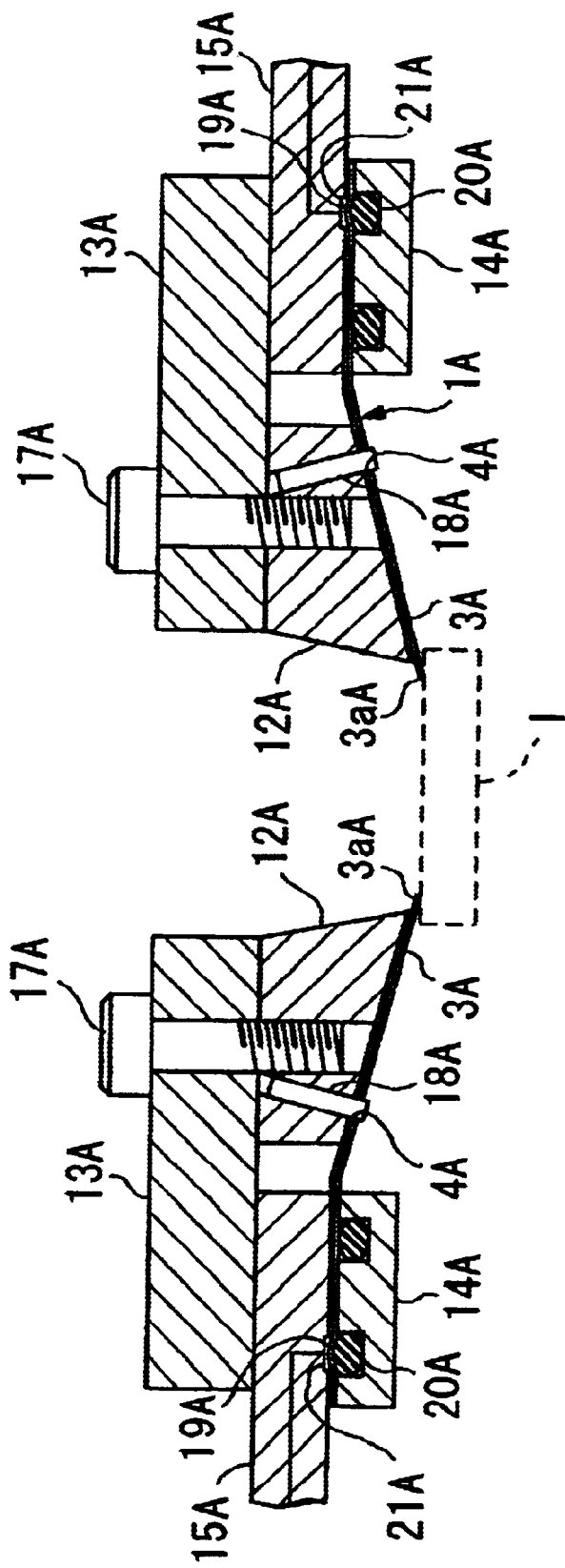
FIG. 113 is a sectional view taken along a line E—E of FIG. 112.
Figure 114:
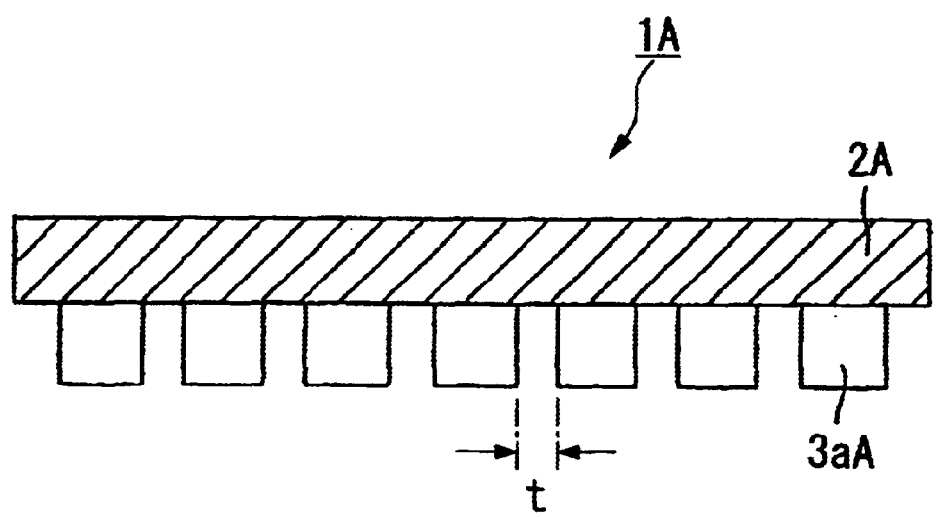
FIG. 114 is a front view viewing from B direction of FIG. 110.
Figure 115:
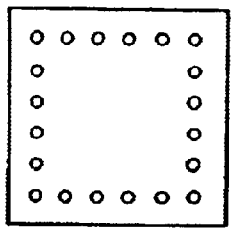
FIGS. 115(a) and 115(b) illustrate types of arrangement of electrode terminals where
Figure 115:
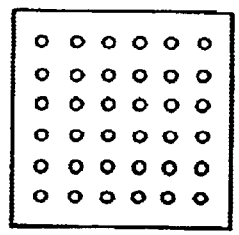
Figure 116:
FIG. 116 is a side view showing a horizontal needle type probe card.
Figure 117:
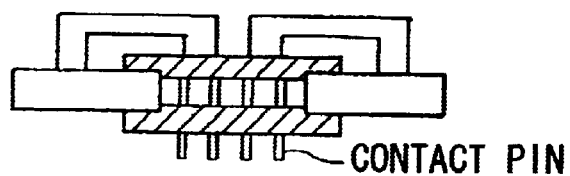
FIG. 117 is a side view showing a vertical needle type probe card.

Referring now to the drawings, wherein like reference numerals designate identical or corresponding parts throughout the several views, and more particularly to FIG. 1 thereof, there is illustrated a contact probe 1B according to a first embodiment of the present invention including a resin film 2B, wiring patterns 3B, a metal film 500 and positioning holes 4B. In FIGS. 1 and 2, the contact probe 1B of a first embodiment is similar to the contact probe 1A of FIG. 110 but further includes the metal film 500.

As a result of carrying out a research to achieve the first object of providing a contact probe capable of carrying out accurate electrical tests by minimizing a change in intervals between contact pins due to a change in humidity and by firmly bringing the contact pins into contact with pads of a device under test, the inventors made the following discoveries. When the metal film 500 is attached on a face of the conventional resin film 2B opposed to a face where the wiring patterns 3B and contact pins 3aB are formed, the change in the interval t between the contact pins 3aB is smaller as compared to the conventional contact probe 1A shown in FIG. 110 comprising a polyimide resin film 2A and contact pins 3aA. Furthermore, the positioning holes 4B of the contact probe 1B are obtained by pasting the metal film 500 having the thermal expansion coefficient which is the same as that of the contact pins 3aB onto the resin film 2B. In this way, positioning pins are more accurately inserted into the contact probe 1B and the contact pins 3aB can be accurately brought into contact with pads of a semiconductor chip as compared with conventional contact probes.

FIG. 1 is a perspective view of the contact probe 1B of the first embodiment and FIG. 2 is a sectional view taken along a line A—A of FIG. 1. The contact probe 1B of first embodiment includes a composite film comprising the resin film 2B and the metal film 500 with front end portions of the wiring patterns 3B projecting from the side of the resin film 2B with the wiring patterns 3B attached on a face of the composite film on the side of the resin film 2B. Furthermore, it is preferable that the resin film 2B comprises a polyimide resin film, the wiring patterns 3B and the contact pins 3aB are made of a metal of Ni or a Ni alloy plated with Au (gold) and the metal film 500 comprises a film of a metal of Ni or a Ni alloy or a Cu (copper) alloy plated with Au.

Fabrication steps of the contact probe 1B according to the first embodiment will now be described with reference to the steps shown in FIGS. 3(a)–3(h).

Base Metal Layer Forming Step

In FIG. 3a, a base metal layer 6 is formed on a support metal plate 5 made of stainless steel by Cu (copper) plating. A photoresist layer 7 is formed on top of the base metal layer 6.

Pattern Forming Step

In FIGS. 3(b) and 3(c), after forming the photoresist layer 7 on the base metal layer 6, a photomask 8 having a predetermined pattern is provided on the photoresist layer 7. The photoresist layer 7 is developed, portions used to form the wiring patterns 3B are removed, and opening portions 7a are formed on the remaining photoresist layer 7. Although in this embodiment the photoresist layer 7 is formed by a negative photoresist, the desired opening portions 7a may be formed by using a positive photoresist.

Furthermore, according to the present embodiment, the photoresist layer 7 shown in FIG. 3(c) corresponds to the photomask 8. However, the pattern forming steps of FIGS. 3(a) and 3(b) would not be necessary if, for example, a film or the like including holes 7A as shown in FIG. 3(c) could be provided wherein the pattern forming steps of FIGS. 3(a) and 3(b) would be unnecessary.

Electrolytic Plating Step

In FIG. 3(d), a Ni layer N that will constitute the wiring patterns 3B is formed in the openings 7a by plating. After the plating, the photoresist layer 7 is removed as shown in FIG. 3(e).

Film Pasting Step

Figure 3:
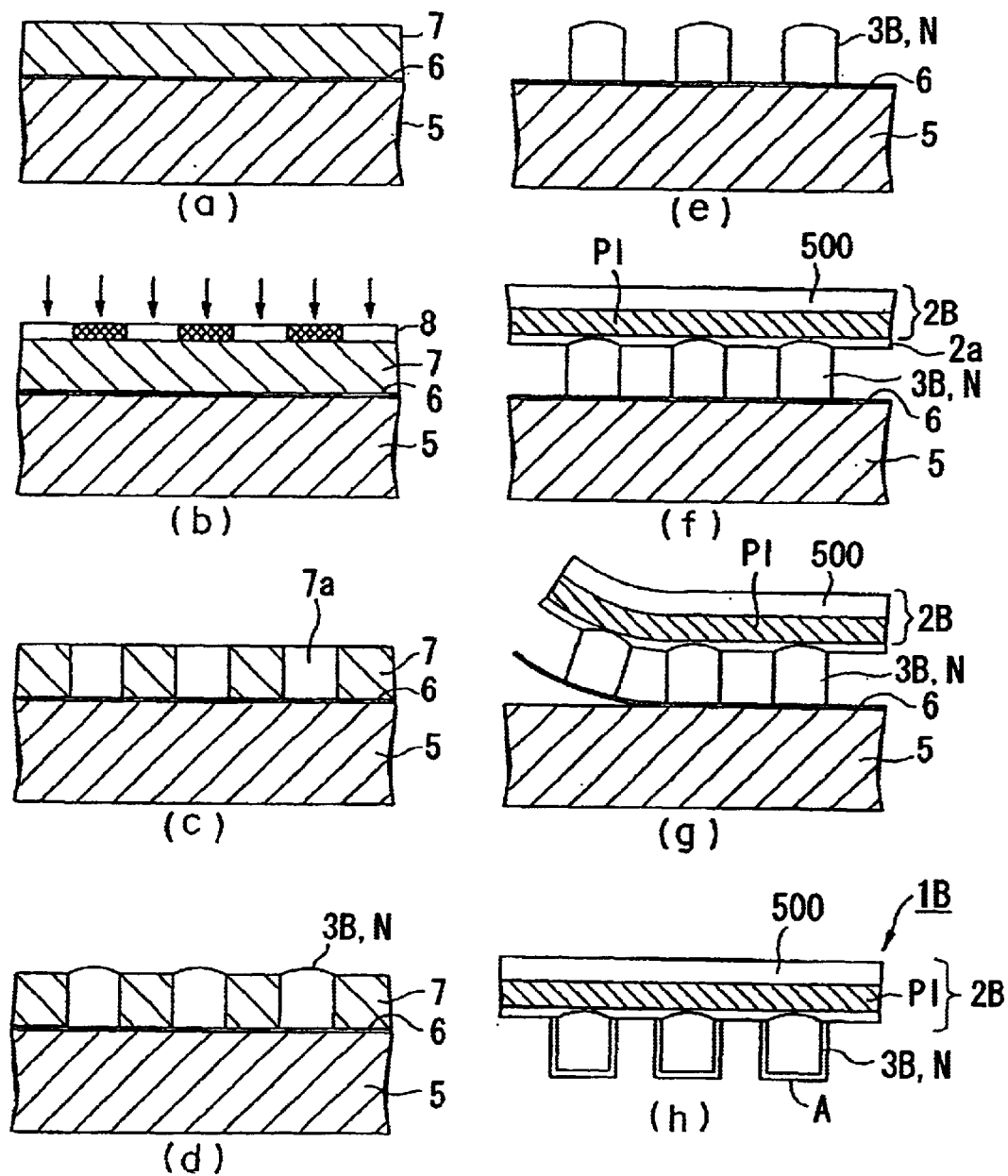
FIGS. 3(a) through 3(h) are sectional views of essential portions showing a method of fabricating the contact probe of the first embodiment according to the present.

In FIG. 3 (f), the resin film 2B' is attached onto portions of the Ni layer N other than the front end portions 3aB (i.e., portions that constitute the contact pins 3aB) of the wiring patterns 3B with an adhesive agent 2a. The resin film 2B' is a two-layer tape where the metal film (copper foil) 500 is integrated onto a polyimide resin PI (resin film 2B). Before the film pasting step, a ground face is formed on the metal film 500 of the two-layer tape by carrying out copper etching using photolithography. In the film pasting step, the polyimide resin PI of the two-layer tape is pasted onto the Ni layer N via the adhesive agent 2a. However, the metal film 500 may be constructed of Ni, an Ni alloy or the like in place of the copper foil.

Separating Step

In FIG. 3(g), a portion constituted by the resin film 2B', the wiring patterns 3B and the base metal layer 6 is separated from the support metal plate 5. This portion is subjected to Cu etching removing the base metal layer 6 so that only the wiring patterns 3B are adhered to the resin film 2B' (not shown).

Gold Coating Step

In FIG. 3(h), Au plating is performed so as to form an AU layer on exposed surfaces of the wiring patterns 3B. Then, an Au layer AU is formed on peripheral surfaces of the contact pins 3aB projecting from the resin film 2B (not shown). Accordingly, although the fabrication steps are the same as those of a conventional contact probe 1A up to the electrolytic plating step, according to the fabrication process of the contact probe 1B of the first embodiment, the process is different from the conventional process at the film pasting step where the composite film 2B' comprising the resin film 2B and the metal film 500 is adhered onto the Ni layer.

Figure 4:
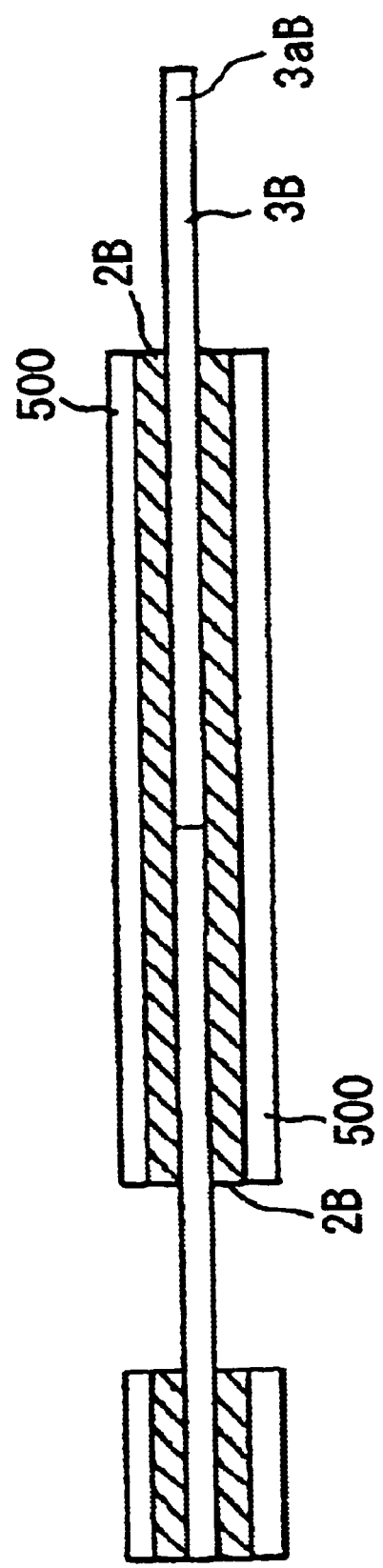
FIG. 4 is a sectional view showing a modified example of the first embodiment of the contact probe according to the present invention.

As shown in the sectional view of FIG. 4, the contact probe 1B of the first embodiment is formed by adhering two composite films 2B' each comprising the resin film 2B and the metal film 500 onto both faces of the wiring patterns 3B via the adhesive agents 2a. The contact probe 1B of the first embodiment is fabricated as a single body and is cut thereafter along diagonal lines by which four sub pieces of contact probes 1B are simultaneously fabricated (these processing steps are similar to conventional processing steps).

A contact probe according to the first embodiment fabricated by the processing of FIGS. 3(a)–3(h) was prepared at normal temperature and having a polyimide resin film thickness of 50 $\mu$m with a beryllium copper alloy film pasted on pins made of Ni having a pitch of 100 $\mu$m, a pin count of 100 and a distance between pins of 9.900 mm. A conventional contact probe was prepared at normal temperature and having a polyimide resin film thickness of 50 $\mu$m pasted on pins made of Ni having a pitch of 100 $\mu$m, and a pin count of 100 for comparison.

The contact probe according to the first embodiment and the conventional contact probe were held for 3 hours in an atmosphere at a temperature of 25° C. and a humidity of 70% and thereafter, the distances between pins at the both ends of the contact probes were measured. The distance between pins at the both ends of the contact probe according to the first embodiment was 9.8976 mm whereas the distance between pins at the both ends of the conventional contact probe was 9.8712 mm. It was discovered that the change in the distance between pins at both ends in the structure where the beryllium copper alloy film was pasted was smaller.

As described above, according to the contact probe 1B of the first embodiment, the change in the distance between pins at the both ends of the contact probe 1B is small even under an environment of high temperature and high humidity. Accordingly, the front end portions of the contact pins 3aB of the contact probe 1B can be accurately brought into contact with positions of pads of a semiconductor chip under various environments, which can significantly contribute to the development of the semiconductor industry by reducing inspection failures of a semiconductor chips due to contact probe misalignment.

A second embodiment of the present invention will now be described with reference to FIGS. 5–9. In FIGS. 5–9, notation 1C designates a contact probe, notation 2C designates a resin film and notation 3C designates wiring patterns.

Figure 5:
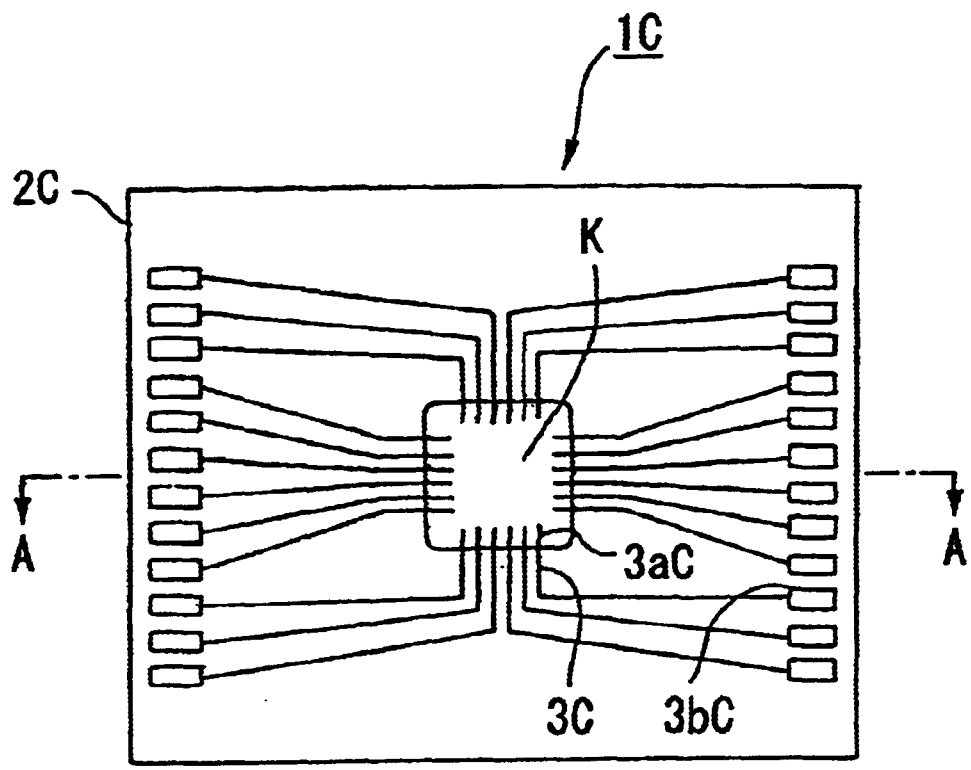
FIG. 5 is a magnified schematic view showing a second embodiment of a contact probe according to the present invention.
Figure 6:
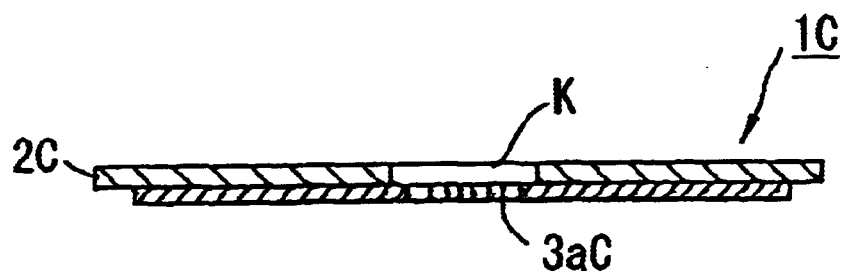
FIG. 6 is a sectional view taken along a line A—A of FIG. 5.

In FIGS. 5 and 6, the contact probe 1C of the embodiment is provided with a structure where the wiring patterns 3C are constructed of a metal and are attached on one face of the polyimide resin film 2C. The front end portions of the wiring patterns 3C project towards a central opening portion K of the resin film 2C from end portions of the resin film 2C (i.e., respective sides of the central opening portion K) and thereby constitute contact pins 3aC. Furthermore, contact terminals 3bC are brought into contact with contact pins 3aC on the side of a top side of a probe tester and are formed at rear end portions of the wiring patterns 3C. The wiring patterns 3C are made of a Ni—Mn alloy where the content of Mn is set in a range of 0.05 wt. % to 1.5 wt. % and Au is coated on the surface of the contact pins 3aC.

The fabrication steps of the contact probe 1C will now be described. The base metal layer forming step and the pattern forming step are the same as those in the first embodiment. In the electrolytic plating step, a Ni—Mn alloy layer N for constituting the wiring patterns 3C is formed at the opening portions 7a by plating. In this case, as an example of the composition of a plating solution for making Mn included in the alloy, a nickel sulfamate bath added with manganese sulfamate is used, an amount of Mn in the plating solution and the electric density in plating are controlled and set such that the Mn content falls in a range of 0.05 wt. % to 1.5 wt. %. The removal of the photoresist layer 7 after plating is the same as that in the first embodiment. The film pasting step, the separating step and the gold coating step are the same as those in the first embodiment. After performing the above-described steps, the contact probe 1C having wiring patterns 3C adhered onto the resist film 2C as illustrated in FIGS. 5 and 6 is completed.

Figure 7:
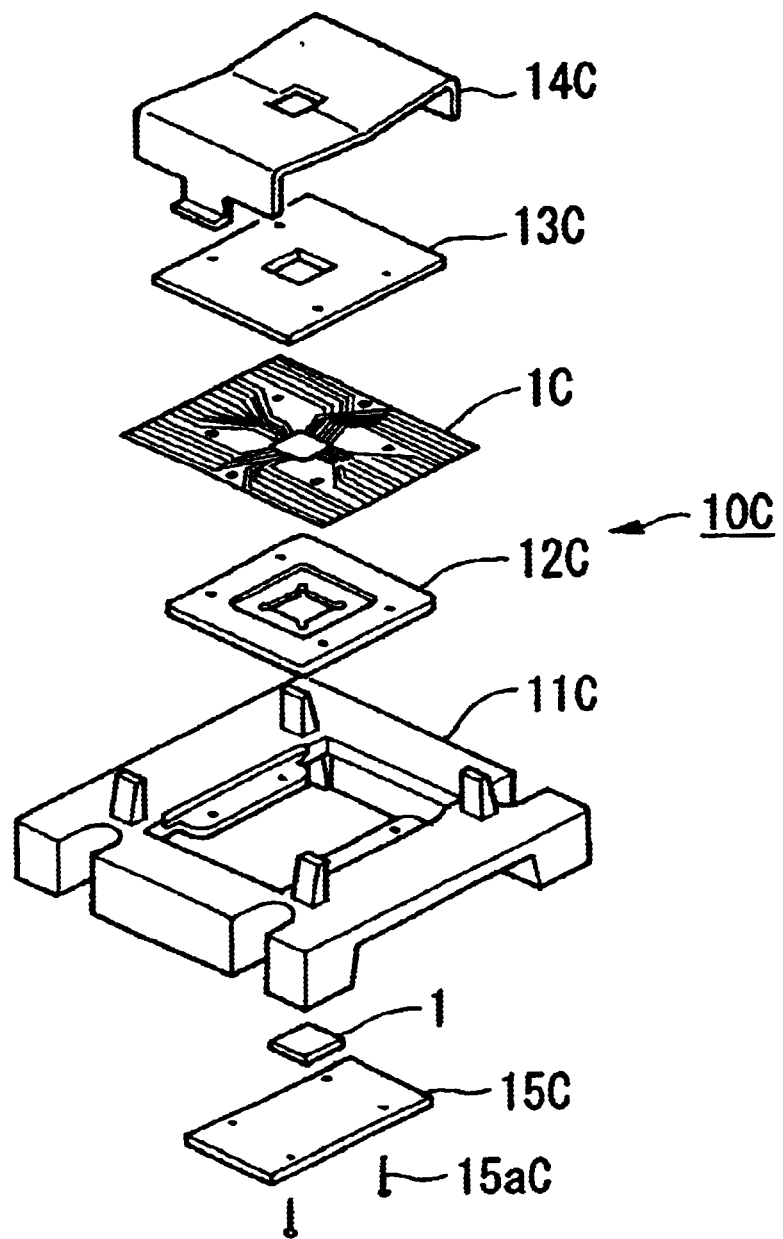
FIG. 7 is an exploded perspective view of a probe device (chip carrier) according to the second embodiment of the contact probe of the present invention.
Figure 8:
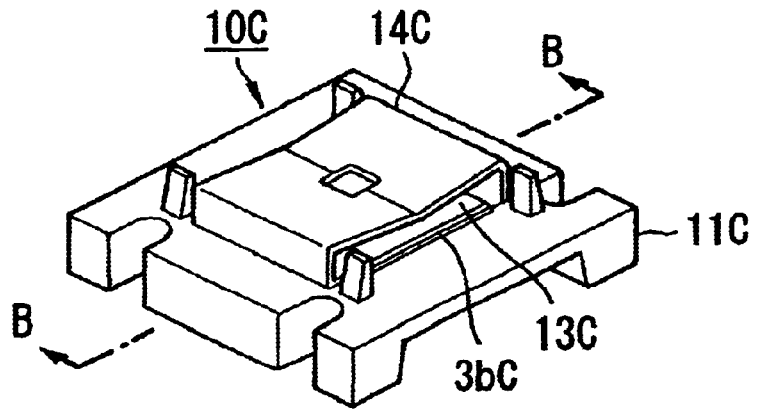
FIG. 8 is a perspective view of an outlook of the probe device (chip carrier) in the second embodiment of the contact probe according to the present invention.
Figure 9:
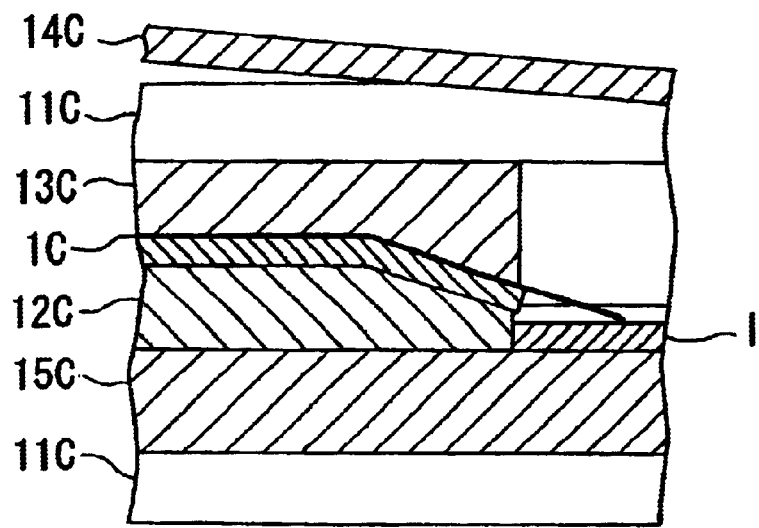
FIG. 9 is a sectional view taken along a line B—B magnifying essential portions in FIG. 8.

An example of a case where the contact probe 1C is applied to a probe device 10C (e.g., a chip carrier) used for burn-in test, etc. of a device under test will be explained with reference to FIGS. 7–9. In FIGS. 7–9, notation 10C designates a probe device, notation 11C designates a frame main body, notation 12C designates a positioning plate, notation 13C designates a top plate, notation 14C designates a clamp, and notation 15C designates a bottom plate. In addition, the contact probe 1C according to the present invention functions as a flexible substrate when integrated into the probe device 10C since the contact probe 1C is soft and easy to bend.

As shown in FIGS. 7 and 8, the probe device 1C is provided with the frame main body 11C, the positioning plate 12C that is fixed to the inside of the frame main body and where an opening portion is formed, the contact probe 1C, the top plate (support member) 13C supporting the contact probe 1C and pressing the contact probe 1C from above, and the clamp 14C fixing the upper plate 13C to the frame main body 11C by a clamping force applied above the upper plate 13C. The bottom plate 15C for mounting and holding an IC chip I is attached to a lower portion of the frame main body 11C by bolts 15aC. The central opening portion K of the contact probe 1C and the contact pins 3aC are formed in correspondence with the shape of the IC chip I and an arrangement of the contact pads on the IC chip I. This arrangement allows for the capability of monitoring a contact state between the contact pins 3aC and the contact pads of the IC chip I from the central opening portion K. In addition, cut-off portions may be formed at corners of the central opening portion K of the contact probe 1C so that the contact probe 1C can be easily deformed during integration of the probe device 10C. The pitch of contact terminals 3bC of the contact probe 1C is set to be wider than the pitch of the contact pins 3aC. This configuration facilitates a matching between contact pads of an IC chip I having a narrow pitch and the contact terminals 3bC of the contact probe 1C on the side of a probe device 10C having a pitch wider than that of the contact pads of the IC chip I. When the contact pads are not formed at all of four sides of the IC chip I, but rather are arranged partially on specific sides, the contact pins 3aC may be installed only on respective sides of the central opening portion K corresponding to sides of the IC chip I having the contact pads. However, it is preferable to press the opposed sides of the IC chip I by forming the contact pins 3aC on opposed two sides of the central opening portion K in order to hold the IC chip I stably in place.

The procedure of attaching the IC chip I to the probe device 10C will now be explained.

Tucking Step

First, the positioning plate 12C is mounted on attaching portions of the frame main body 11C, on which the contact probe 1C is arranged by aligning the central opening portion K with an opening portion of the frame main body 11C. Then, the top plate 13C is mounted on the central opening portion K by similarly aligning an opening portion thereof with the central opening portion K, on which the clamp 14C is stopped to the frame main body 11C. The clamp 14C is a kind of a leaf spring having a bent portion at its center and therefore, the clamp 14C has a function of pressing and fixing the top plate 13C onto the contact probe 1C. In an integrated state the attached IC chip I is observable from above via openings in the center of the probe device 10C.

Furthermore, the top plate 13C and the clamp 14C are formed in a substantially rectangular shape in a plane view and are integrated such that the contact terminals 3bC of the contact probe 1C are extended outwardly from respective long sides. Portions of the lower face of the top plate 13C are inclined at a predetermined angle in the vicinity of an opening of the top plate 13C so that the contact pins 3aC of the contact probe 1C are inclined downwardly at a predetermined angle as shown in FIG. 9. The IC chip I is mounted on the bottom plate 15C with a side having wiring directed upwardly. In this state the bottom plate 15C is tucked to the frame main body 11C from below. At this moment, the IC chip I is pinched by the contact pins 3aC and the bottom plate 15C since the distance between the front ends of the contact pins 3aC of the contact probe 1C and the upper face of the bottom plate 15C is set to be smaller than the thickness of the IC chip I by a predetermined amount.

Positioning Step

Next, the positioning plate 12C is moved or the IC chip I is moved using a needle-like jig or the like while observing the positions of the contact pads of the IC chip I with respect to the front ends of the contact pins 3aC from above via the provided openings. Fine adjustment and setting is performed such that corresponding front ends of the contact pins 3aC and the contact pads of the IC chip I are aligned and brought into contact with each other. If the dicing accuracy of the IC chip I is excellent and the outer shape and positions of the contact pads are relatively stabilized, the positioning plate 12C and the contact probe 11C are previously adjusted with respect of the positional relationship therebetween. In this way, the contact pins 3aC and the contact pads of the IC chip I can be pre-aligned with each other without requiring the above-described fine adjustment process. Thereby, the positioning step of the IC chip I is not necessary and the attaching operation of the IC chip I can be performed efficiently and easily.

Fixing Step

After the positioning step, the bottom plate 15C is decisively fixed to the frame main body 11C. At this moment, so-called "overdriving" is imposed on the inclined contact pins 3aC, wherein the front ends of the contact pins 3aC are brought into contact with the contact pads of the IC chip I by a predetermined pressing force and are firmly electrically connected. This state is quite similar to a state where the IC chip I is mounted to a so-called multi tip module or the like. In this state, the operation of the IC chip I can be tested with high reliability. If bumps are provided at the contact pads of the IC chip I or the front ends of the contact pins 3aC of the contact probe 1C, the overdriving operation can be performed in a range of a height of the bump and accordingly, the contact pins 3aC may not be previously inclined.

The probe device 10C is a chip carrier and is as small as about 1 inch square (about 2.5 cm square) and is preferable to a dynamic burn-in test or the like. According to the probe device 10C, the contact pins 3aC of the contact probe 1C are formed by a nickel-manganese alloy containing manganese in a range of 0.05 wt. % to 1.5 wt. % and therefore, the contact pins 3aC are provided with a hardness of Hv 350 or higher even after having been heated at high temperatures, for example, 500° C. That is, the hardness of the Ni—Mn alloy is not extremely lowered by high temperature heating. Furthermore, if the amount of manganese (Mn) is below 0.05 wt. %, the hardness of Hv 350 or higher cannot be attained. If the amount of manganese exceeds 1.5 wt. %, stresses at the front end portions are increased and the front end portions may be bent and further, the material becomes very brittle and the toughness is deteriorated. The high hardness and toughness necessary for the contact probe 1C can be obtained by setting the Mn content within the above-prescribed range. Accordingly, the probe device 10C integrated with the contact probe 1C is particularly preferable as a chip carrier used in a reliability test accompanied by high temperature heating such as a burn-in test or the like. In addition, although in the above-described embodiment the contact probe 1C is applied to a probe device 10C that is a chip carrier, the contact probe 1C may be adapted to other measurement jigs, form factors, etc.

Figure 10:
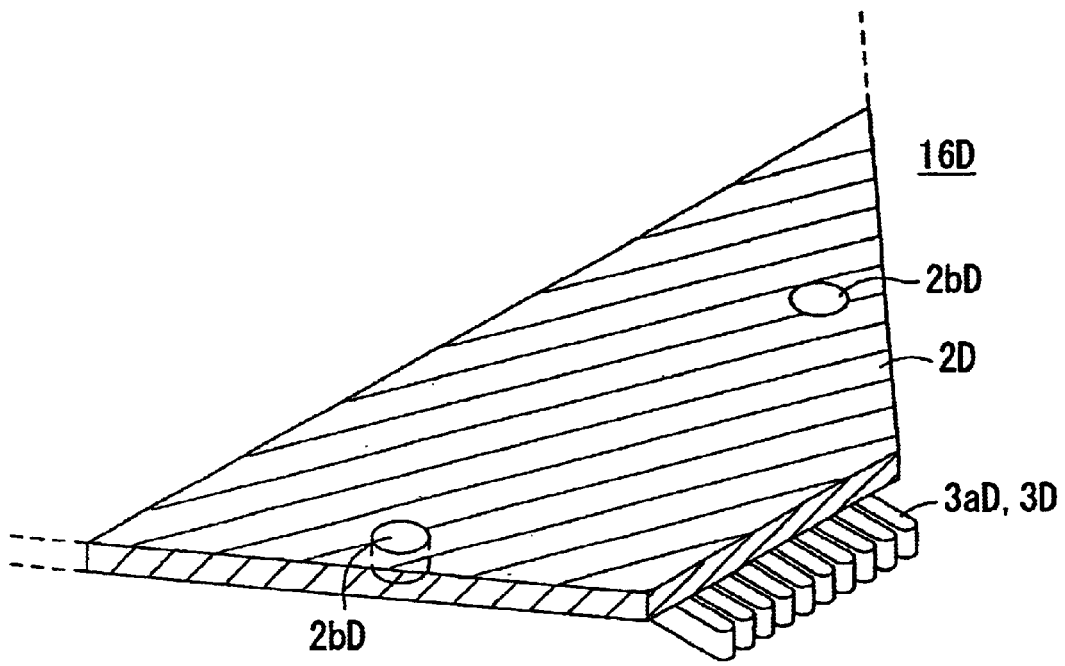
FIG. 10 is a perspective view of essential portions showing a third embodiment of a contact probe according to the present invention.
Figure 11:
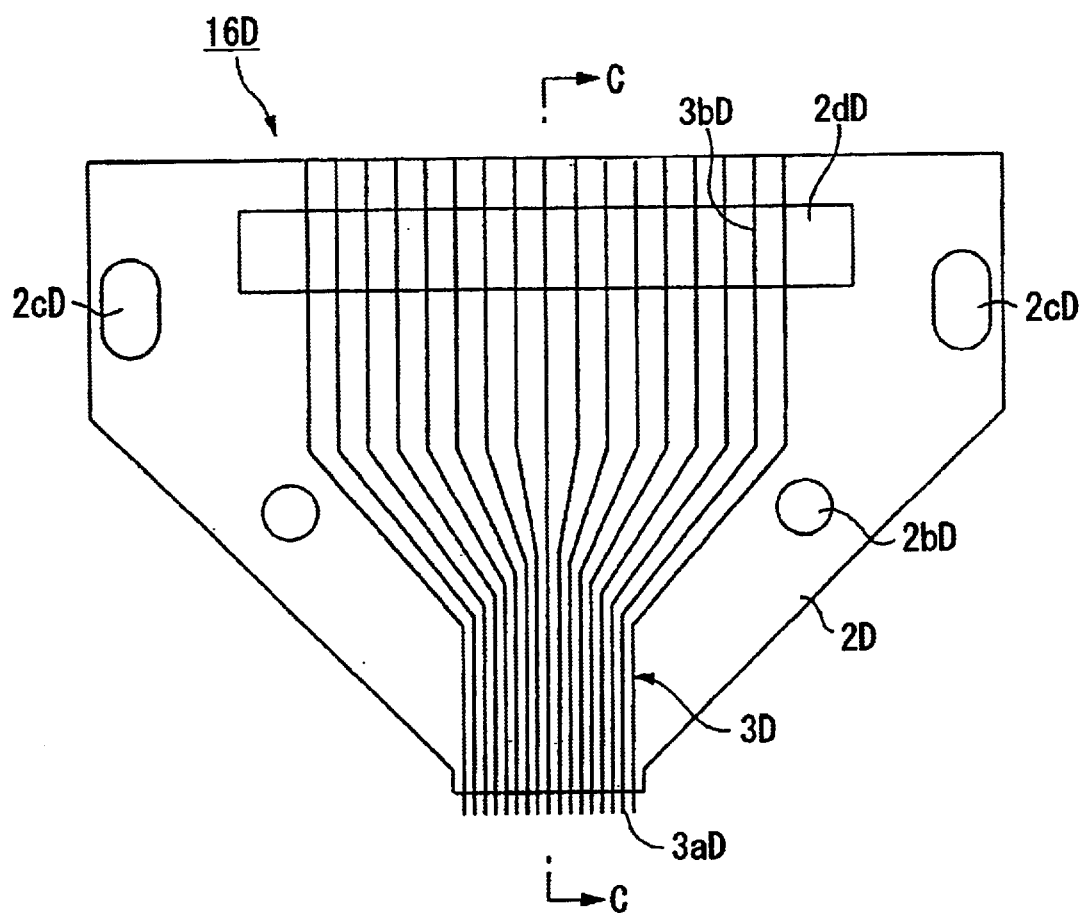
FIG. 11 is a plane view showing the third embodiment of the contact probe according to the present invention.
Figure 12:
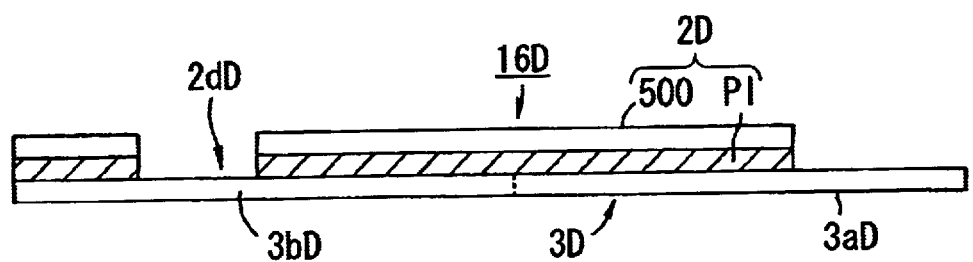
FIG. 12 is a sectional view taken along a line C—C of FIG. 11.

A third embodiment of the present invention with reference to FIGS. 10–15 where a contact probe 16D according to the present invention is provided as a probe for an IC and is integrated with mechanical parts 60D to form a probe device (probe card) 70D. FIGS. 10 and 11 are drawings showing the contact probe 16D cut out in a predetermined shape as an IC probe and FIG. 12 is a sectional view taken along a line C—C of FIG. 11. As shown in FIGS. 10 and 11, holes 2bD and holes 2cD are provided in a resin film 2D for positioning and fixing the contact probe 16D. A window 2dD is provided for sending signals obtained from wiring patterns 3D to a printed circuit board 20D (FIG. 13) via contact terminals 3bD.

Figure 13:
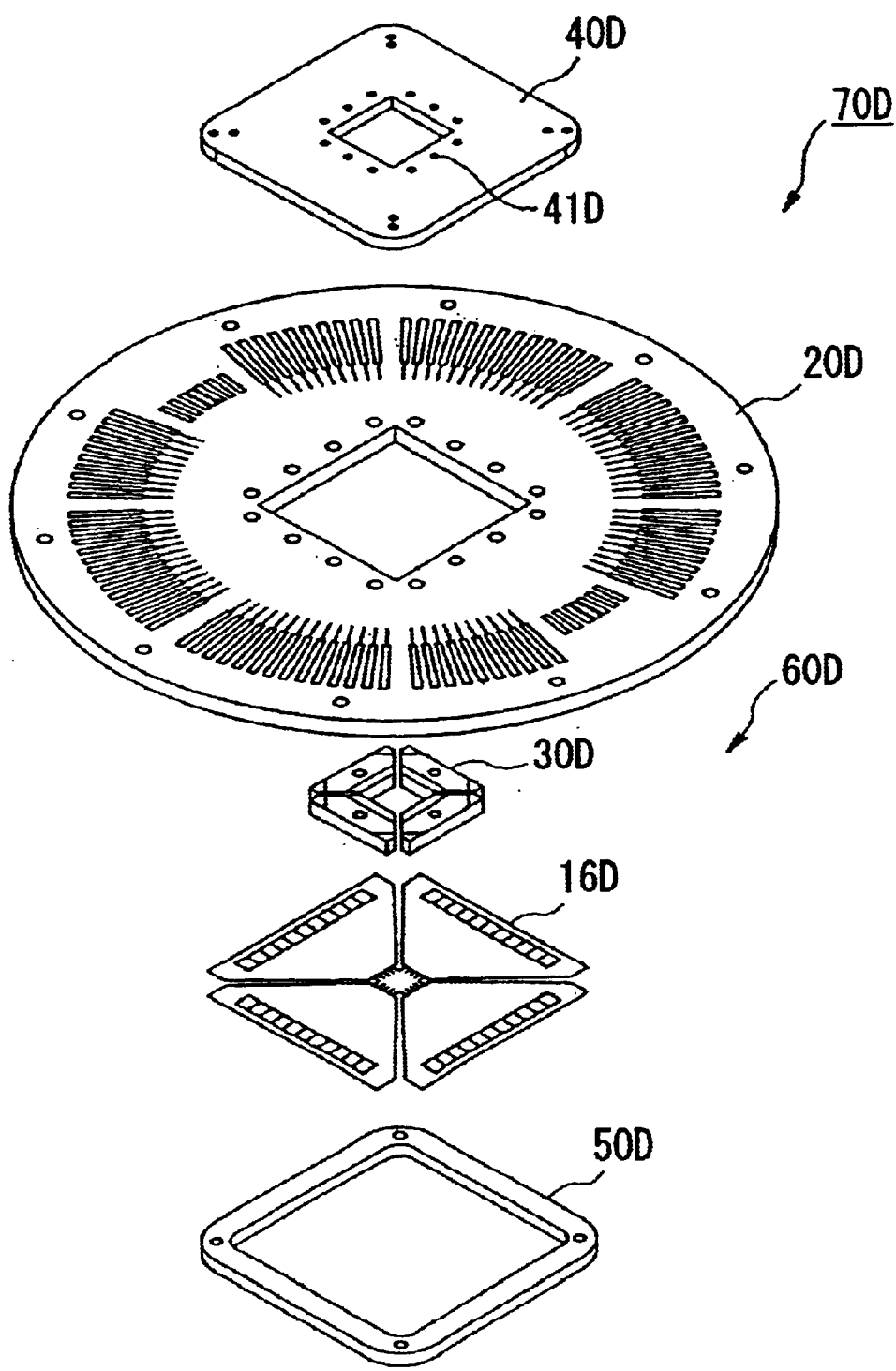
FIG. 13 is an exploded perspective view showing an example of a probe device integrated with the third embodiment of the contact probe according to the present invention.
Figure 14:
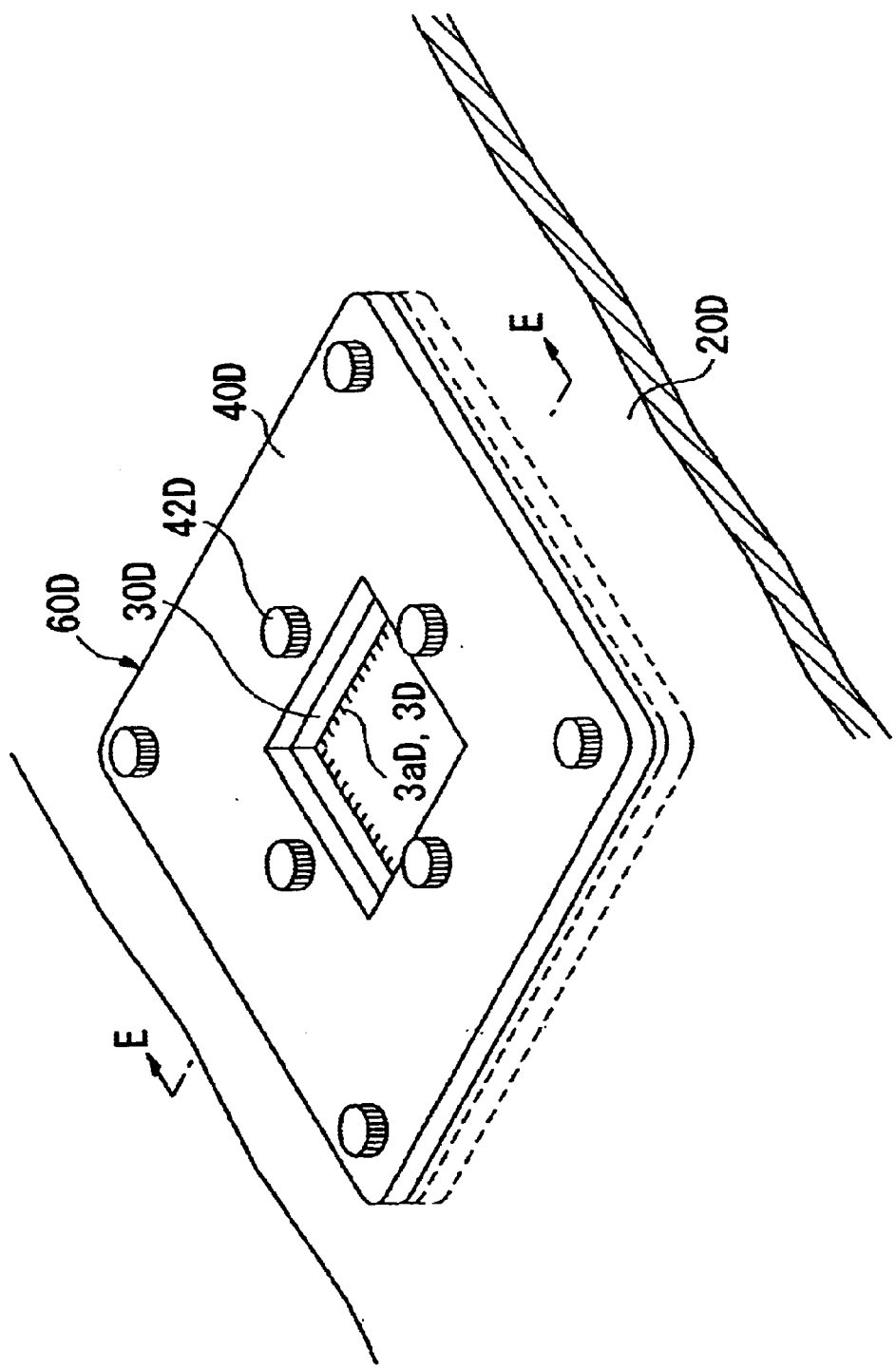
FIG. 14 is a perspective view of essential portions showing an example of a probe device integrated with the third embodiment of the contact probe according to the present invention.

As shown in FIG. 13, the mechanical parts 60D comprise a mounting base 30D, a top clamp 40D and a bottom clamp 50D. The contact probe 16D is assembled with the top clamp 40D attaching the printed circuit board 20D, the mounting base 30D, and the contact probe 16D via the bottom clamp 50D, bolts 42D, and bolt holes 41D (FIG. 14). Furthermore, the contact probe 16D are pressed by the bottom clamp 50D by which the wiring patterns 3D are kept in a predetermined inclined state and contact pins 3aD of the wiring patterns 3D are pressed onto an IC chip under test.

Figure 15:
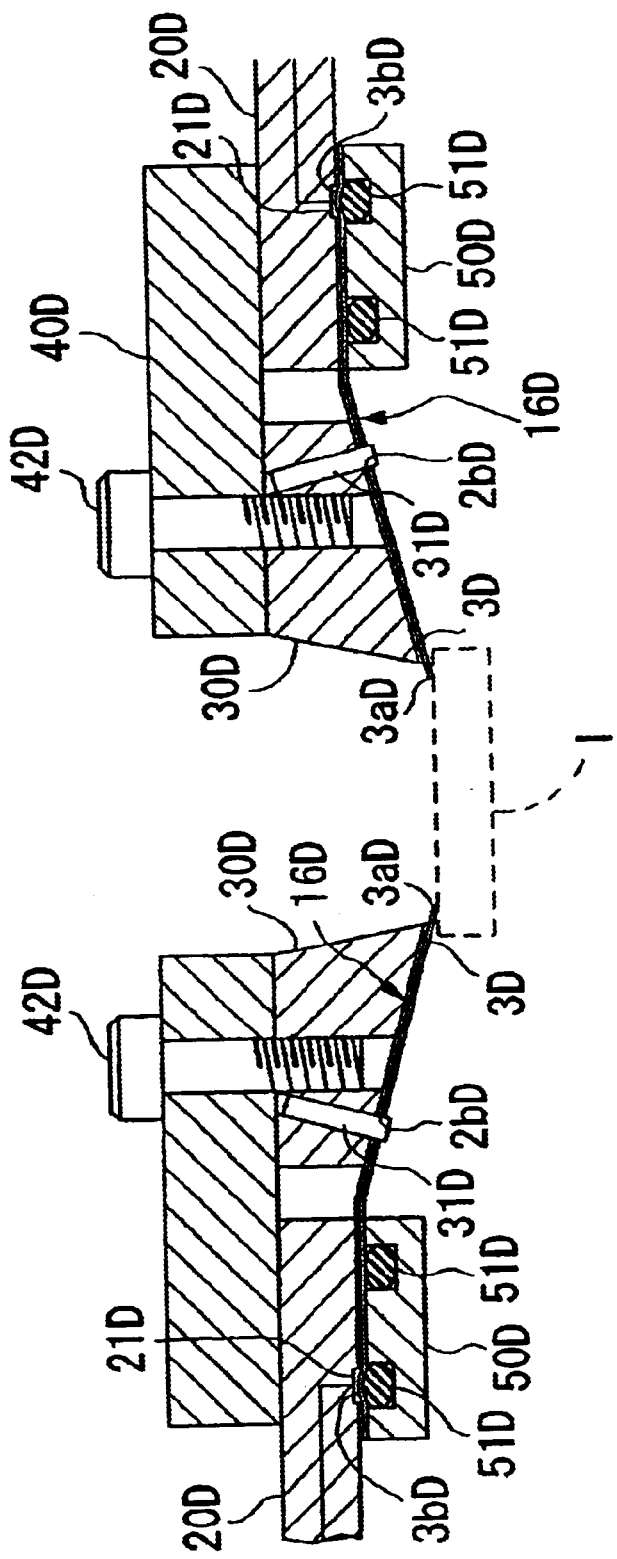
FIG. 15 is a sectional view taken along a line E—E of FIG. 14.
Figure 16:
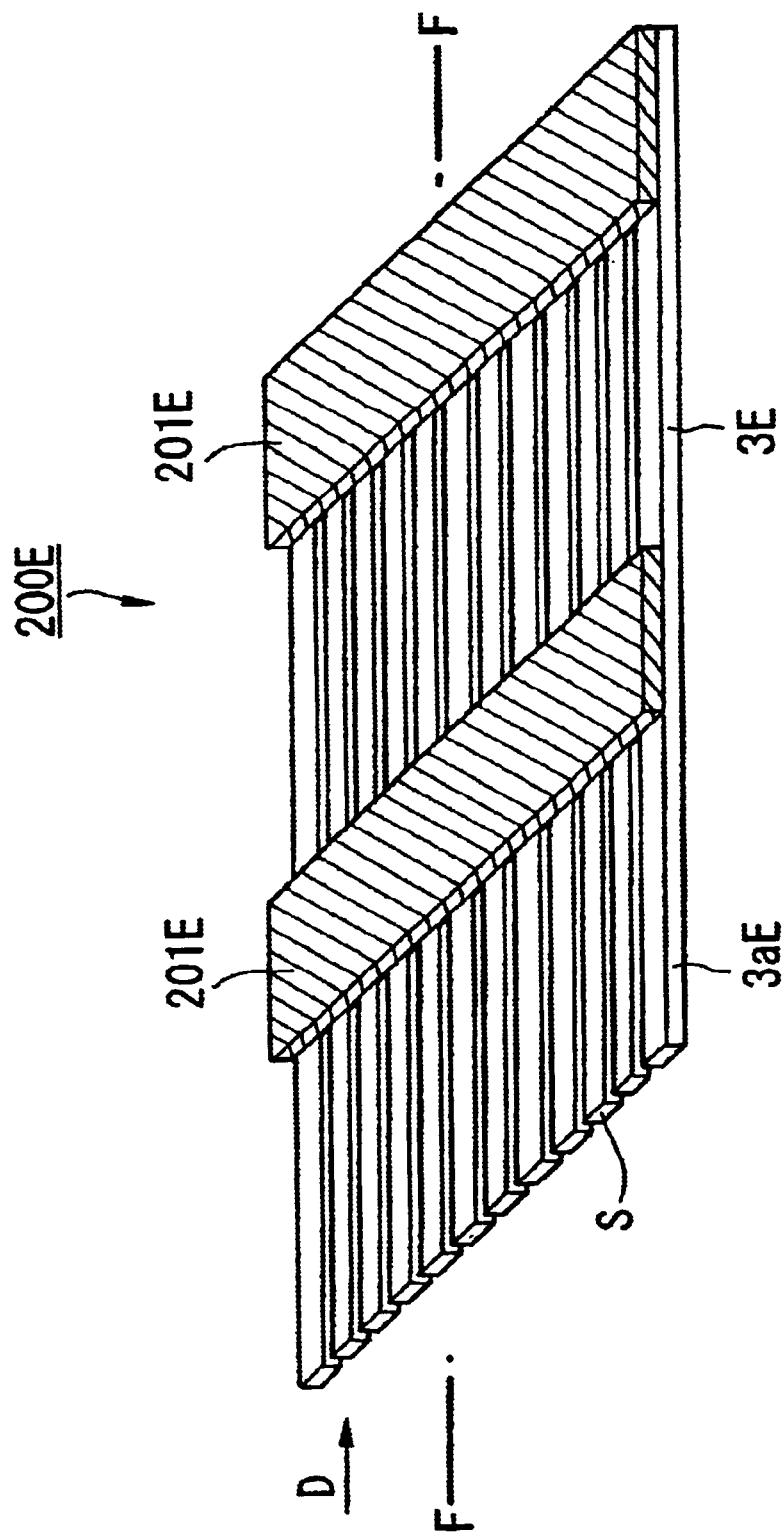
FIG. 16 is a perspective view showing a contact probe in a fourth embodiment of a probe device according to the present invention.
Figure 17:
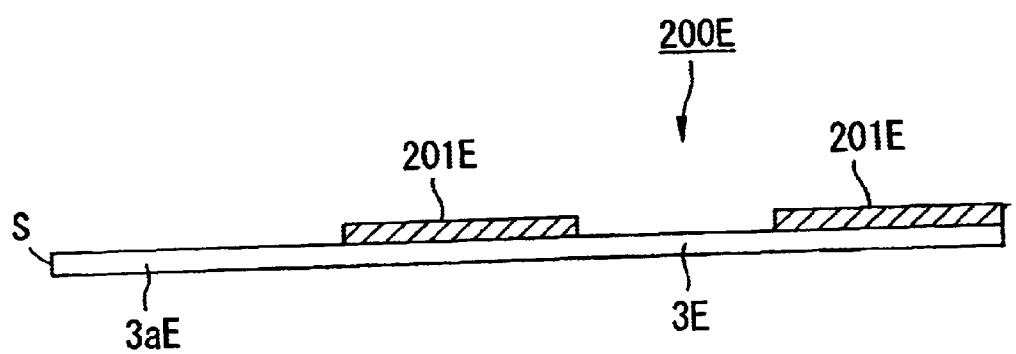
FIG. 17 is a sectional view taken along a line F—F of FIG. 16.

FIG. 14 shows the probe device 70D after assembly. FIG. 15 is a sectional view taken along a line E—E of FIG. 14. As shown in FIG. 15, the front ends of the wiring patterns 3D, that is, the contact pins 3aD are brought into contact with an IC chip I by the mounting base 30D. Positioning pins 31D for adjusting the position of the contact probe 16D are provided on the mounting base 30D. In this way, the wiring patterns 3D and the IC chip I are accurately positioned by inserting the positioning pins 31D into the positioning holes 2bD of the contact probe 16D. Elastic bodies 51D provided in the bottom clamp 50D are pressed against portions of the wiring patterns 3D at the windows 2dD provided in the contact probe 16D. In this way, the contact terminals 3bD are brought into contact with electrodes 21D of the printed wiring board 20D and signals obtained from the wiring patterns 3D can be transmitted via the electrodes 21D.

When a probe test of the IC chip I is performed using the probe device 70D as described above, the probe device 70D is inserted and attached to a prober and electrically connected to a tester and predetermined electric signals are sent to the IC chip I on a wafer via the contact pins 3aD of the wiring patterns 3D. Thereby, output signals from the IC chip I are transmitted to a tester via the contact pins 3aD whereby electric properties of the IC chip I are measured.

According to the contact probe 16D and the probe device 70D integrated with the contact probe 16D, similar to the first embodiment, the contact pins 3aD are made of a nickel-manganese alloy containing manganese in a range from 0.05 wt. % to 1.5 wt. % and therefore, the contact pin 3aD is provided with the hardness of Hv 350 or more even after high temperature heating. Furthermore, the amount of manganese (Mn) falls in a range of 0.05 wt. % or more and 1.5 wt. % or less and therefore, the high hardness and toughness necessary for the contact probe are obtained.

A fourth embodiment will now be described with reference to FIGS. 16–21. The contact probe 16D of the third embodiment is cut in a predetermined shape so as to form an IC probe. However, according to the fourth embodiment the contact probe is cut in a predetermined shape so as to form an LCD probe. The LCD contact probe is designated by notation 200E and a resin film is designated by notation 201E in FIGS. 16–18. As shown in FIG. 19, an LCD probe device 100E includes a contact probe pinching body (supporting member) 110E fixed to a frame 120E in a shape of a picture frame. The contact pins 3aE project from the contact probe pinching body 110E and are brought into contact with terminals (not shown) of an LCD (Liquid Crystal Display) 90.

Figure 18:
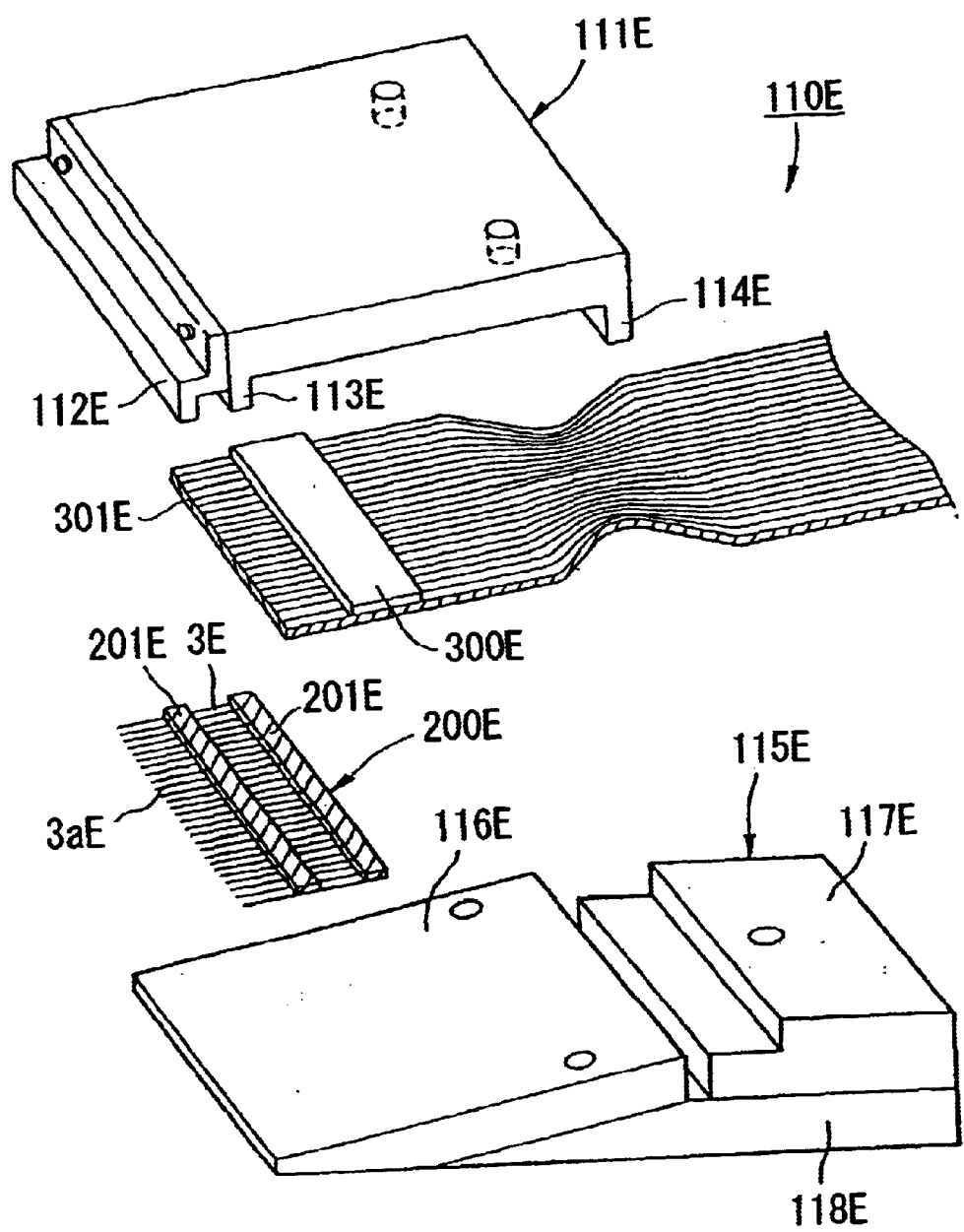
FIG. 18 is an exploded perspective view showing a contact probe pinching body in the fourth embodiment of the probe device according to the present invention.
Figure 19:
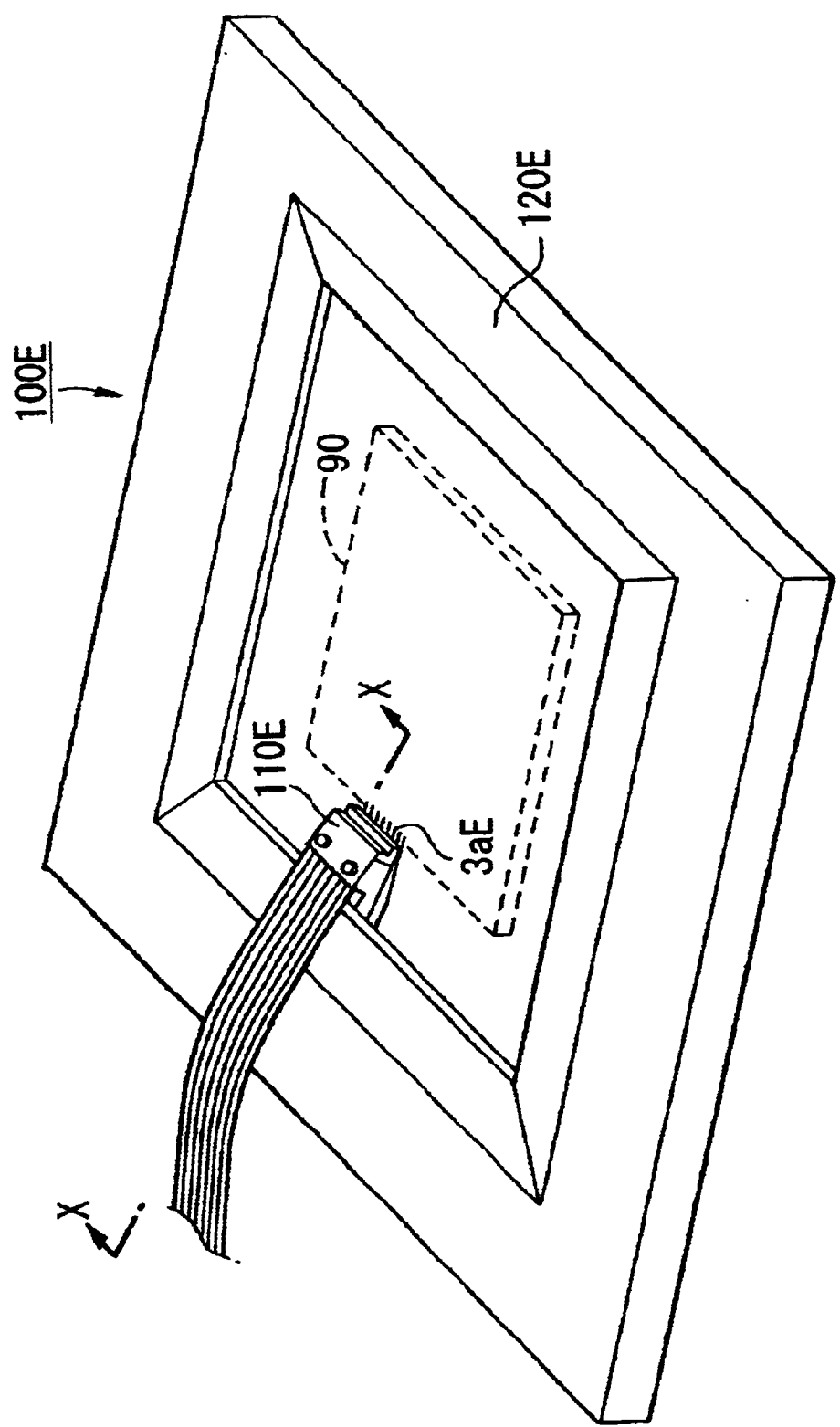
FIG. 19 is a perspective view showing the fourth embodiment of the probe device according to the present invention.

In FIG. 18, the contact probe pinching body 110E is provided with a top clamp 111E and a bottom clamp 115E. The top clamp 111E is provided with a first projection 112E for pressing onto the front ends of the contact pins 3aE, a second projection 113E for pressing onto terminals 301E on the side of a TABIC (wiring substrate having substrate side wiring patterns) 300E, and a third projection 114E for pressing onto leads 302E. The bottom clamp 115E comprises an inclined plate 116E, an attaching plate 117E and a bottom plate 118E. The contact probe 200E is mounted on the inclined plate 116E and the terminals 301E of the TABIC 300E are mounted between the resin film 201E and the second projection 113E. The top clamp 111E is next bolted on such that the first projection 112E is disposed on the resin film 201E and the second projection 113E is brought into contact with the terminals 301E.

Figure 20:
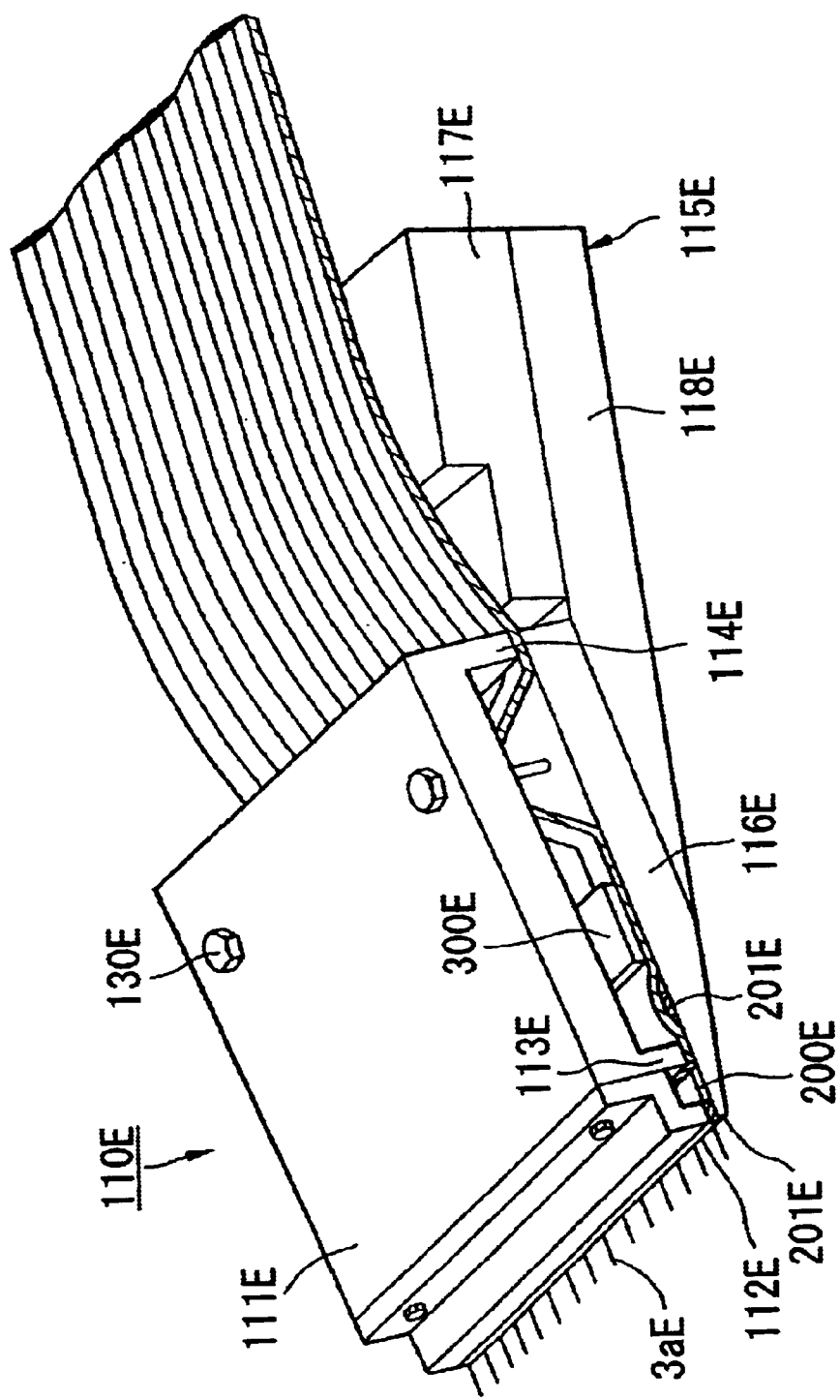
FIG. 20 is a perspective view showing the contact probe pinching body in the fourth embodiment of the probe device according to the present invention.
Figure 21:
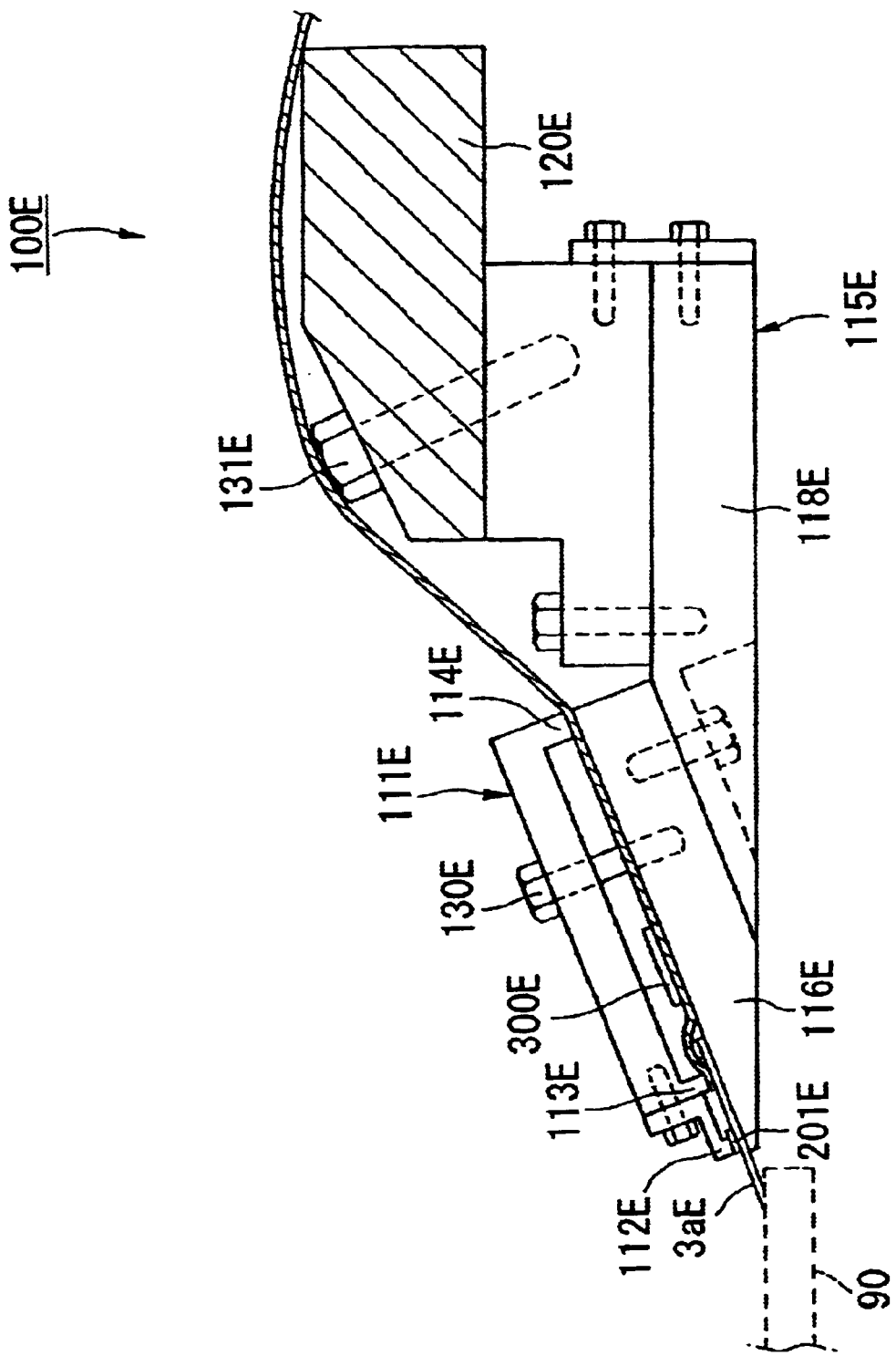
FIG. 21 is a sectional view taken along a line X—X of FIG. 19.

In FIG. 20, the contact probe pinching body 110E is assembled by clamping the contact probe 200E via the top clamp 111E, the bottom clamp 115E, and bolts 130E. As shown in FIG. 21, the contact probe pinching body 110E is fixed by bolts 131E to the frame 120E. To perform electric testing of the LCD 90 by using the LCD probe device 100E, the front ends of the contact pins 3aE of the LCD probe device 100E are brought into contact with terminals (not shown) of the LCD 90. Signals obtained from the contact pins 3aE are transmitted via the TABIC 300E.

According to the LCD probe device 100E, the contact pins 3aE which are brought into contact with the terminals of the LCD 90 are made of a Ni—Mn alloy having the manganese content of 0.05 wt. % to 1.5 wt. % and therefore, similar to the second embodiment and the third embodiment, the contact pins 3aE are provided with the hardness of Hv 350 or higher even after high temperature heating. An LCD probe device 100E with a contact probe having high hardness and toughness is thus obtained according to the fourth embodiment of the present invention.

Figure 22:
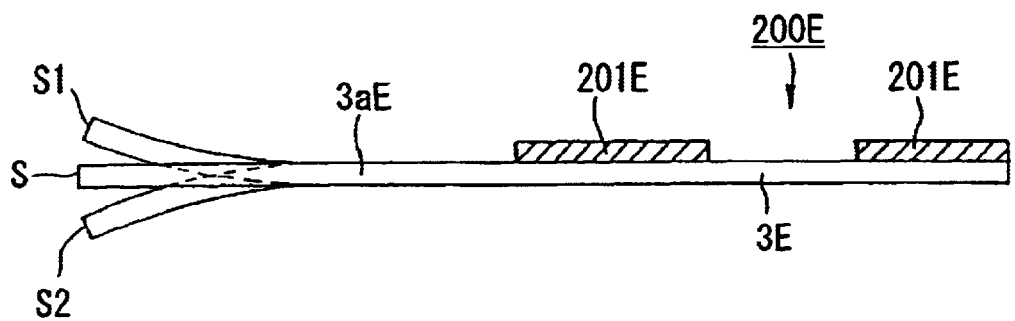
FIG. 22 is a side view showing a conventional drawback of a contact probe with respect to a fifth embodiment of a probe device according to the present invention.
Figure 23:
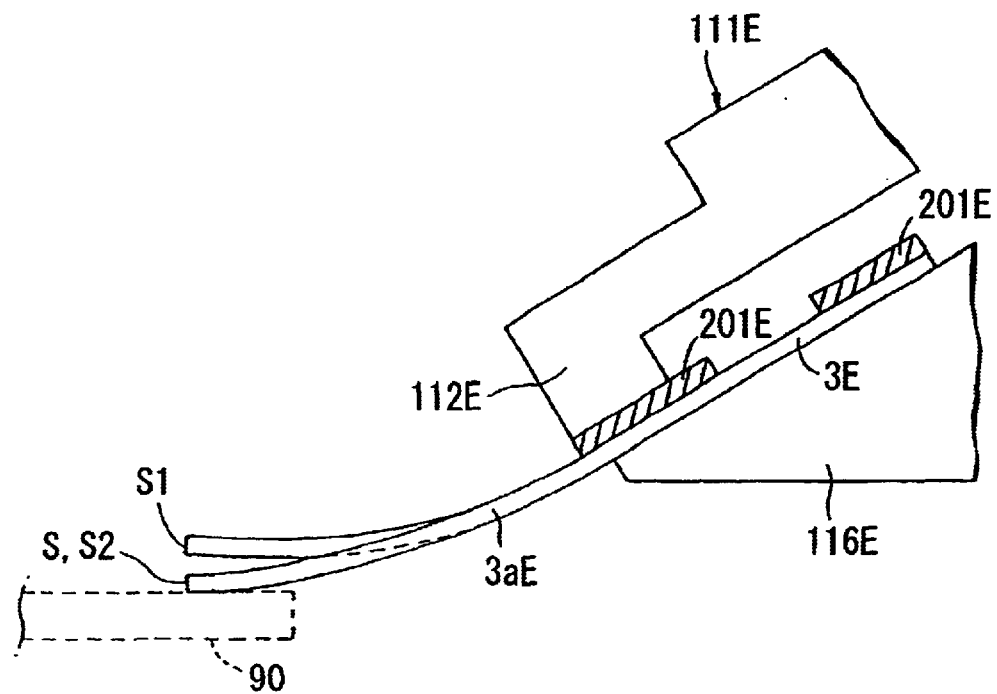
FIG. 23 is a side view showing the conventional drawback of a probe device with respect to the fifth embodiment of the probe device according to the present invention.

A fifth embodiment of the present invention will now be described with reference to FIGS. 22–24. In FIG. 22, the contact pins 3aE of the contact probe 200E have a front portion that may be bent upward (S1), bent downward (S2) or be in a normal position (S). As shown in FIG. 23, the contact pins 3aE are pressed against the terminals of the LCD 90 via the resin film 201E, the first projection 112E, and the inclined plate 116E. When the probe pins 3aE are bent in the S and S2 positions, the probe pins 3aE contact the terminals of the LCD 90. However, when the probe pins 3aE are bent in the S1 position a sufficient contact pressure may not be obtained. Accordingly, contact failure of the contact pins 3aE against the terminals of the LCD 90 occurs and an accurate electric testing cannot be performed.

Figure 24:
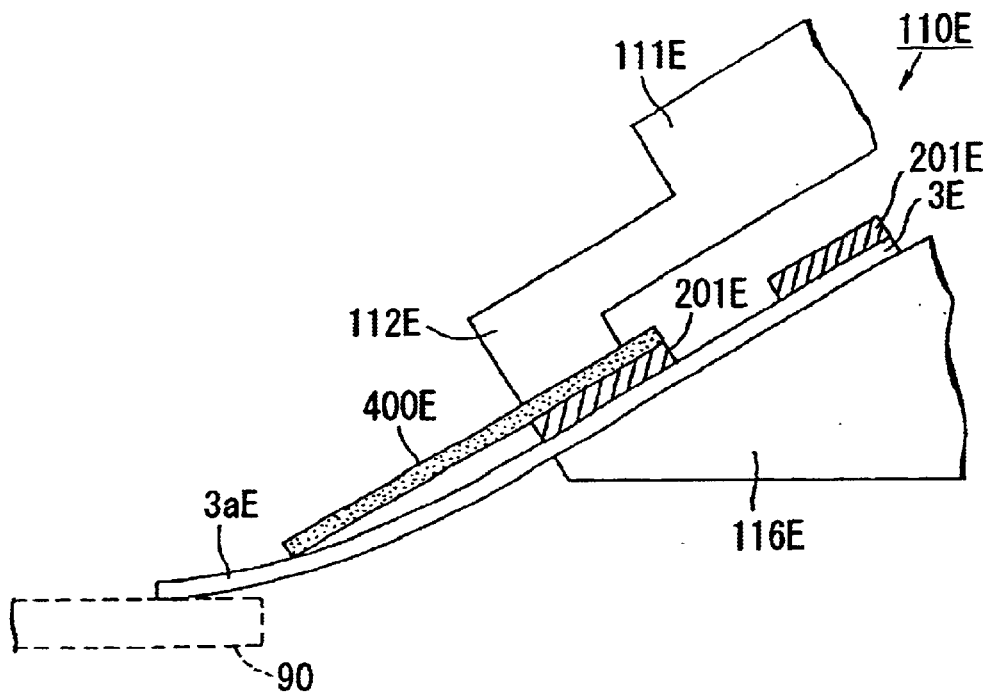
FIG. 24 is a side view showing a contact probe integrated to the contact probe pinching body in the fifth embodiment of the probe device according to the present invention.

In FIG. 24, the fifth embodiment adopts a contact probe pinching body (support member) 110E including a highly elastic film 400E, such as an organic or inorganic material, which overlaps the resin film 201E and presses against front end portions of the contact pins 3aE. The elastic film 400E is sandwiched between the first projection 112E of the top clamp 111E and the resin film 201E. The elastic film 400E overlaps the resin film 201E and projects over the front end portions of the contact pins 3aE, in order to press the front end portions of the contact pins 3aE against the terminals of the LCD 90 when the front end portions of the contact pins 3aE are bent in the S, S1 and S2 positions (FIG. 22). It is preferable that the highly elastic film 400E comprises ceramics or polyethylene terephthalate if it is an organic material and comprises ceramics, particularly alumina film if it is an inorganic material. Furthermore, when the contact pins 3aE are pressed against the terminals of the LCD 90, the highly elastic film 400E presses from above the contact pins 3aE and even with respect to position S1 allows for a firm contact between the terminal of the LCD 90 and the contact pins 3aE. Thereby, a uniform contact pressure can be obtained at the front ends of the respective contact pins 3aE according to the fifth embodiment of the present invention. Moreover, the front ends of the contact pins 3aE can be firmly brought into contact with the terminals of the LCD 90 and accordingly, measurement failure due to contact failure can be eliminated. In addition, the contact pressure on the contact pins 3aE can be adjusted by changing how far the elastic film 400E projects over the contact pins 3aE.

Figure 25:
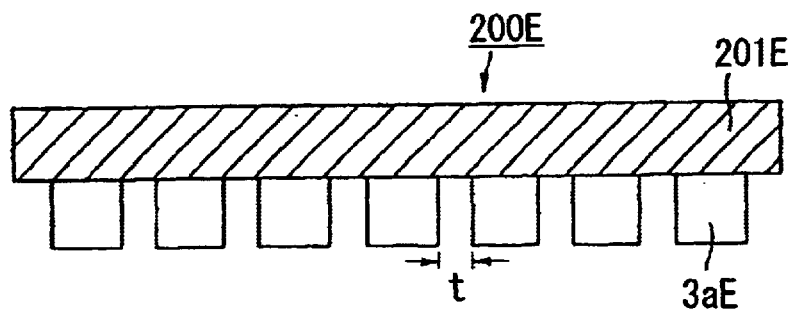
FIG. 25 is a view in direction D of FIG. 16 with respect to a sixth embodiment of a contact probe according to the present invention.
Figure 26:
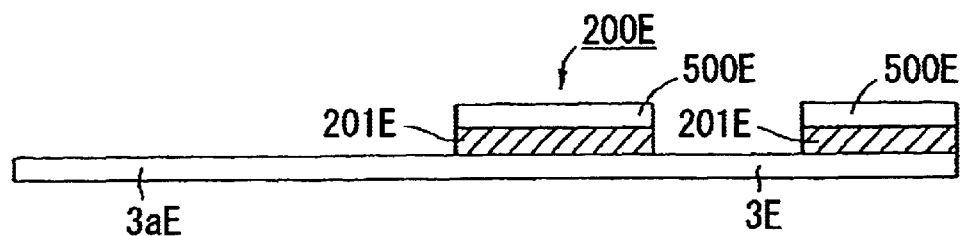
FIG. 26 is a side view showing the sixth embodiment of the contact probe according to the present invention.

A sixth embodiment of the present invention will now be described with reference to FIGS. 25 and 26. In FIG. 25, the resin film 201E of the contact probe 200E which has been explained with reference to the fourth embodiment, is made of, for example, polyimide resin. With this construction an elongation may occur due to absorbed moisture causing an interval t between the contact pins 3aE to change. This results in the contact pins 3aE not making good contact with predetermined positions of the terminals of the LCD 90 and accordingly accurate electric test cannot be performed. Hence, according to the sixth embodiment, as shown in FIG. 26, a metal film 500E is provided on top of the resin film 201E (e.g., by pasting) and the change in the interval t between the contact pins 3aE is decreased even during a change in humidity. In this way, the contact pins 3aE are firmly brought into contact with predetermined positions of the terminals of the LCD. Accordingly, positional shift of the respective contact pins 3aE does not typically occur and the front end portions of the contact pins 3aE are brought into contact with the terminals of the LCD 90 with fine precision. Therefore, damage caused by misalignment of the contact pins 3aE made of a Ni—Mn alloy having high hardness can be avoided. In addition, it is preferable that the metal film 500E is made of a material, such as Ni, a Ni alloy, Cu, or a Cu alloy.

Figure 27:
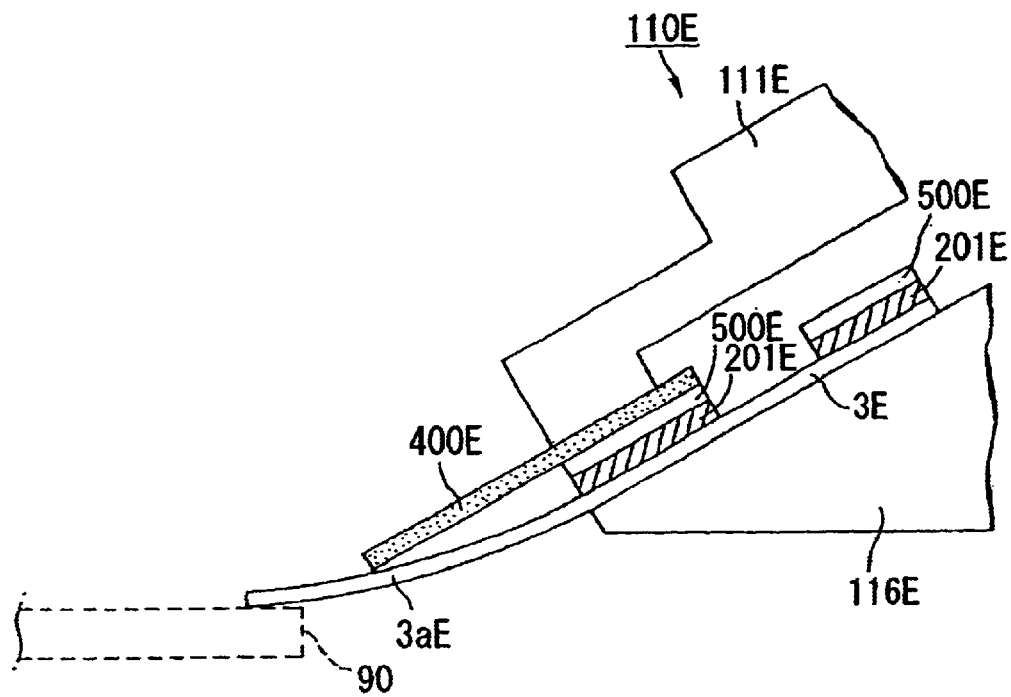
FIG. 27 is a side view showing a contact probe integrated to a contact probe pinching body in a seventh embodiment of a probe device according to the present invention.

A seventh embodiment will now be described with reference to FIG. 27. In this embodiment, in addition to a metal film 500E provided on the resin film 201E, a highly elastic film 400E similar to that of the fifth embodiment is also provided. The elastic film 400E ensures that a uniform contact pressure is obtained irrespective of a bending state of the front ends of the contact pins 3aE. In this way, electrical testing can be performed accurately by minimizing the change in the interval t between the contact pins 3aE.

Figure 28:
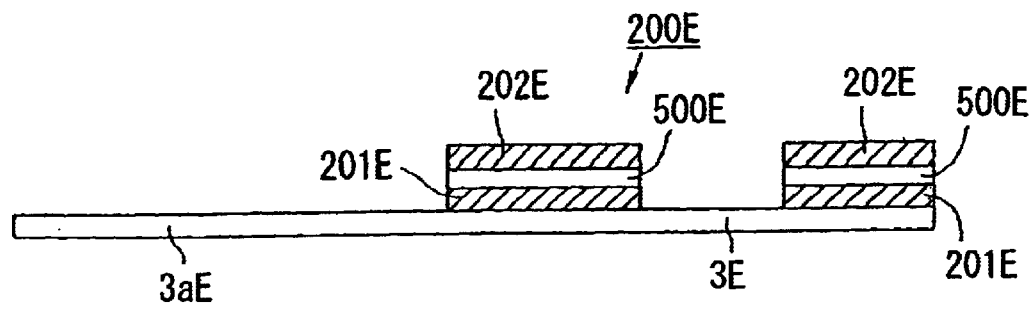
FIG. 28 is a side view showing a contact probe in an eighth embodiment of a probe device according to the present invention.
Figure 29:
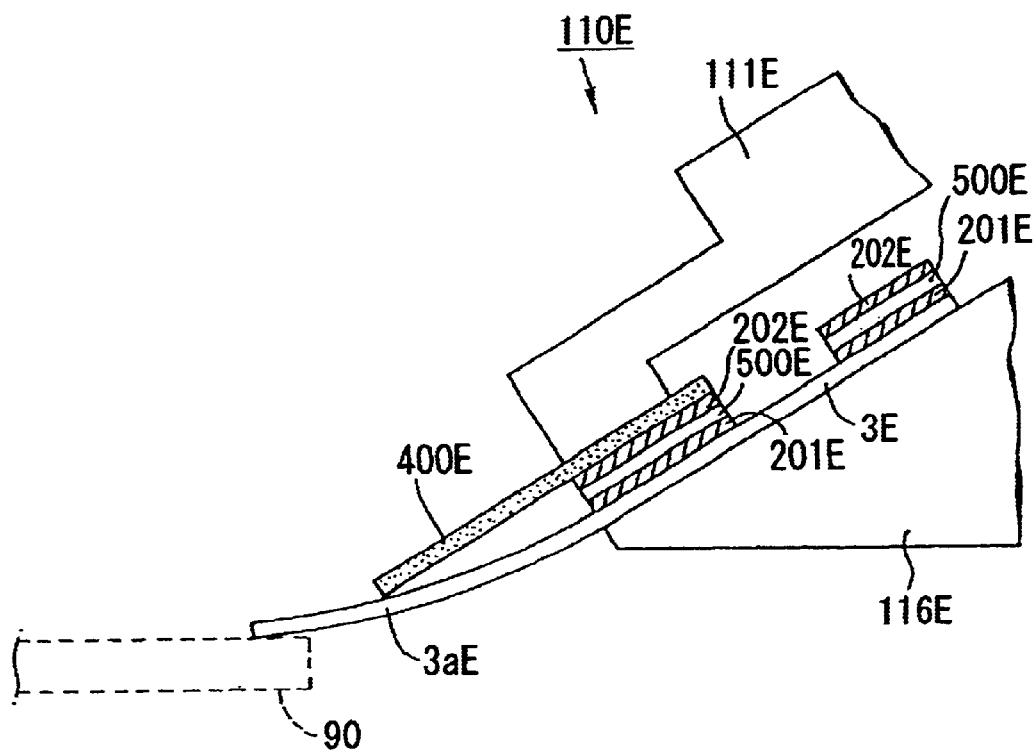
FIG. 29 is a side view showing the contact probe integrated to a contact probe pinching body in the eighth embodiment of the probe device according to the present invention.

A eighth embodiment will now be described with reference to FIGS. 28 and 29. As shown in FIG. 28, this embodiment includes a second resin film 202E provided on the metal film 500E attached on the resin film 201E. As shown in FIG. 29, the highly elastic film 400E is provided on the second resin film 202E (e.g., by lamination). Here, different from the seventh embodiment, the second resin film 202E is installed to prevent short-circuiting between the terminals of the TABIC 300E arranged above a rear end portion of the metal film 500E (not shown) and the metal film 500E. Furthermore, if only the metal film 500E attached on the resin film 201E is provided, oxidation of the metal film 505E exposed to the atmosphere occurs. Therefore, oxidation is prevented by coating the metal film 500E with the second resin film 202E.

Figure 30:
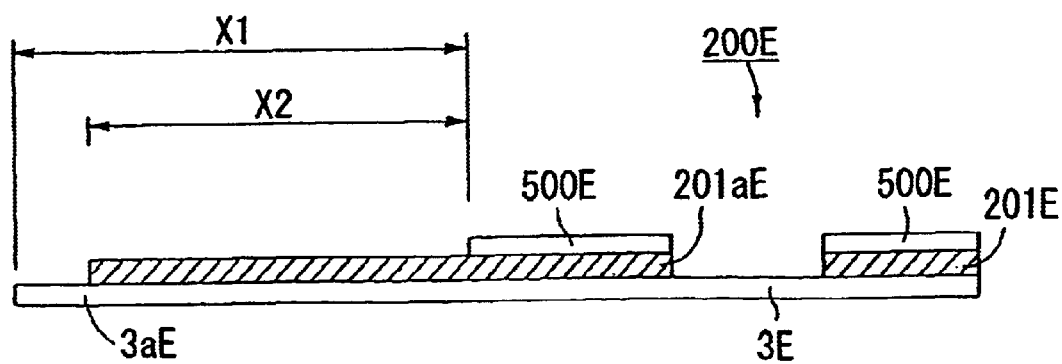
FIG. 30 is a side view showing a contact probe in a ninth embodiment of a contact probe according to the present invention.
Figure 31:
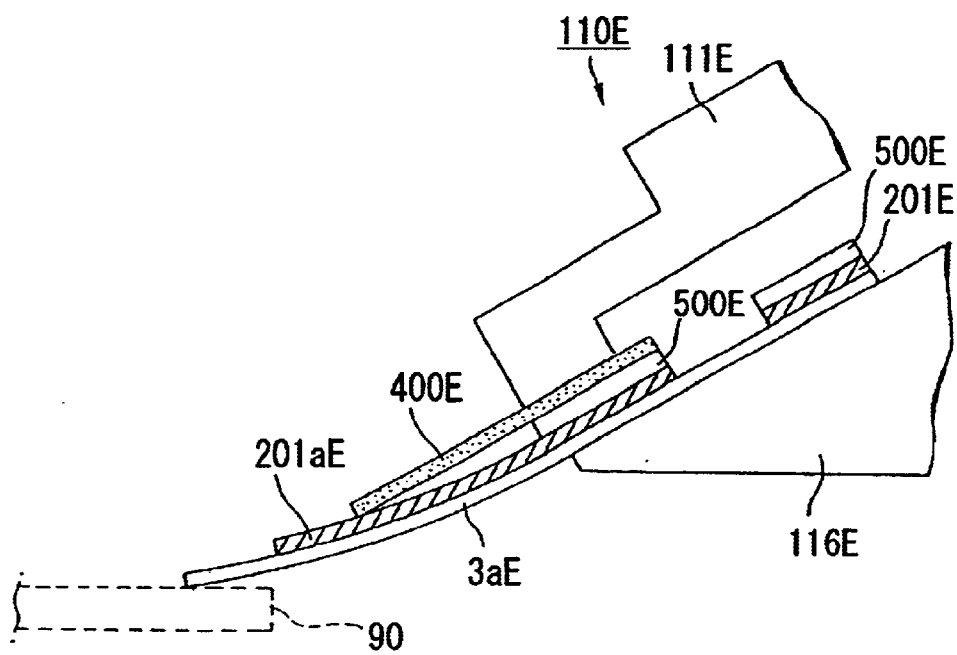
FIG. 31 is a side view showing the contact probe integrated to a contact probe pinching body in the ninth embodiment of the probe device according to the present invention.

A ninth embodiment will now be described with reference to FIGS. 30 and 31. According to the fifth, the seventh and the eighth embodiments, the highly elastic film 400E is pressed against the contact pins 3aE. Thus, friction between the highly elastic film 400E and the contact pins 3aE due to repeated use causes a distortion in the contact pins 3aE resulting in shifted contact points. Therefore, according to the ninth embodiment, as shown in FIG. 30, a film 201aE is provided having a width wider than that in the conventional example, wherein X1>X2, where X1 designates a length of the contact pin 3aE projected from the metal film 500E, and X2 designates a length of the wide resin film 201aE projected from the metal film 500E. Furthermore, as shown in FIG. 31, when the high elastic film 400E projects a shorter distance than the wide resin film 201aE, the highly elastic film 400E is brought into contact with the soft and wide resin film 201aE. In this way, the elastic film 400E is not brought into direct contact with the contact pins 3aE and accordingly, the contact pins 3aE can be prevented from bending to the left and right direction. According to the LCD probe device 100E in the ninth embodiment, the wide resin film 201aE is formed longer on the front end side than the highly elastic film 400E and serves as a buffer when the highly elastic film 400E presses the contact pins 3aE. Therefore, even with repeated use, the contact pins 3aE are not warped and bent by friction due to the highly elastic film 400E and stable contact can be maintained with respect to the terminals of the LCD 90.

Figure 32:
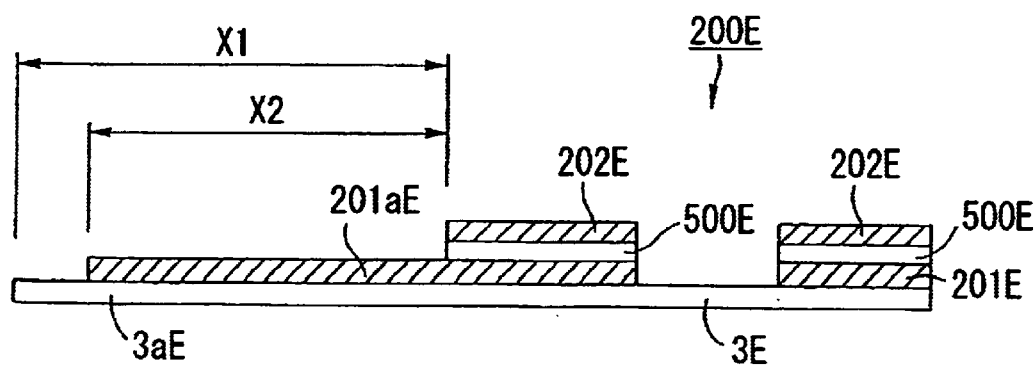
FIG. 32 is a side view showing a contact probe in a tenth embodiment of a probe device according to the present invention.
Figure 33:
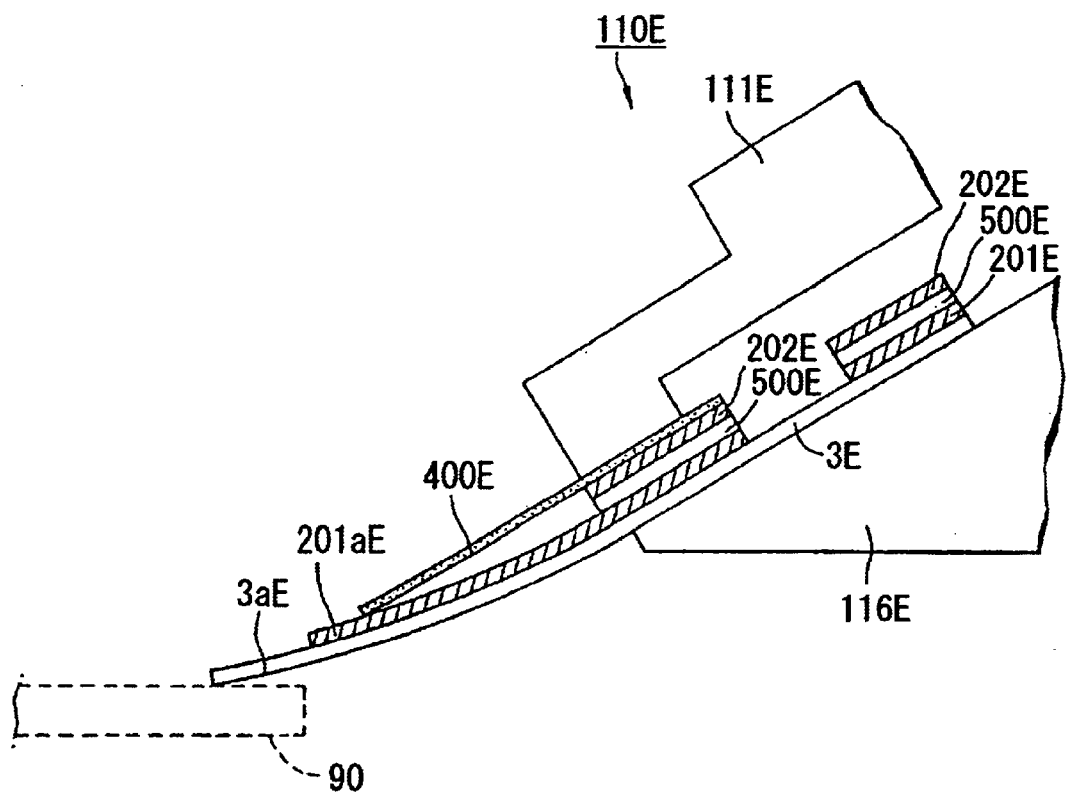
FIG. 33 is a side view showing the contact probe integrated to a contact probe pinching body in the tenth embodiment of the probe device according to the present invention.

A tenth embodiment will now be described with reference to FIGS. 32 and 33. According to this embodiment, the second resin film 202E is provided on the metal film 500E with X1>X2, where X1 designates a length of the contact pins 3aE projected from the metal film 500E, and X2 designates a length of the wide resin film 201aE projected from the metal film 500E. A shown in FIG. 33, the highly elastic film 400E is provided on the second resin film 202E (e.g., by lamination) such that the highly elastic film 400E projects a shorter distance than the wide resin film 201aE. According to the LCD probe device 100E of the tenth embodiment, respective advantages of the fourth through the ninth embodiments, such as the high hardness of the contact pins 3a, a uniform distribution of contact pressure, a restriction of the positional shift, a stabilization of contact pressure, and a prevention of short circuit caused by the metal film are achieved. In addition, contact probes of the fourth through the tenth embodiments may be adopted in a chip carrier or a probe device for an IC probe. In this case, the shape of the contact probe, the wiring, the pitch and arrangement of the contact pins, etc. are set in correspondence with the respective probe device to which the contact probe is integrated.

Plating conditions in the electrolytic plating step for forming wiring patterns and contact pins of the contact probes in the above-described respective embodiments, are obtained based on the following test results. The plating solution for including Mn in Ni is a nickel sulfamate bath added with manganese sulfamate. With regard to the amount of manganese contained in a Ni plated film, the plating is conducted under the following conditions since the plating is controlled by the amount of manganese in the plating solution and the current density in plating:

Manganese amount: 20 through 35 g/l

Current density: 1.0 through 10 A/dm$^2$

The plating conditions are set in the above-described ranges because when the manganese amount is less than 20 g/l and the current density is less than 1.0 A/dm$^2$, the amount of manganese content in the film is small and a desired hardness cannot be obtained. However, when the manganese amount exceeds 35 g/l and the current density exceeds 10 A/dm$^2$, the amount of manganese content is increased to the point that stresses of the plated film typically are increased and the film typically becomes very brittle. In addition, the plating may be performed with a nickel sulfate bath as the base instead of a sulfamate bath. However, stresses are reduced in the plating by using the nickel sulfamate bath as compared to the nickel sulfate bath.

Figure 34:
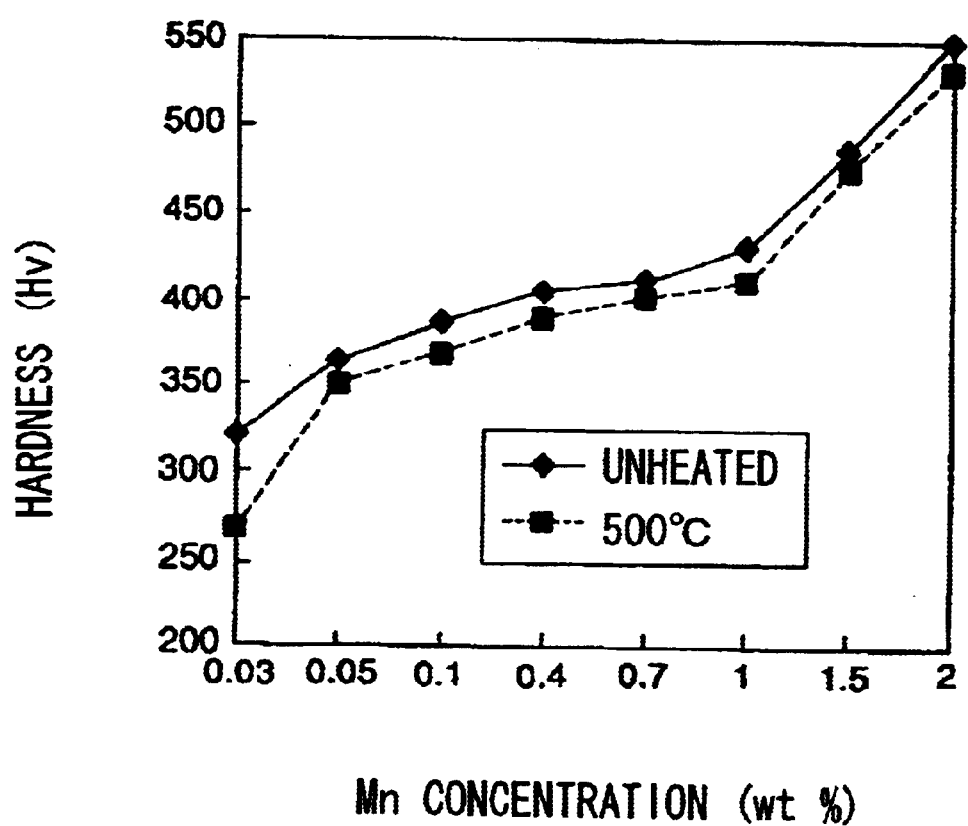
FIG. 34 is a graph showing a relationship between a Mn (manganese) concentration and a hardness at a front end portion of a contact probe according to the present invention.

The following Table 1 shows an experimental result of the manganese concentration and the hardness before and after heat treatment for a case when the current density is varied while the manganese amount is kept constant (i.e., 30 g/l). In addition, manganese concentration versus hardness is shown in the graph of FIG. 34.

TABLE 1

Relationship between manganese concentration in film and hardness.

| Mn conc. | Heat treatment temperature | | Current density | |
|---|---|---|---|---|
| wt. % | Unheated (HV) | 500° C. (Hv) | A/dm$^2$ | Remarks |
| 0.03 | 322 | 265 | 0.5 | Insufficient hardness |
| 0.05 | 365 | 351 | 1.0 | |
| 0.10 | 387 | 369 | 2.0 | |
| 0.40 | 406 | 390 | 3.0 | |
| 0.70 | 412 | 402 | 5.0 | |
| 1.00 | 430 | 411 | 7.0 | |
| 1.50 | 487 | 476 | 10 | |
| 2.00 | 550 | 532 | 14 | Very brittle |

Figure 35:
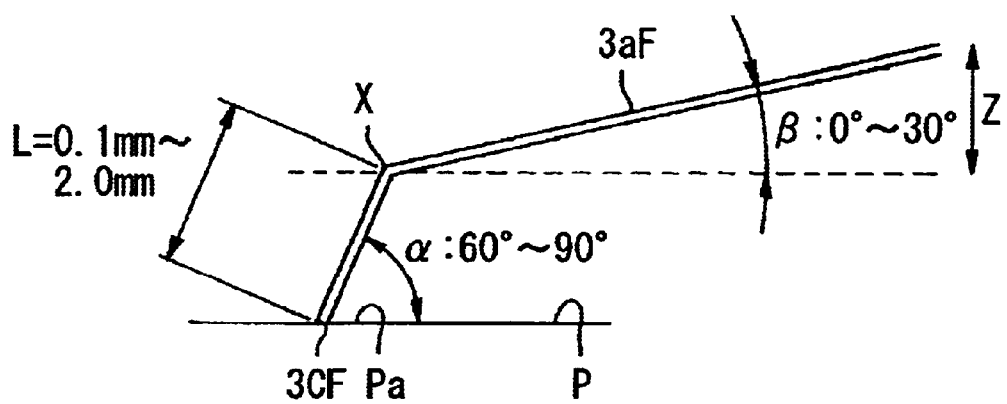
FIG. 35 is a side view magnifying a contact pin in an eleventh embodiment of a contact probe according to the present invention.
Figure 36:
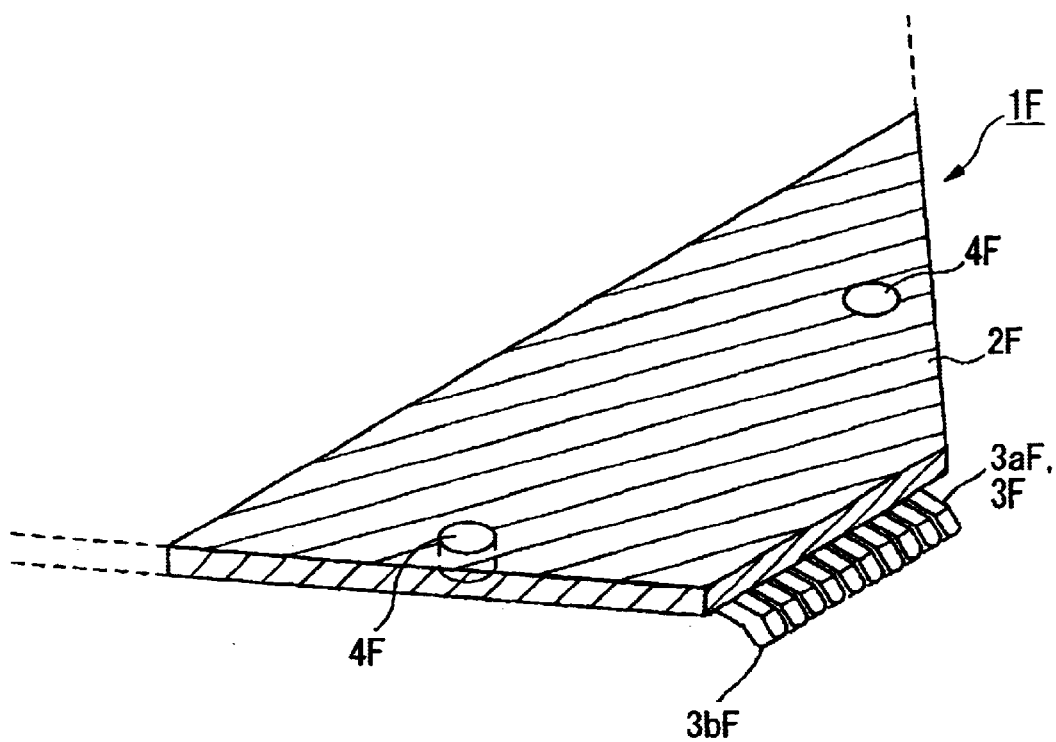
FIG. 36 is a perspective view of essential portions showing the eleventh embodiment of the contact probe according to the present invention.

An eleventh embodiment of a contact probe according to the present invention will now be described with reference to FIGS. 35–38. In FIGS. 35–38, notation 1F designates a contact probe, notation 2F designates a resin film and notation 3F designates wiring patterns. According to the contact probe 1F of the embodiment, as shown in FIGS. 35 and 36, a portion of length L of the contact pin 3aF is bent downward at a middle position X. The length L is in a range of 0.1 mm to 2.0 mm. The front end portion of the contact pin 3aF is constituted such that when it is brought into contact with a pad P (object of measurement), an angle α with respect to a contact face Pa is in a range of 60° to 90°. With respect to a base end portion of the contact pin 3aF, an angle β with respect to the contact face Pa is in a range of 0° to 30°.

The fabrication steps of the contact probe 1F will now be explained. The base metal layer forming step, the pattern forming step, the electrolytic plating step, the film pasting step, the separating step and the gold coating step are the same as those in the first embodiment. The difference of the present embodiment and the first embodiment is the addition of a contact pin bending step and a polishing step.

Contact Pin Bending Step

The contact pins 3aF are bent using a fine mold so as to form the contact pins 3aF having a predetermined angle as shown in FIGS. 35 and 36.

Contact Pin Polishing Step

As a result of bending the contact pins 3aF, if an irregularity results in the length (height) of the contact pins 3aF, the pins are made uniform by polishing. As a polishing method, the contact pins 3aF are fixed and the bent front end portions of the contact pins 3aF are sanded with sand paper in a rotating motion.

In fabrication of the contact pins 3aF, it is difficult to form a fine pattern on the mask in accordance with a desired shape. Accordingly, as shown in FIG. 36, the front end portion of the contact pin 3aF corresponding to an end portion of the pattern have concave curved faces. Therefore, when a lower side 3bF of the concavely curved face of the contact pin 3aF is brought into contact with the pad P, a local needle pressure in the contact area is increased. In the conventional tungsten needle probe, when the tungsten needle is brought into contact with the substantially planar pad matrix, the pad matrix is liable to be scrubbed off. Hence, according to the present embodiment, the contact pin 3aF is bent at the middle portion X and the angles α and β of the front end portion and the base end portion of the contact pin 3aF with respect of the contact face Pa are changed. Thereby, the angle α (contact angle) can be set to a large value without increasing the angle β (i.e, the angle of the resin film 2F with respect of the contact face Pa). In this way, the pad matrix P can be prevented from being impaired due to scrubbing without excessively increasing the scrub distance and without increasing the height of the probe device.

According to the present embodiment, when the angle α is 60° or more the pad matrix P is not impaired. The angle α is set to 90° or less because when α is greater than 90°, the skin of the pad P cannot be excellently scrubbed off in the scrubbing operation and sufficient conductivity is not ensured resulting in contact failure during testing. Furthermore, the angle β is 30° or less so that the scrubbing distance is not excessively increased and the front end of the contact pin 3aF does not project from the pad P in the scrubbing operation. The angle β is set is 0° or more because when β is less than 0°, a sufficient overdriving amount (arrow mark Z in FIG. 35) in the scrubbing operation cannot be provided.

In addition, it is known with regard to the scrubbing distance that the distance is more or less smaller than a calculated value since the contact pin 3aF is bent or the front end portion of the contact pin 3aF is frictionally engaged with the contact face Pa. Furthermore, according to the present embodiment, a face 3cF highly parallel to the contact face Pa as compared with conventional unbent contact pins is formed at the front end portion of the contact pin 3aF by bending the contact pins as shown in FIG. 36. Conventionally, in positioning a contact pin on a pad, a method where light is irradiated from below the contact pin and light reflected from the contact pin is detected by which the position of the contact pin is recognized is used. According to the present embodiment, the face 3cF formed so as to have a higher vertical degree with respect to the direction of irradiating light. Therefore, a sufficient amount of light is reflected and the detection of position is facilitated.

Furthermore, according to the present embodiment, the length L from the bent position X to the front end portion of the contact pin 3aF is 2.0 mm or less so that in the overdriving operation the amount of bending at the portion of the length L can be restrained to a small value. In this way, the contact needle pressure with respect to the pad P is substantially constant and an excellent scrubbing operation is performed. In addition, the length L is set to 0.1 mm or more so that skin scraped off in the scrubbing operation, dirt, etc. is prevented from adhering to the inner face of the bent portion of the contact pin 3aF. In addition, according to the present embodiment, polishing is performed at the bent front end portion of the contact pin 3aF. Accordingly, even if irregularities with respect to the length (height) of the contact pin 3aF occur due to the bending operation, the length is made uniform by the polishing operation. In this way, the planarity of the front end portion of the contact pin 3aF is promoted and the contact resistance can be reduced.

Figure 37:
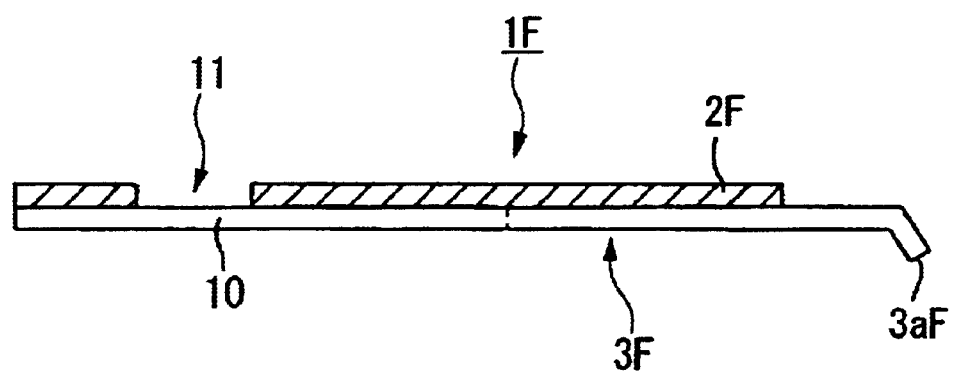
FIG. 37 is a sectional view showing the eleventh embodiment of the contact probe according to the present invention.
Figure 38:
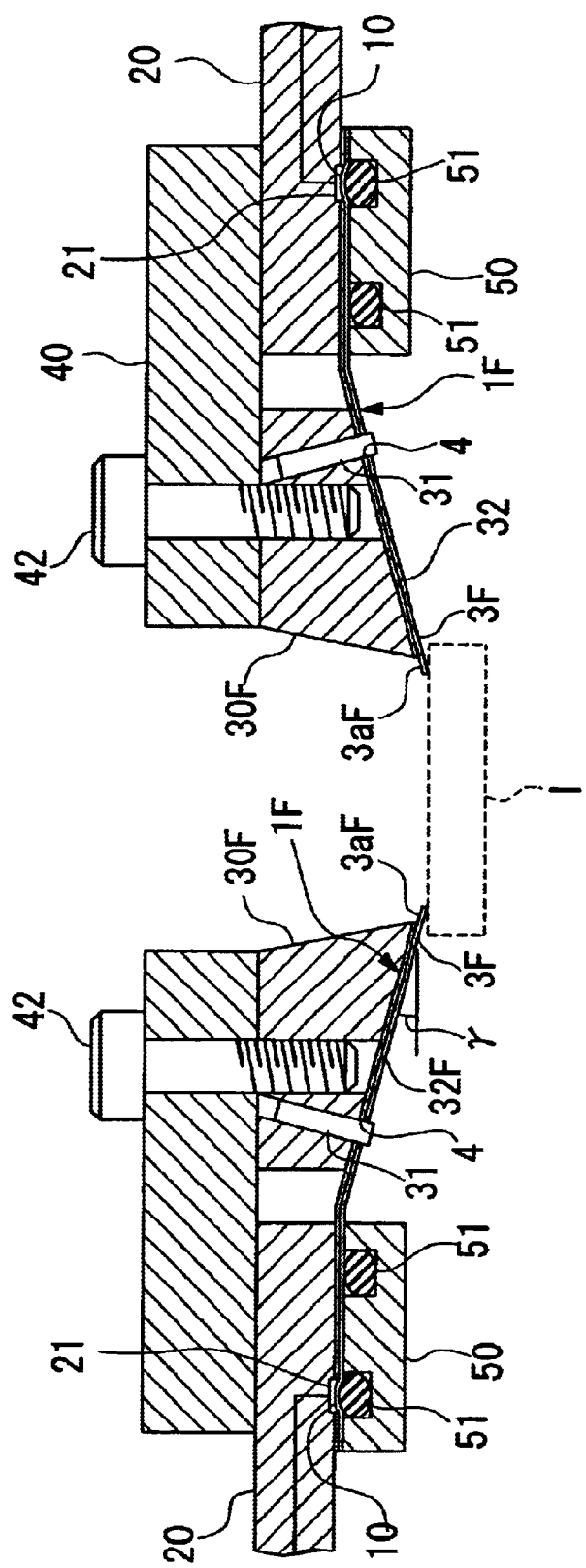
FIG. 38 is a sectional view of a probe device integrated with the eleventh embodiment of the contact probe according to the present invention.

FIG. 37 is a sectional view of the contact probe 1F. Furthermore, similar to the third embodiment, the contact probe 1F is integrated with mechanical parts so as to form a probe device (probe card), as shown in FIG. 38. In FIG. 38, a lower face 32F of a mounting base 30F is gradually inclined downward toward the front end side with an angle γ in a range of 0° to 30° with respect to the contact face Pa. The front end side of the resin film 2F is brought into contact with the lower face 32F of the mounting base 30F. The lower face 32F of the mounting base 30F is inclined downward and supports the front end side of the resin film 2F so that the contact pin 3aF is brought into contact with an IC chip I. According to the probe device of the present embodiment, the angle of inclination γ of the lower face 32F supporting the front end side of the resin film 2F, is set to be equal to the angle β. Therefore, with respect to the base end portion of the contact pin 3aF projecting from the front end of the resin film 2F along the resin film 2F, the angle with respect to the contact face Pa can be stably maintained to a value of β (i.e., equal to γ). Thereby, in the scrubbing operation the angles α and β can be set to the predetermined values by moving the probe device vertically downward so as to contact the face Pa.

Figure 39:
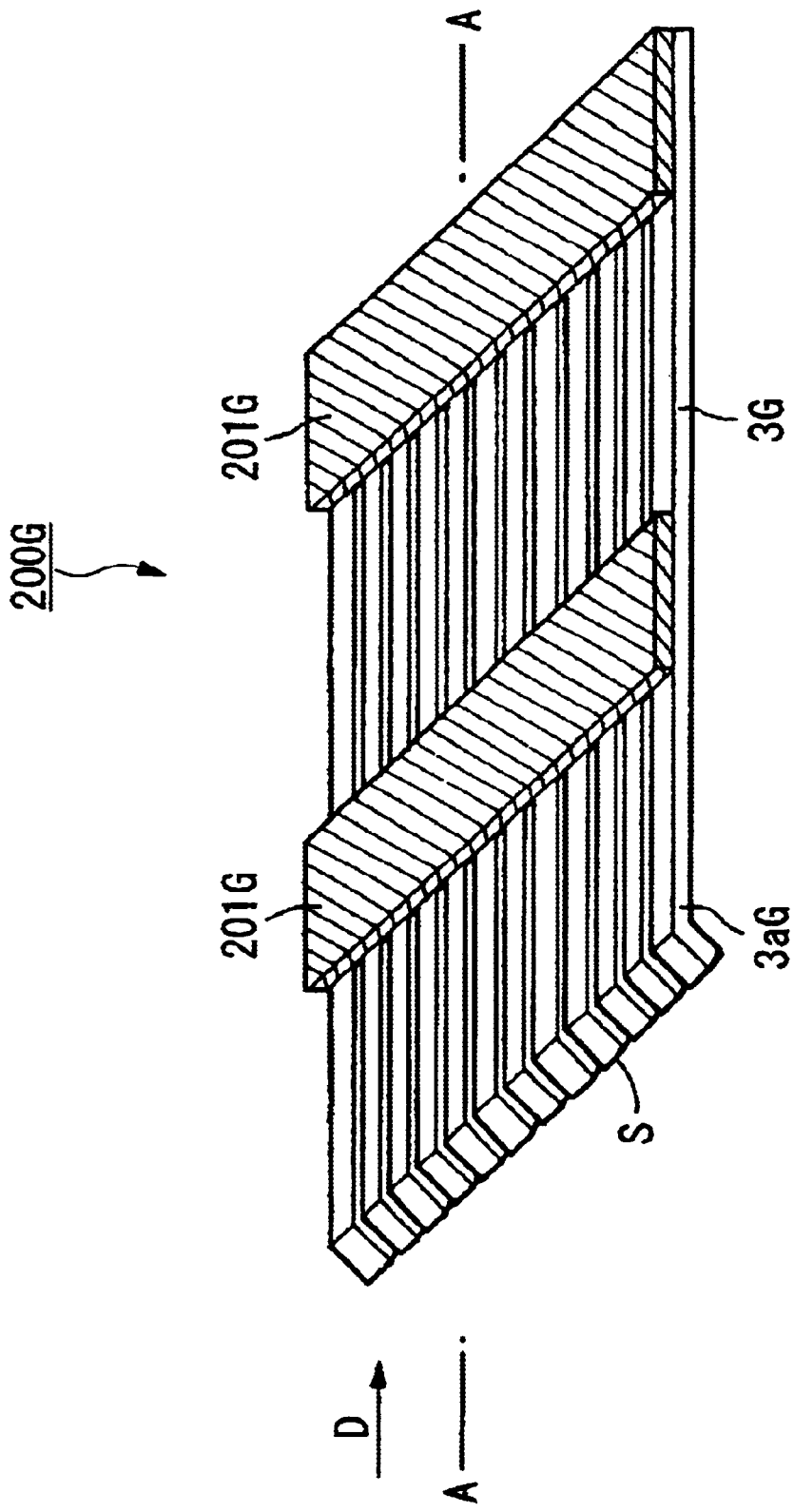
FIG. 39 is a perspective view showing a contact probe in a twelfth embodiment of a probe device according to the present invention.
Figure 40:
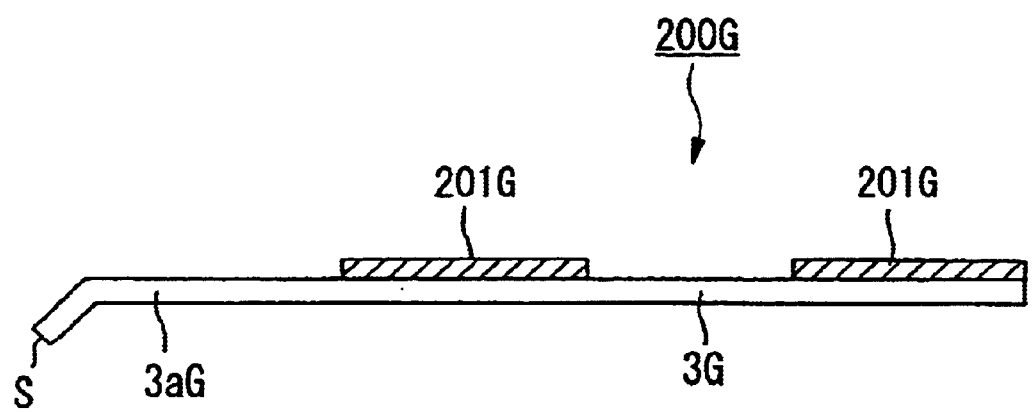
FIG. 40 is a sectional view taken along a line A—A of FIG. 39.

A twelfth embodiment will now be described with reference to FIGS. 39 and 40. According to the present embodiment, the contact probe 1F is cut in a predetermined shape so as to form an LCD probe. This embodiment is the same as in eleventh embodiment, except that the contact probe 1F is cut in the shape of an LCD probe instead of an IC probe. In FIGS. 39 and 40, the LCD contact probe is designated by notation 200G and the resin film is designated by notation 201G. The contact probe 200G is integrated into an LCD probe device in a similar way as in the fourth embodiment. In addition, in the LCD probe device of the present embodiment, the contact pins 3aG are bent at a middle position so that advantages similar to those of the eleventh embodiment are achieved.

Figure 41:
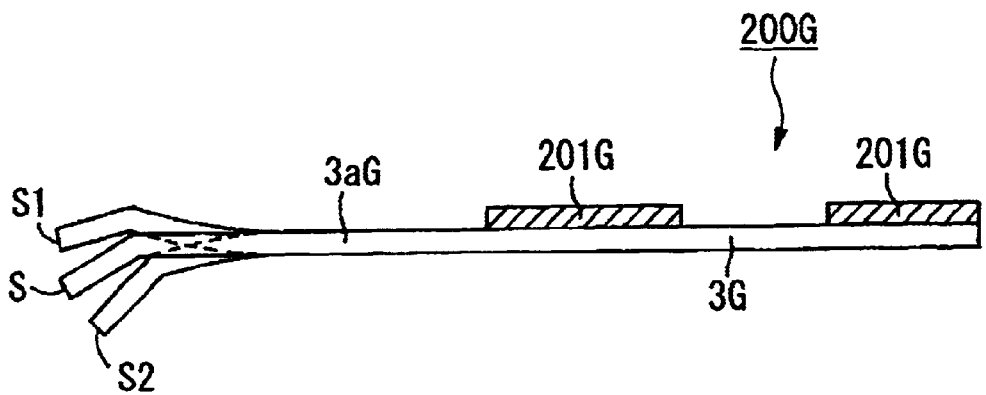
FIG. 41 is a side view showing a conventional drawback of a contact probe with respect to a thirteenth embodiment of a probe device according to the present invention.
Figure 42:
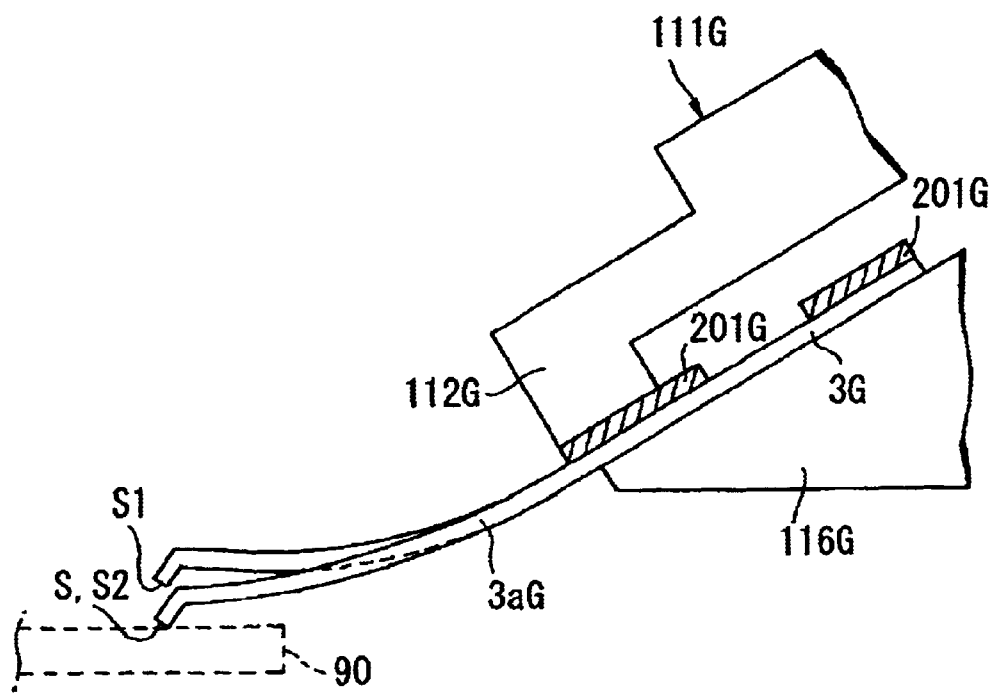
FIG. 42 is a side view showing the conventional drawback of the contact probe in relation to the thirteenth embodiment of the contact probe according to the present invention.

A thirteenth embodiment will now be described with reference to FIGS. 41–43. In FIG. 41, the contact pins 3aG of the contact probe 200G have a front portion that may be bent upward (S1), bent downward (S2) or be in a normal position (S). As shown in FIG. 42, the contact pins 3aG are pressed against the terminals of the LCD 90 via the resin film 201G, the first projection 112G, and the inclined plate 116G. When the probe pins 3aG are bent in the S and S2 positions, the probe pins 3aG contact the terminals of the LCD 90. However, when the probe pins 3aG are bent in the S1 position a sufficient contact pressure may not be obtained. Accordingly, contact failure of the contact pins 3aG against the terminals of the LCD 90 occurs and an accurate electric testing cannot be performed. Furthermore, although the amount of contact pressure exerted by the contact pin 3aG can be increased or decreased to obtain a desired contact pressure during testing, the amount of contact pressure is limited due to the shape of the contact pins 3aG.

Figure 43:
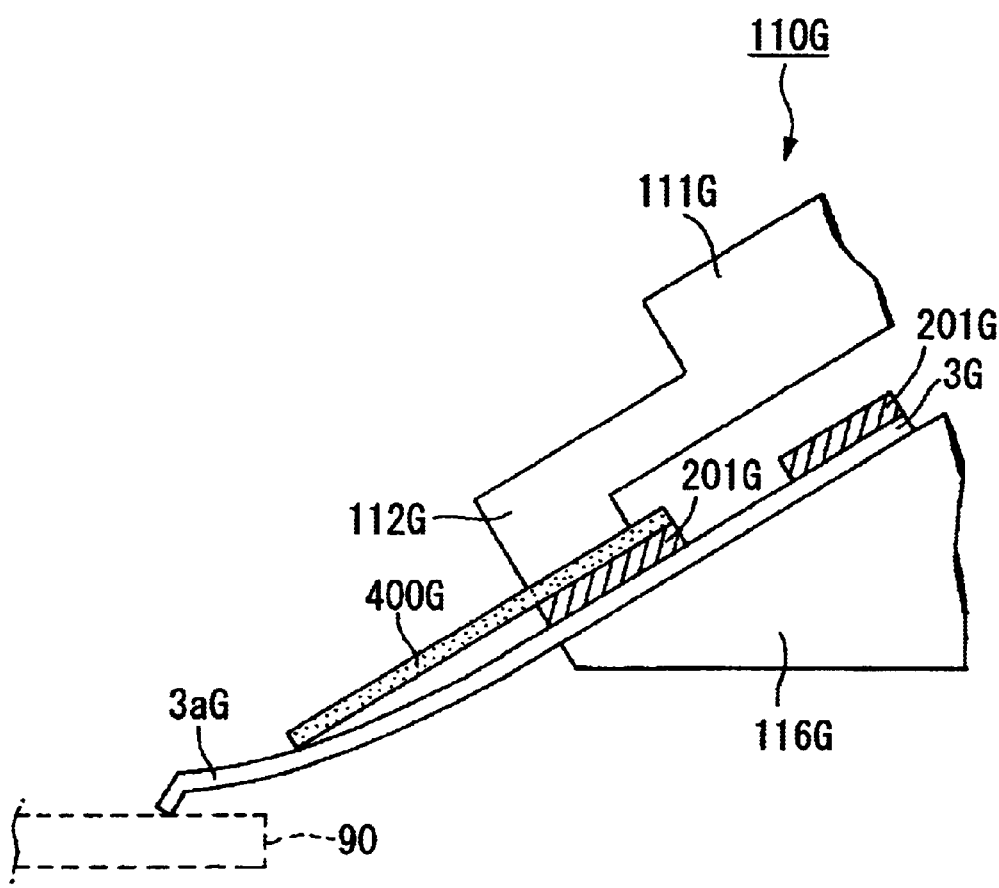
FIG. 43 is a side view showing the probe device in the thirteenth embodiment of the probe device according to the present invention.

In FIG. 43, the thirteenth embodiment adopts a contact probe pinching body (support member) 110G including a highly elastic film 400G, such as an organic or inorganic material, which overlaps the resin film 201G and presses against front end portions of the contact pins 3aE. The elastic film 400E is sandwiched between the first projection 112G of the top clamp 111G and the resin film 201G. The elastic film 400G overlaps the resin film 201G and projects over the front end portions of the contact pins 3aG, in order to press the front end portions of the contact pins 3aG against the terminals of the LCD 90 when the front end portions of the contact pins 3aG are bent in the S, S1 and S2 positions (FIG. 41). It is preferable that the highly elastic film 400G comprises ceramics or polyethylene terephthalate if it is an organic material and comprises ceramics, particularly alumina film if it is an inorganic material. Furthermore, when the contact pins 3aG are pressed against the terminals of the LCD 90, the highly elastic film 400G presses from above the contact pins 3aG and even with respect to position SI allows for a firm contact between the terminal of the LCD 90 and the contact pins 3aG. Thereby, a uniform contact pressure can be obtained at the front ends of the respective contact pins 3aG according to the thirteenth embodiment of the present invention. Moreover, the front ends of the contact pins 3aG can be firmly brought into contact with the terminals of the LCD 90 and accordingly, measurement failure due to contact failure can be eliminated. In addition, the contact pressure on the contact pins 3aG can be adjusted by changing how far the elastic film 400G projects over the contact pins 3aG.

According to the LCD probe device of the thirteenth embodiment, the highly elastic film 400G is provided so as to exert constant pressure on the contact pins 3aG. Even in a case where several contact pins 3aG are bent in the S1 position, the highly elastic film 400G ensures that a uniform contact pressure is obtained for all of the contact pins 3aG resulting in alignment of all the contact pin 3aG positions with the angles of the contact pins 3aG with respect to the terminals maintained to a desired value. Furthermore, according to a conventional probe device, excessive contact pressures is required to be applied to the contact pins 3aG in order to bring the contact pins 3aG, including bent pins, in contact with the terminals which may damage the pad matrix P of a device under test. However, according to the probe device of the present embodiment, the uniform contact pressure is provided and the above discussed problems do not occur.

Figure 44:
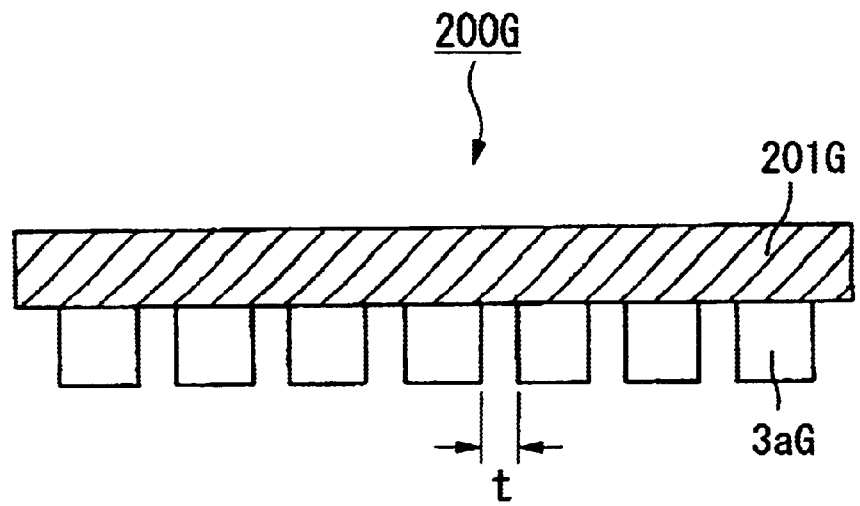
FIG. 44 is a view in direction D of FIG. 39 in relation to a fourteenth embodiment of a contact probe according to the present invention.
Figure 45:
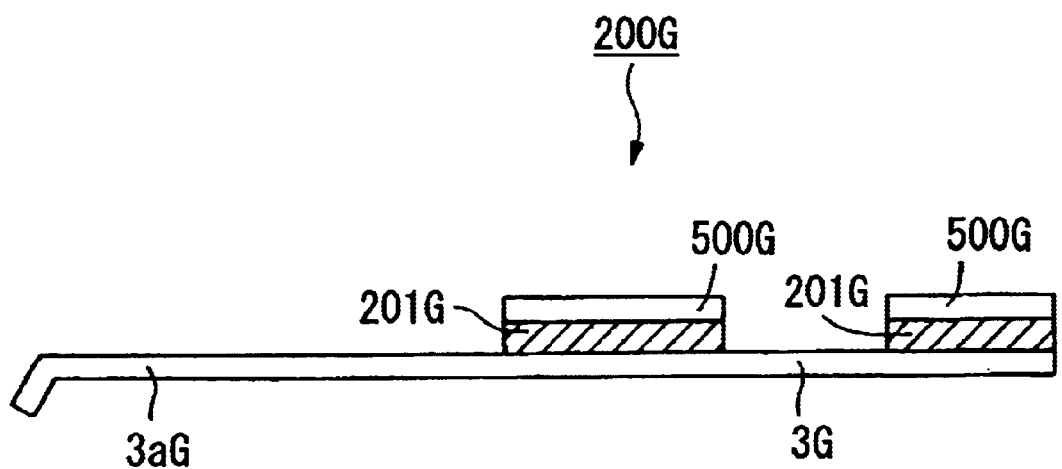
FIG. 45 is a side view showing the contact probe in the fourteenth embodiment of the contact probe according to the present invention.

A fourteenth embodiment of the present invention will now be described with reference to FIGS. 44 and 45. In FIG. 44, the resin film 201G of the contact probe 200G which has been explained with reference to the fourth embodiment, is made of, for example, polyimide resin. With this construction an elongation may occur due to absorbed moisture causing an interval t between the contact pins 3aG to change. This results in the contact pins 3aG not making good contact with predetermined positions of the terminals of the LCD 90 and accordingly accurate electric test cannot be performed. Hence, according to the fourteenth embodiment, as shown in FIG. 45, a metal film 500G is provided on top of the resin film 201G (e.g., by pasting) and the change in the interval t between the contact pins 3aG is decreased even during a change in humidity. In this way, the contact pins 3aG are firmly brought into contact with predetermined positions of the terminals of the LCD 90. Accordingly, positional shift of the respective contact pins 3aG does not typically occur even with a change in humidity and the front end portions of the contact pins 3aG are brought into contact with the terminals of the LCD 90 with fine precision. Therefore, damage caused by misalignment of the contact pins 3aG made of a Ni—Mn alloy having high hardness can be avoided. In addition, it is preferable that the metal film 500G is made of a material, such as Ni, a Ni alloy, Cu, or a Cu alloy.

According to the LCD probe device in the fourteenth embodiment, the metal film 500G is directly attached on the resin film 201G and therefore, the elongation of the resin film 201G is restrained by the metal film 500G. That is, a deviation in the interval t between the contact pins 3aG does not typically occur and the contact pins 3aG are brought into contact with the terminals accurately and with fine precision. Accordingly, the scrubbing operation can be accurately performed since the contact pins 3aG are precisely located on the pads P and the angles α and β at the front end portion and the base end portion of the contact pin 3aG with respect to the pad P will typically not deviate from a desired value. Furthermore, the metal film 500G can be used as a device ground whereby a design taking an impedance matching up to the vicinity of the front end of the contact probe can be performed and adverse influence caused by reflection noise can be prevented in performing a test at a high frequency region.

Figure 46:
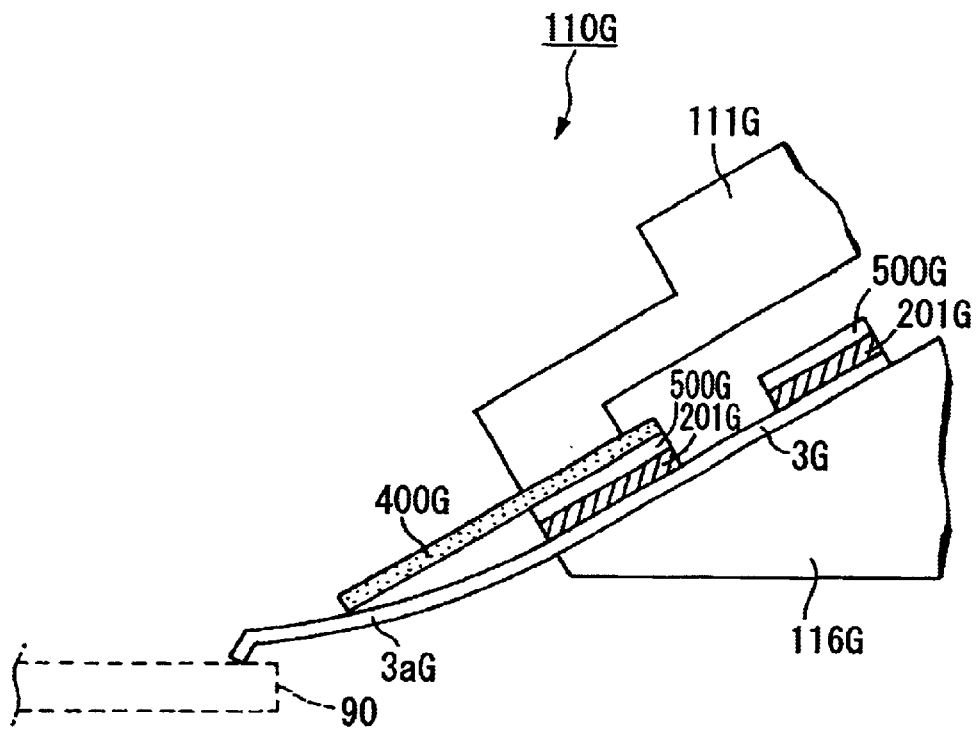
FIG. 46 is a side view showing a probe device in a fifteenth embodiment of a probe device according to the present invention.

A fifteenth embodiment will now be described with reference to FIG. 46. In this embodiment, in addition to a metal film 500G provided on the resin film 201G, a highly elastic film 400G similar to that of the twelfth embodiment is also provided. The elastic film 400G ensures that a uniform contact pressure is obtained irrespective of a bending state of the front ends of the contact pins 3aG. In this way, electrical testing can be performed accurately by minimizing the change in the interval t between the contact pins 3aG. The LCD probe device according to the fifteenth embodiment includes contact pins 3aG bent at a middle so that advantages similar to those of the eleventh, the thirteenth and the fourteenth embodiments are achieved.

Figure 47:
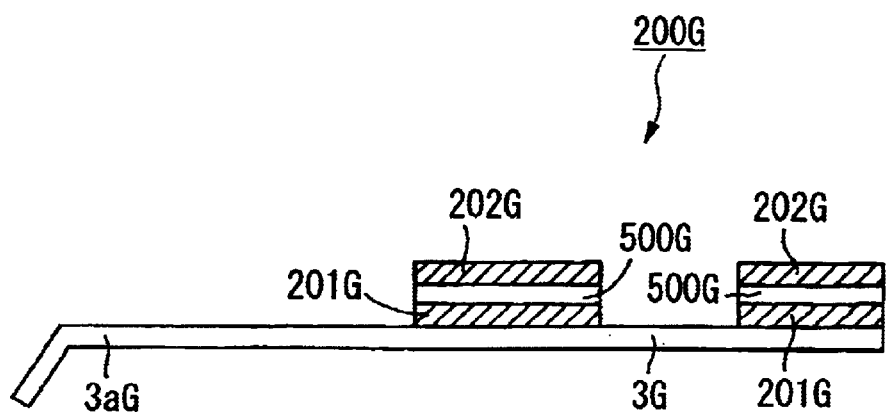
FIG. 47 is a side view showing a contact probe in a sixteenth embodiment of a probe device according to the present invention.
Figure 48:
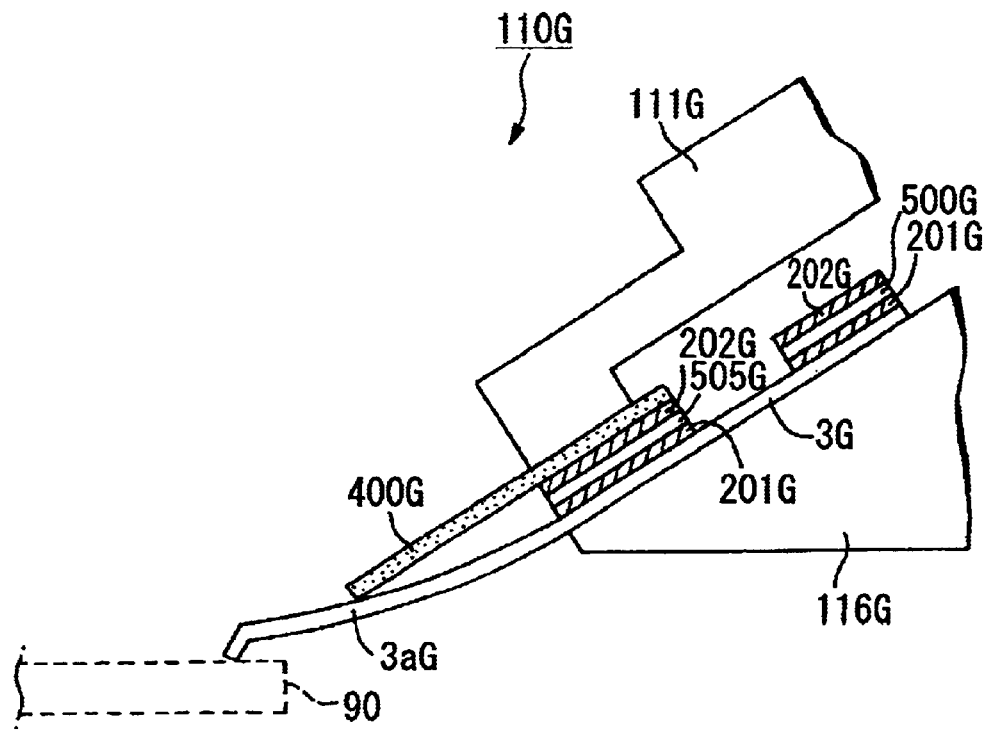
FIG. 48 is a side view showing the probe device in the sixteenth embodiment of the probe device according to the present invention.

A sixteenth embodiment will now be described with reference to FIGS. 47 and 48. As shown in FIG. 47, this embodiment includes a second resin film 202G provided on the metal film 500G attached on the resin film 201G. As shown in FIG. 48, the highly elastic film 400G is provided on the second resin film 202G (e.g., by lamination). Here, different from the fifteenth embodiment, the second resin film 202G is installed to prevent short-circuiting between the terminals of the TABIC 300G arranged above a rear end portion of the metal film 500G (not shown) and the metal film 500G. Furthermore, if only the metal film 500G attached on the resin film 201G is provided, oxidation of the metal film 500G exposed to the atmosphere occurs. Therefore, oxidation is prevented by coating the metal film 500G with the second resin film 202G. Also with respect to the LCD probe device according to the sixteenth embodiment, the contact pins 3aG are bent at a middle position.

Figure 49:
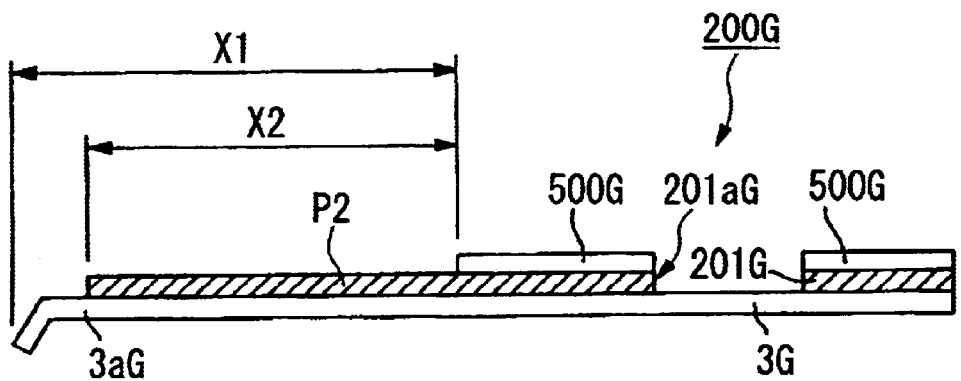
FIG. 49 is a side view showing a contact probe in a seventeenth embodiment of a probe device according to the present invention.
Figure 50:
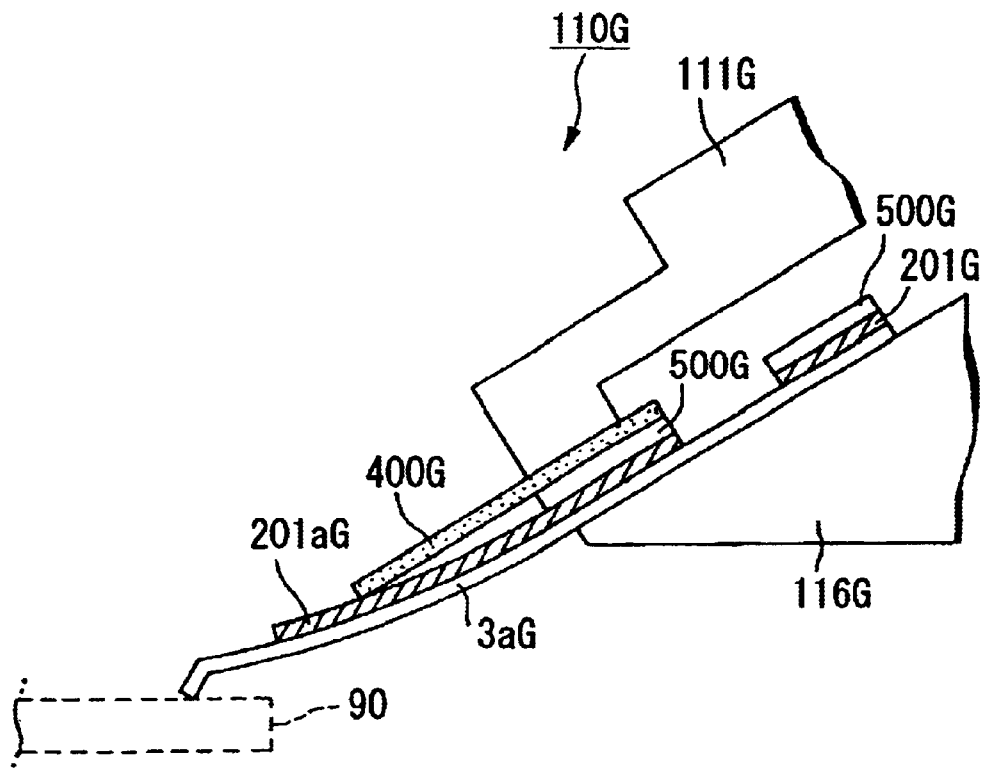
FIG. 50 is a side view showing the probe device in the seventeenth embodiment of the probe device according to the present invention.

A seventeenth embodiment will now be described with reference to FIG. 49 and 50. According to the thirteenth, the fifteenth and the sixteenth embodiments, the highly elastic film 400G is pressed against the contact pins 3aG. Thus, friction between the highly elastic film 400G and the contact pins 3aG due to repeated use causes a distortion in the contact pins 3aG resulting in shifted contact points. Therefore, according to the seventeenth embodiment, as shown in FIG. 49, a film 201aG is provided having a width wider than that in the conventional example, wherein X1>X2, where X1 designates a length of the contact pin 3aG projecting from the metal film 500G, and X2 designates a length of the wide resin film 201aG projecting from the metal film 500G. Furthermore, as shown in FIG. 50, when the high elastic film 400G projects a shorter distance than the wide resin film 201aG, the highly elastic film 400G is brought into contact with the soft and wide resin film 201aG. In this way, the elastic film 400G is not brought into direct contact with the contact pins 3aG and accordingly, the contact pins 3aG can be prevented from bending to the left and right direction. According to the LCD probe device of the seventeenth embodiment, the wide resin film 201aG is formed longer on the front end side than the highly elastic film 400G and serves as a buffer when the highly elastic film 400G presses the contact pins 3ag. Therefore, even with repeated use, the contact pins 3aG are not warped and bent by friction due to the highly elastic film 400G and stable contact can be maintained with respect to the terminals of the LCD 90. In addition, when the contact pin 3aG of the probe device is bent at its middle position, not only the contact pressure of the contact pin 3aG is made uniform by the wide film 201aG but the pad matrix P is not impaired and the scrubbing distance is not increased more than necessary.

Figure 51:
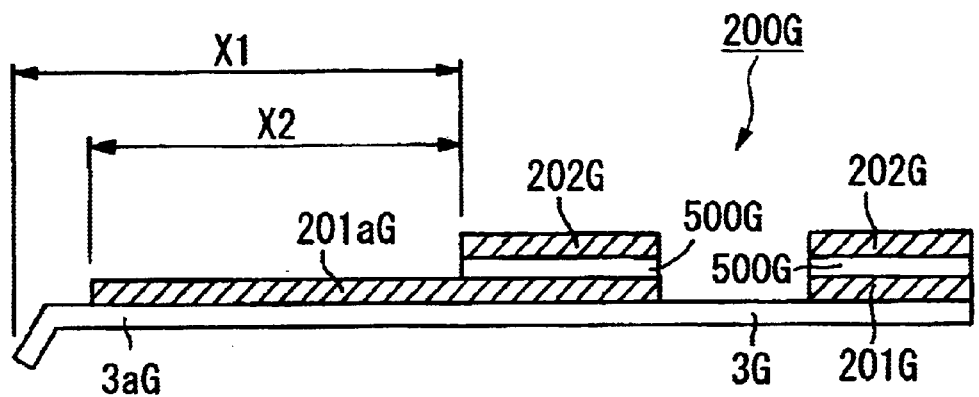
FIG. 51 is a side view showing a contact probe in an eighteenth embodiment of a probe device according to the present invention.
Figure 52:
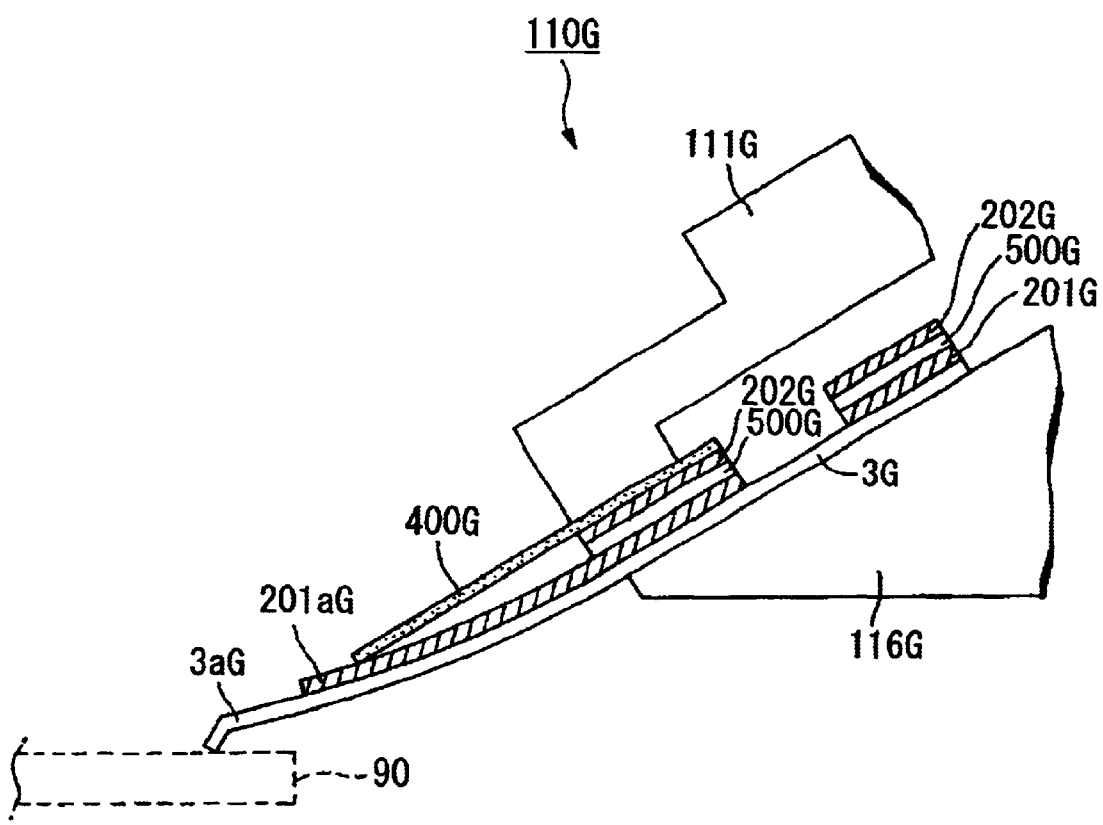
FIG. 52 is a side view showing the probe device in the eighteenth embodiment of the probe device according to the present invention.

An eighteenth embodiment will now be described with reference to FIGS. 51 and 52. According to this embodiment, the second resin film 202G is provided on the metal film 500G with X1>X2, where X1 designates a length of the contact pins 3aG projecting from the metal film 500G, and X2 designates a length of the wide resin film 201aG projecting from the metal film 500G. A shown in FIG. 52, the highly elastic film 400G is provided on the second resin film 202G (e.g., by lamination) such that the highly elastic film 400G projects a shorter distance than the wide resin film 201aG. Even with the LCD probe device of the eighteenth embodiment having contact pins 3aG with bent middle portions, the above-described advantages are achieved.

Figure 53:
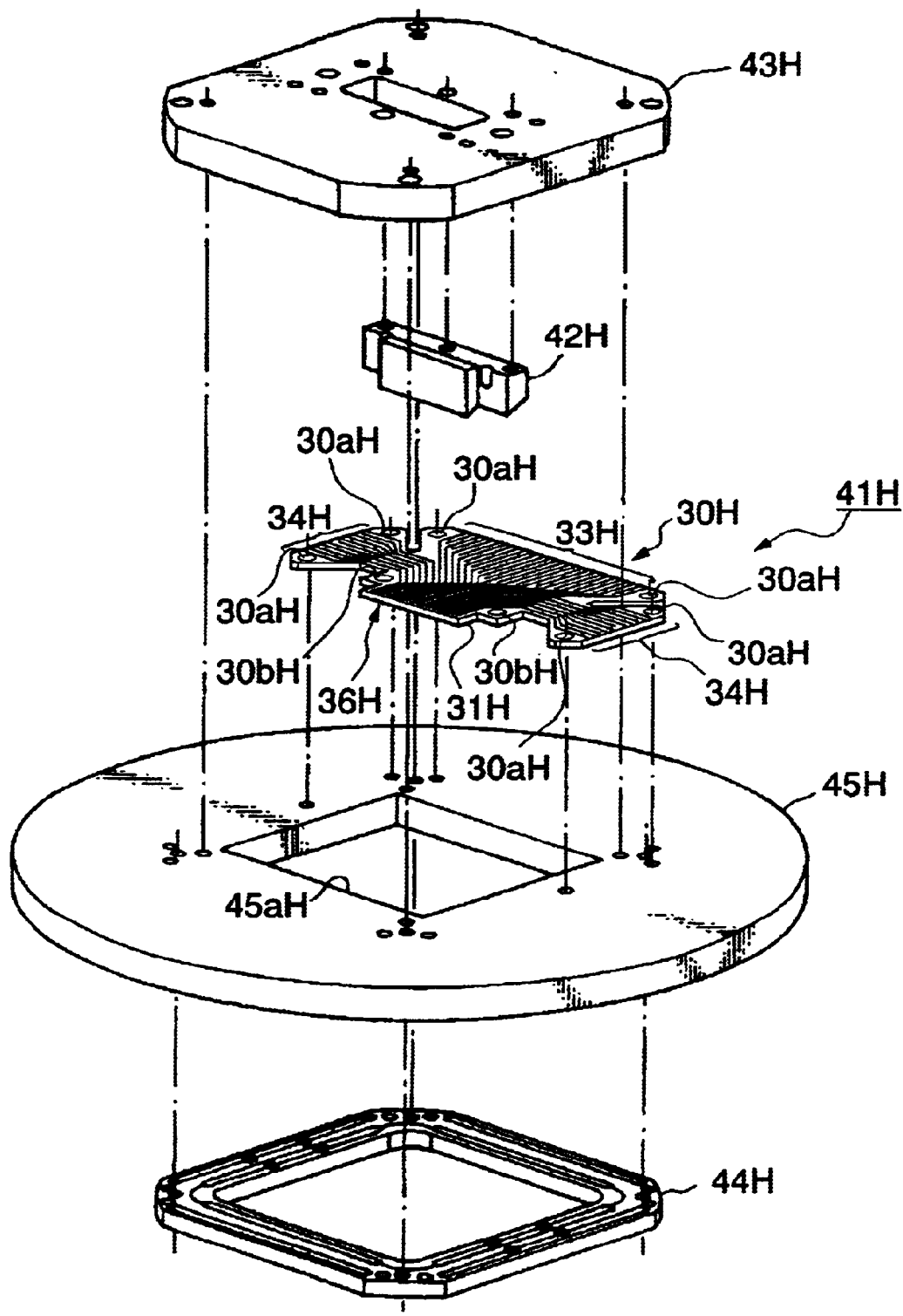
FIG. 53 is an exploded perspective view showing a probe device integrated with a nineteenth embodiment of a contact probe according to the present invention.
Figure 54:
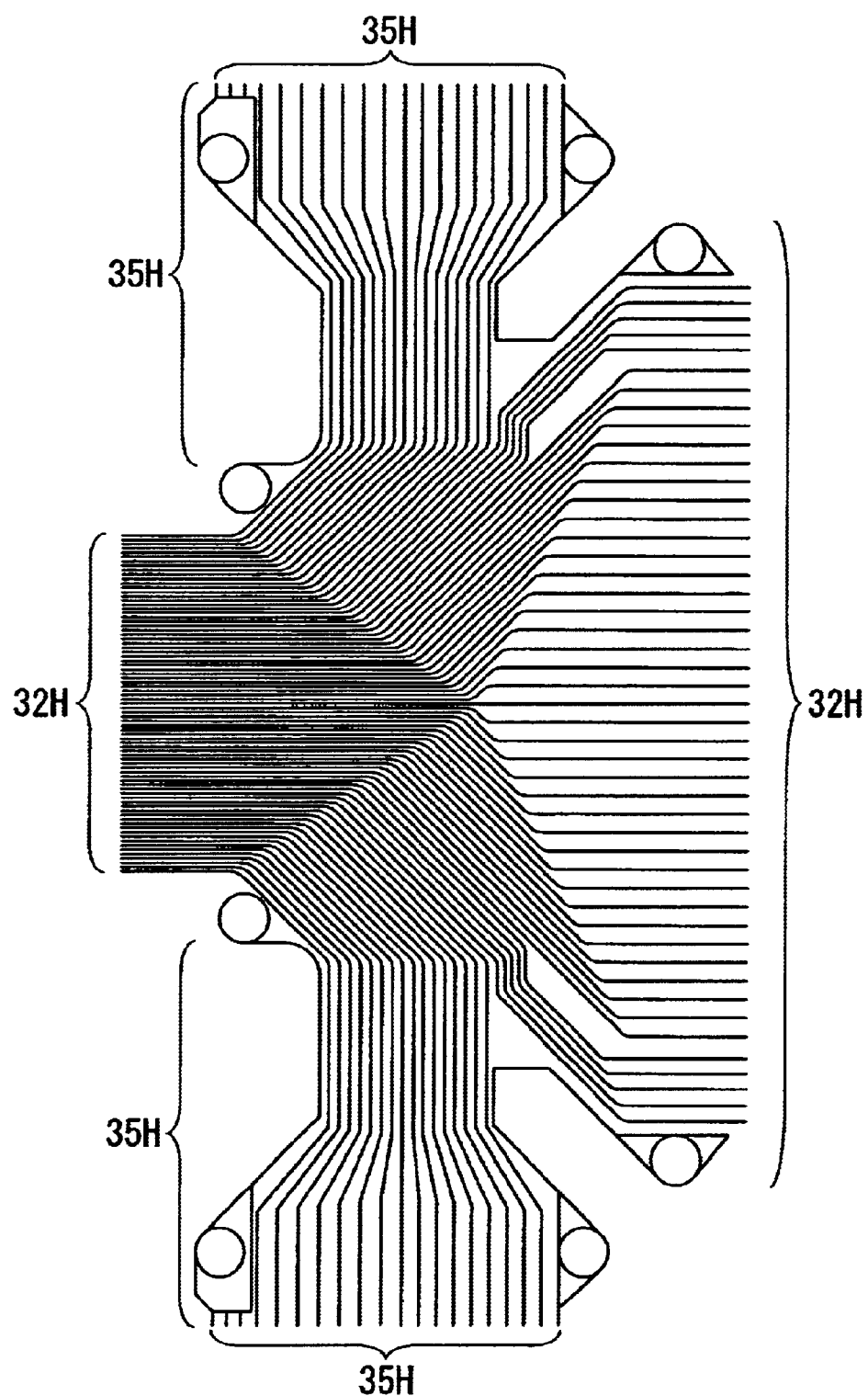
FIG. 54 is a plane view showing connection between main pattern wiring and branch wiring patterns in the nineteenth embodiment of the contact probe according to the present invention.

A nineteenth embodiment will now be described with reference to FIGS. 53 and 54. In FIGS. 53 and 54, notation 30H designates a contact probe, notation 31H designates a resin film, notation 32H designates main wiring patterns, notation 33H designates a contact probe main body, notation 34H designates a contact probe branch portion, notation 35H designates branch wiring patterns, and notation 36H designates contact pins. According to the contact probe 30H of the nineteenth embodiment, electrical measurements are conducted by bringing the contact probe 30H in contact with electrodes of an IC chip having a rectangular shape on a wafer. As shown in FIGS. 53 and 54, the contact probe 30H comprises the contact probe main body 33H wherein a plurality of main wiring patterns 32H made of Ni or a Ni alloy are pasted on one face of a polyimide resin film 31H. The contact probe branch portions 34H are integrally formed with the contact probe main body 33H by being branched to left and right from an intermediary portion of the contact probe main body 33H. Furthermore, the contact probe branch portions 34H are provided with the branch wiring patterns 35H formed by dividing portions of the main wiring patterns 32H to the left and right (e.g., left and right side portions). In addition, the front end portions of the main wiring patterns 32H are provided with the contact pins 36H projecting from an end portion of the resin film 31H. The surfaces of the contact pins 36H are coated with Au (gold) to prevent oxidation With respect to the fabrication steps of the contact probe 30H, the base metal layer forming step, the pattern forming step, the electrolytic plating step, the film pasting step, the separating step, and the gold coating step are the same as those in the first embodiment.

A probe device (probe card) 41H integrating the contact probe 30H corresponding to an IC chip to be measured (object of measurement) will now be described with reference to FIG. 53. According to the contact probe 30H of the present invention, the main wiring patterns 32H and the branch wiring patterns 35H are formed on the thin resin film 31H. Therefore, the total assembly is soft and flexible and is easy to integrate into a probe device, etc. As shown in FIG. 53, the mechanical parts comprise a mounting base (support member) 42H, a top clamp 43H, and a bottom clamp 44H. The contact probe 30H is arranged in a central window (rectangular opening) 45aH formed on a printed wiring board 45H. The top clamp 43H is attached to the mounting base 42H by bolts (not shown) and is fixed onto the printed wiring board 45H so that end portions of the contact probe 30H are pinched. The bottom clamp 44H is next attached to the lower side of the printed wiring board 45H via bolts. Furthermore, the contact probe main body 33H and the contact probe branch portions 34H of the contact probe 30H are positioned by bolts (not shown) screwed onto the printed wiring board 45H and passing through the top clamp 43H and positioning holes 30bH of the contact probe 30H. In addition, the contact pins 36H of the contact probe 30H are positioned by pins (not shown) attached to the mounting base 42H and which pass through the two front end positioning holes 30bH that are formed at the vicinity of the contact pins 36H.

The contact probe main body 33H is arranged with a rear end portion at the side of the printed wiring board 45H opposed to the contact pins 36H. The two contact probe branch portions 34H are respectively arranged with rear end portions thereof at sides on the both sides of the side where the contact probe main body 33H is arranged. The main wiring patterns 32H and the branch wiring patterns 35H are connected so as to be brought in contact with wiring patterns on the side of the printed wiring board (not shown) which are formed on the respective sides of the printed wiring board 45H. The lower face of the mounting base 42H is inclined so that the contact pins 36H are kept in a constant inclined state. The mounting base 42H presses against the contact probe 30H such that the contact pins 36H contact against the IC chip. According to the above-described probe device 41H, the respective front end portions of the contact probes 30H are in a constant inclined state due to the mounting base 42H so that the contact pins 36H are brought into contact with electrodes on one side of the IC chip at a predetermined angle.

When a probe test of the IC chip is performed using the above-described probe device 41H, the probe device 41H is inserted and attached to a prober (not shown) and is electrically connected to a tester (not shown) whereby predetermined electric signals (input signals) are sent to the main wiring patterns 32H and the branch wiring patterns 35H, respectively, via the wiring patterns on the side of the substrate at the respective sides of the printed wiring board 45H. Furthermore, input signals at the main wiring patterns 32H and the branch wiring patterns 35H are sent to the IC chip on a wafer from the contact pins 36H. Furthermore, output signals from the IC chip transmitted to the contact pins 36H, are transmitted to the main wiring patterns 32H, the branch wiring patterns 35H; and the wiring patterns on the side of the substrate arranged at the respective sides of the central window 45aH of the printed wiring board 45H. In this way, the output signals are transmitted to the tester via the wiring patterns on the side of the substrate by which the electric properties of the IC chip are measured.

The above-described contact probe 30H comprises the contact probe main body 33H including the main wiring patterns 32H, and the two contact probe branch portions 34H integrally formed therewith by being branched from the contact probe main body 33H. The contact probe branch portions 34H are provided with the two branch wiring patterns 35H formed by branching portions of the main wiring patterns 32H. In this way, it is possible to connect the branch wiring patterns 35H to locations other than those of the main wiring patterns 32H (e.g., to the two sides of the central window 45aH where the main wiring patterns 32H are not arranged). That is, even if the electrodes are concentrated on one side of the IC chip, the main wiring patterns 32H connected to that side of electrodes are branched to the branch wiring patterns 35H and dispersed to other locations. Furthermore, the contact probe main body 33H and the contact probe branch portions 34H are integrally formed. Therefore, the wiring can be formed with high dimensional accuracy so that a positional shift between the main wiring patterns 32H and the branch wiring patterns 35H does not occur.

Therefore, according to the probe device 41H integrated with the contact probe 30H, the contact probe main body 33H and the two contact probe branch portions 44H are distributed to the plurality of sides of the central window 45aH in the printed wiring board 45H. The main wiring patterns 32H and the two branch wiring patterns 35H can separately be connected to the wiring patterns on the side of the substrate at the three sides of the central window 45aH. Thus, even with an IC chip having a number of electrodes concentrated on one side, wiring do not have to be concentrated on one side of the central window 45aH and the connecting operation is facilitated by an arrangement space that is widened without decreasing the pitch of the wiring patterns (electrodes) on the side of the substrate.

Figure 55:
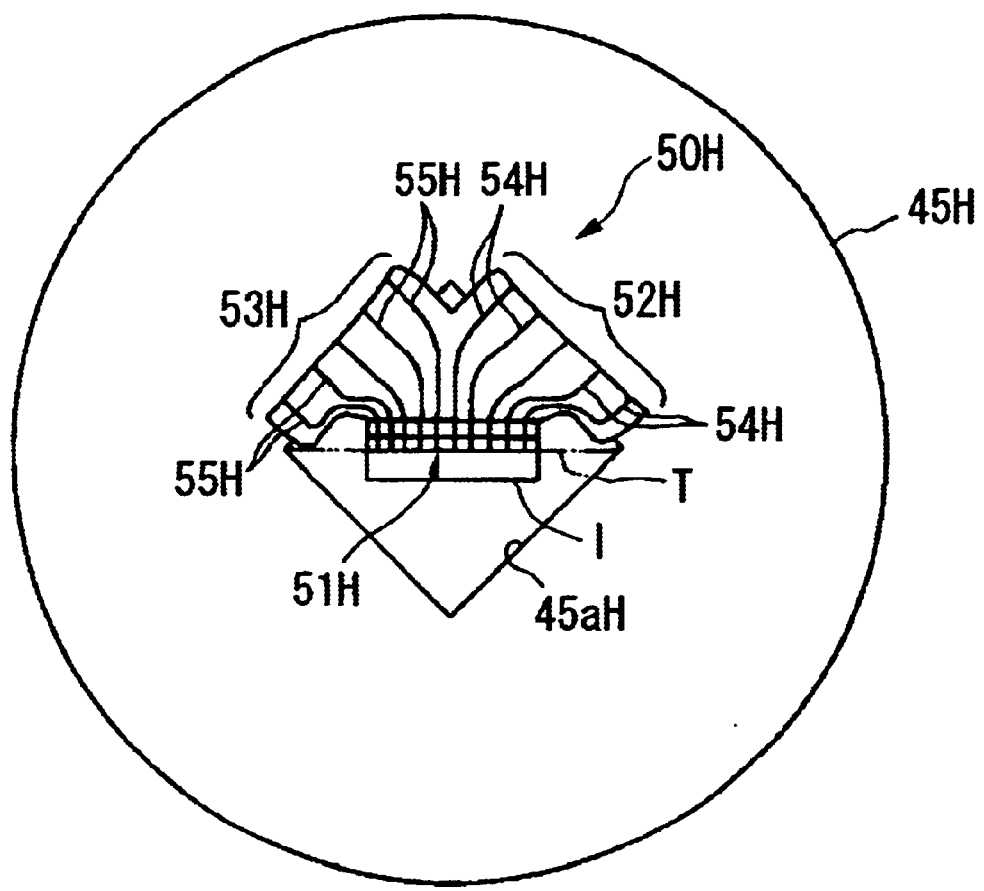
FIG. 55 is an outline plane view showing a probe device integrated with a twentieth embodiment of a contact probe according to the present invention.

A twentieth embodiment will now be described with reference to FIG. 55. In FIG. 55, notation 50H designates a contact probe, notation 51H designates contact pins, notation 52H designates a contact probe main body, and notation 53H designates a contact probe branch portion. Unlike the contact pins 36H arranged in parallel on opposed sides of the central window 45aH of the nineteenth embodiment, in the twentieth embodiment the contact pins 51H of the contact probe 50H are arranged in parallel with a diagonal line T of the central window 45aH. In addition, unlike the contact probe branch portions 34H formed on the left and right of the contact probe main body 33H and separately arranged on the three sides of the central window 45aH of the nineteenth embodiment, in the twentieth embodiment one contact probe branch portion 53H is formed by branching from one side of the contact probe main body 52H. Furthermore, the main wiring patterns 54H and the branch wiring patterns 55H are respectively arranged on two sides of the central window 45aH opposed to the diagonal lines T and are respectively connected so as to contact wiring patterns on a side of the substrate to which they are distributed. In other words, according to the probe device of the twentieth embodiment, the contact pins 51H of the contact probe 50H are aligned along the diagonal line T of the central window 45aH. Accordingly, an IC chip I having electrodes concentrated on one side, is arranged along the diagonal line T so that the contact pins 51H are brought into contact with the electrodes on that side. Furthermore, the contact probe main body 52H and the contact probe branch portion 53H are distributed to the left and right of the two sides of the central window 45aH. The main wiring patterns 54H and the branch wiring patterns 55H are separately connected to the wiring patterns on the side of the substrate at the respective two sides. Therefore, the wiring patterns connected to the electrodes concentrated on one side of the IC chip I, are distributed to the left and right. In this way, a large number of wiring can be arranged to be divide into the two sides without a need to concentrate all of the wiring on one side of the central window 45aH.

Figure 56:
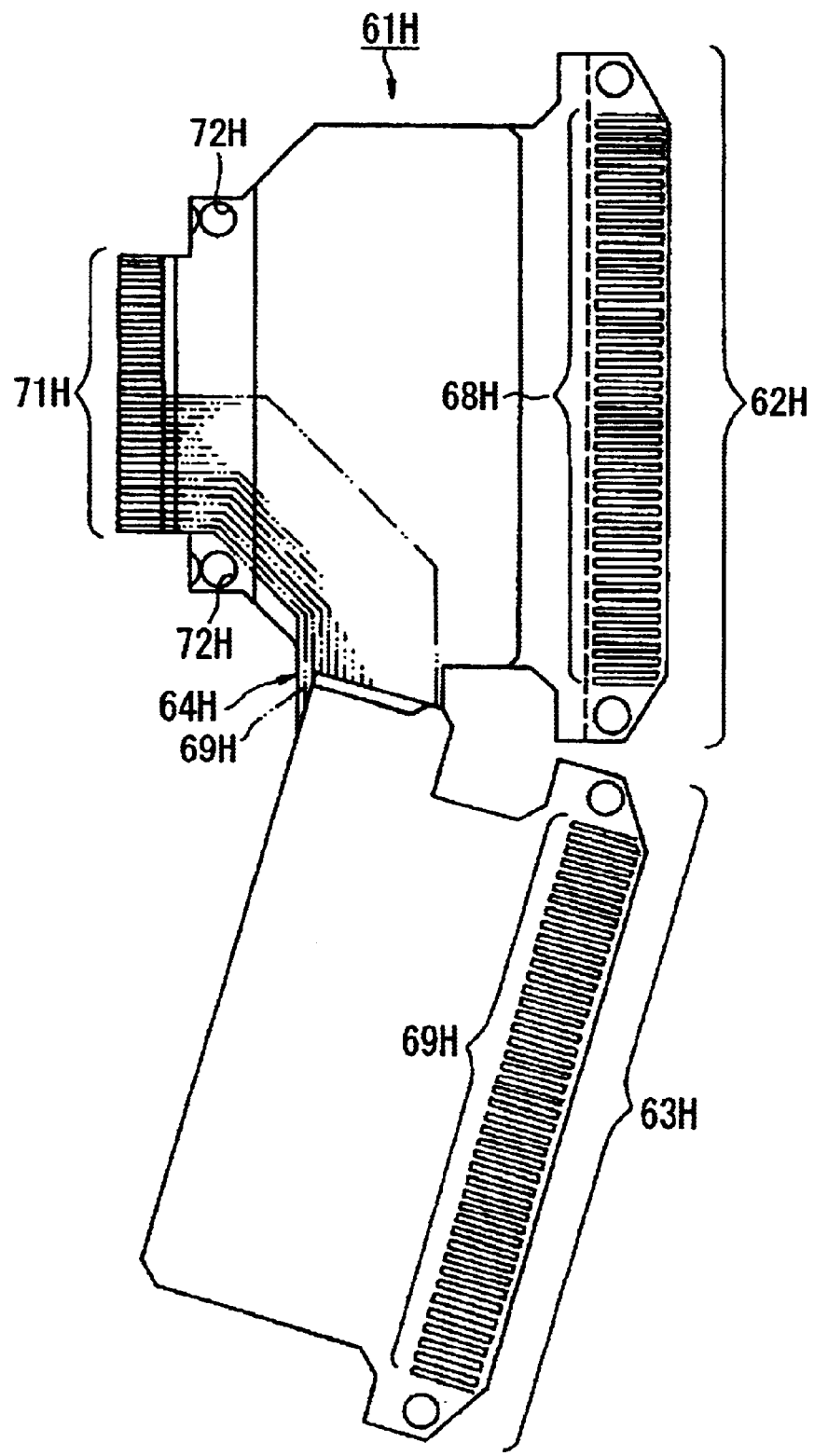
FIG. 56 is a plane view showing a twenty-first embodiment of a contact probe according to the present invention.
Figure 57:
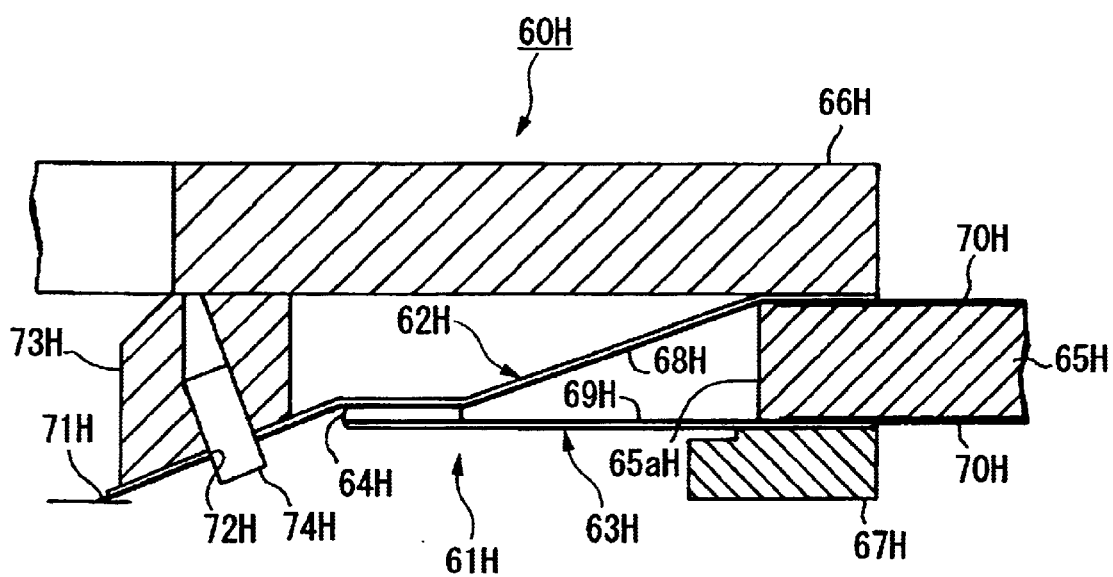
FIG. 57 is a sectional view of essential portions showing a probe device integrated with the twenty-first embodiment of the contact probe according to the present invention.

A twenty-first embodiment will now be described with reference to FIGS. 56 and 57. In FIGS. 56 and 57, notation 60H designates a probe device, notation 61H designates a contact probe, notation 62H designates a contact probe main body, notation 63H designates a contact probe branch portion and notation 64H designate a folding intermediate portion. Unlike the contact probe 50H divided into the contact probe main body 52H and the contact probe branch portion 53H symmetrically with respect to the left and right direction and centered on the contact pins 50H of the twentieth embodiment, in the twenty-first embodiment the contact probe branch portion 63H is branched from one side portion of the contact probe main body 62H via the folding intermediate portion 64H, as shown in FIG. 56. Furthermore, unlike the twentieth embodiment where the contact probe main body 52H and the contact probe branch portion 53H are respectively distributed to the two sides of the central window 45aH, in the probe device 60H of the twenty-first embodiment the contact probe main body 62H and the contact probe branch portion 63H of the contact probe 61H are folded at the folding intermediate portion 64H and respectively distributed above and below a central window 65aH of a printed wiring board (substrate for wiring) 65H, as shown in FIG. 57.

In other words, the rear end portion of the contact probe main body 62H and the rear end portion of the contact probe branch portion 63H are pinched respectively between a top clamp 66H and the printed wiring board 65H and between the printed wiring board 65H and a bottom clamp 67H. In this way, rear end portions of main wiring patterns 68H and 69H are brought into contact with and fixed to wiring patterns 70H on the front and back surfaces of the substrate 65H. In addition, front end positioning holes 72H are formed in the vicinity of contact pins 71H of the contact probe 61H. The contact pins 71H are positioned on a mounting base 73H attached to the lower face of the top clamp 66H by pins 74H that pass through the front end positioning holes 72H. The contact probe main body 62H and the contact probe branch portion 63H which are integrally formed on a film, are bent and folded at the intermediate folding portion 64H by which they are distributed to the surfaces of the front and back faces of the printed wiring board 65H. In this way, the main wiring patterns 68H and the branch wiring patterns 69H can be separately connected to the wiring patterns 70H on the front and back sides of the substrate of the printed wiring board 65H so that wiring is not concentrated on one face of the printed circuit board 65H and a connection is facilitated due to the doubled arrangement spacing of the wiring patterns 70H on the front and back sides of the substrate.

Figure 58:
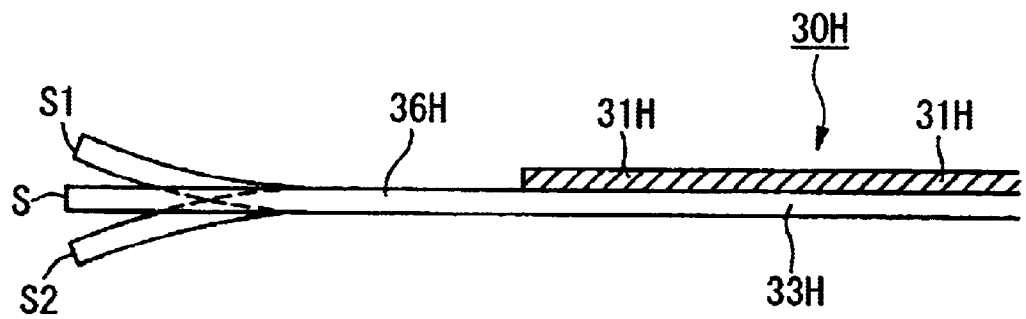
FIG. 58 is a sectional view showing a conventional drawback of a contact probe in relation to a twenty-second embodiment of the probe device according to the present invention.
Figure 59:
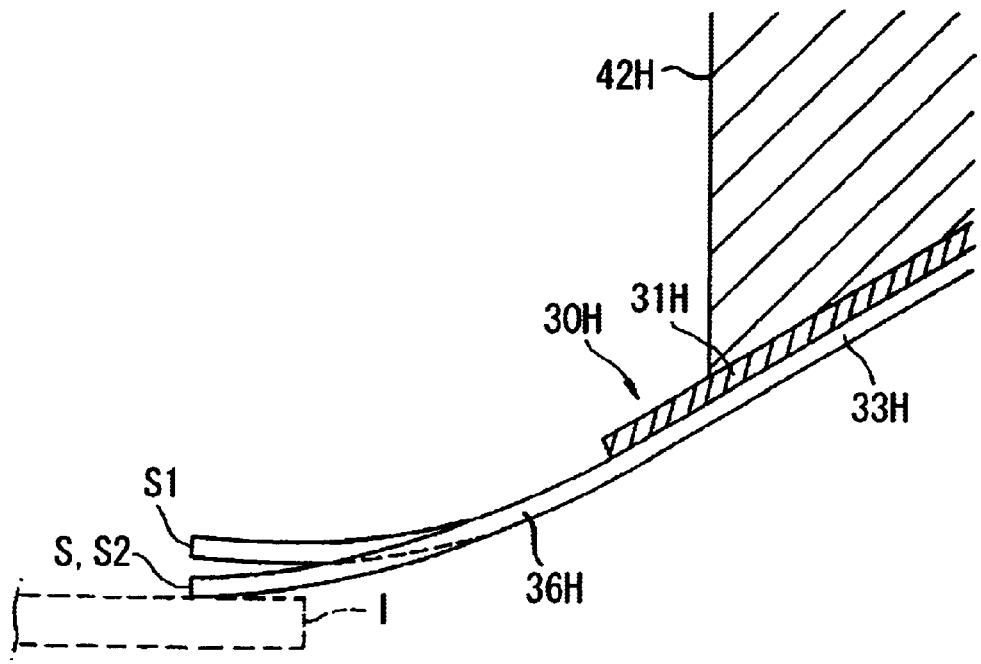
FIG. 59 is a sectional view showing the conventional drawback of the probe device in relation to the twenty-second embodiment of the probe device according to the present invention.
Figure 60:
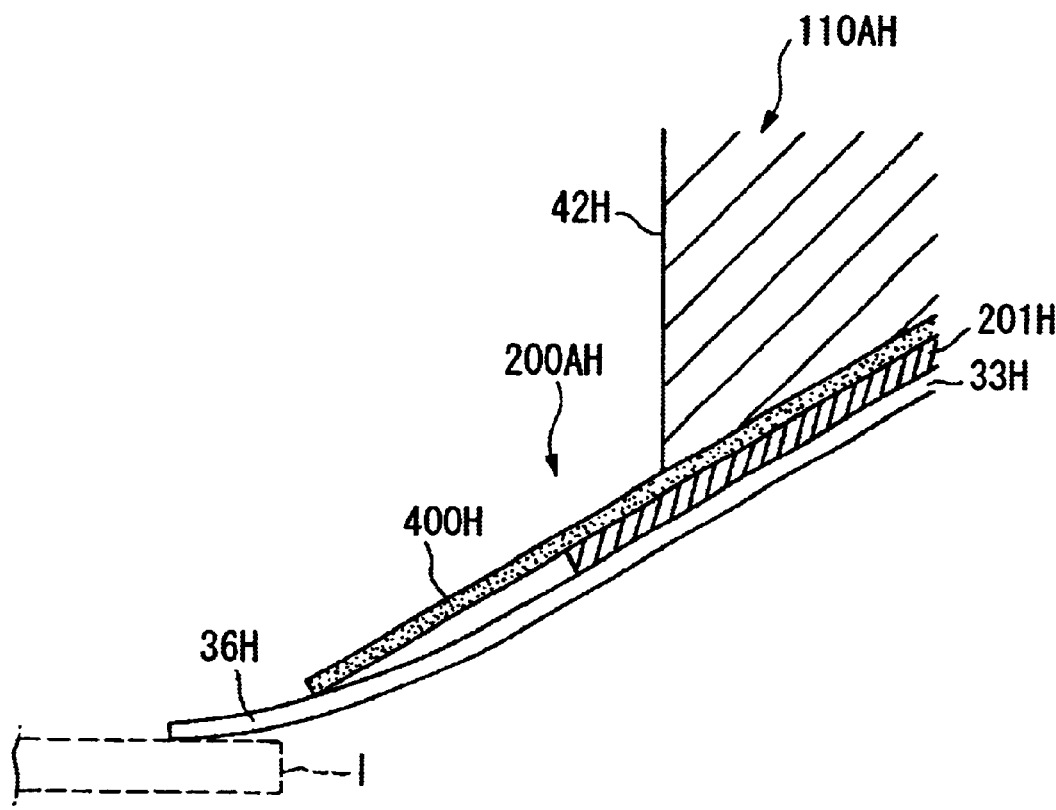
FIG. 60 is a sectional view showing the twenty-second embodiment of the probe device according to the present invention.

A twenty-second embodiment will now be described with reference to FIGS. 58–60. In FIG. 58, a front end portion of the contact pin 36H of the contact probe 30H, as explained in the nineteenth embodiment, may be bent in the S (normal), S1 (bent upward), S2 (bent downward) positions. In FIG. 59, although the resin film 31H arranged on the lower face of the mounting base 42H allows the contact pins 36H to press against terminals of an IC chip I in the S and S2 positions, in the S1 position, sufficient contact pressure may not be obtained. Therefore, contact failure of the contact pin 36H with the IC chip I may occur resulting in inaccurate electrical testing of the IC chip I. Accordingly, the probe device 110AH of the twenty-second embodiment includes a highly elastic film 400H comprising an organic or inorganic material, as shown in FIG. 60. The elastic film 400H aligns contact pins 36H bent in any one of the S, S1 and S2 positions so that they make positive contact with the terminals of the IC chip I. The highly elastic film 400H is provided on a resin film 201H (e.g., by lamination, adhesion, or a fixing means, etc.) of the contact probe 200AH. The elastic film 400H projects from the resin film 201H over the top portion of the contact pin 36H and is arranged on a lower face of the mounting base 42H. It is preferable that the highly elastic film 400H comprises ceramics or polyethylene terephthalate if it is an organic material and comprises ceramics, particularly alumina film if it is an inorganic material. Furthermore, when the contact pins 36H are pressed against the terminals of the IC chip I, the highly elastic film 400H presses from above the contact pins 36H and even with respect to position S1 allows for a firm contact between the terminal of the IC chip I and the contact pins 36H. Thereby, a uniform contact pressure can be obtained at the front ends of the respective contact pins 36H. Moreover, the front ends of the contact pins 3aG can be firmly brought into contact with the terminals of the IC chip I and accordingly, measurement failure due to contact failure can be eliminated. In addition, the contact pressure on the contact pins 36H can be adjusted by changing how far the elastic film 400H projects over the contact pins 36H.

Figure 61:
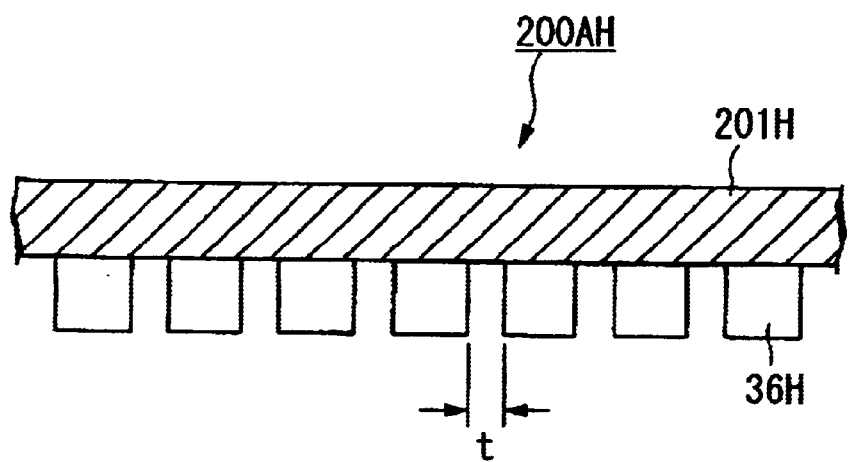
FIG. 61 is a sectional view in a direction orthogonal to contact pins in relation to a twenty-third embodiment of a contact probe according to the present invention.
Figure 62:
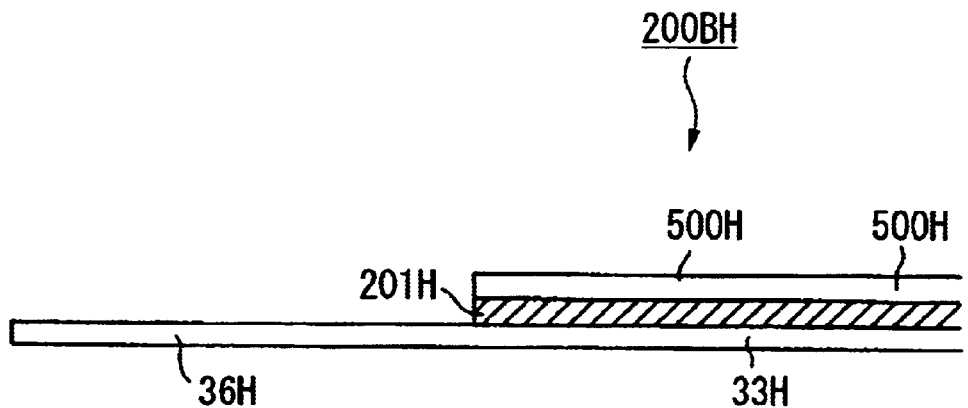
FIG. 62 is a sectional view showing the twenty-third embodiment of the contact probe according to the present invention.

A twenty-third embodiment of the present invention will now be described with reference to FIGS. 61 and 62. In FIG. 61, the resin film 201H of the contact probe 200AH which has been explained with reference to the twenty-second embodiment, is made of, for example, polyimide resin. With this construction an elongation may occur due to absorbed moisture causing an interval t between the contact pins 36H to change. This results in the contact pins 36H not making good contact with predetermined positions of the terminals of the IC chip I and accordingly accurate electrical testing cannot be performed. Hence, according to the twenty-third embodiment, as shown in FIG. 62, a metal film 500H is provided on top of the resin film 201H (e.g., by pasting) and the change in the interval t between the contact pins 36H is decreased even during a change in humidity. In this way, the contact pins 36H are firmly brought into contact with predetermined positions of the terminals of the IC chip I. Accordingly, positional shift of the respective contact pins 36H does not typically occur even with a change in humidity and the front end portions of the contact pins 36H are brought into contact with the terminals of the IC chip I with fine precision. Therefore, damage caused by misalignment of the contact pins 36H made of a Ni—Mn alloy having high hardness can be avoided. In addition, it is preferable that the metal film 500H is made of a material, such as Ni, a Ni alloy, Cu, or a Cu alloy.

Figure 63:
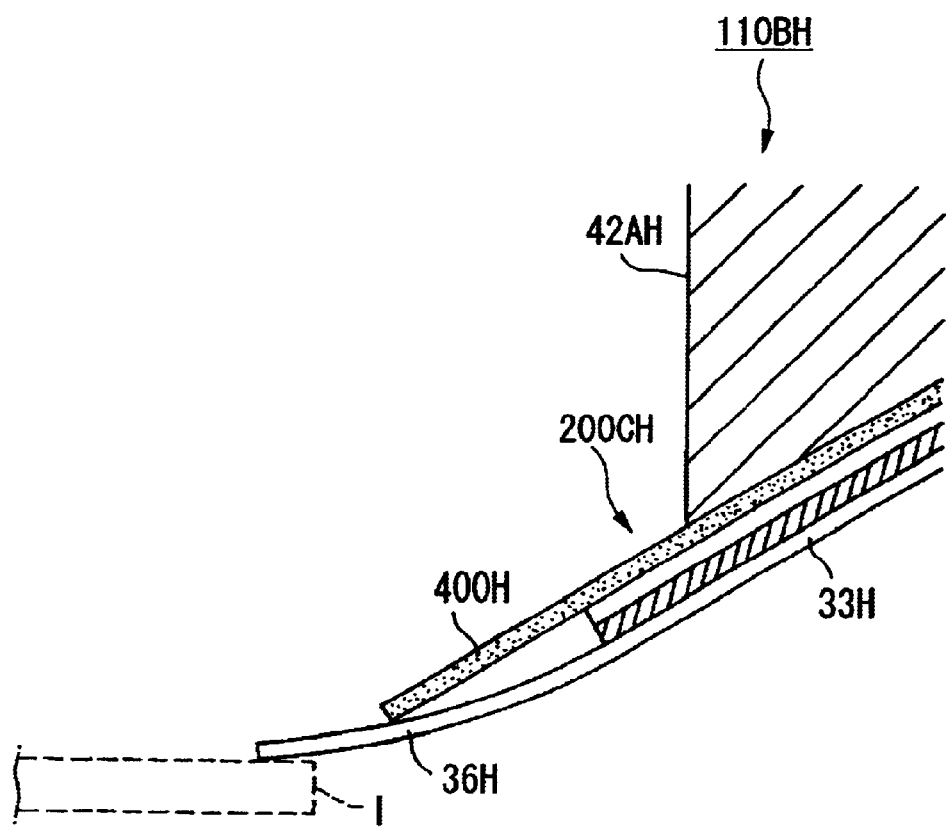
FIG. 63 is a sectional view showing a probe device according to a twenty-fourth embodiment of a probe device of the present invention.

A probe device 110BH according to a twenty-fourth embodiment will now be described with reference to FIG. 63. The contact probe 200CH includes elastic film 400H provided on the metal film 500H by adhesion or a fixing means (not shown) similar to the above-described twenty-second embodiment. In this way, a uniform contact pressure is obtained irrespective of bending state of the front end of the contact pin 36H and electrical testing can be accurately performed by minimizing a change in the interval t between the contact pins 36H.

Figure 64:
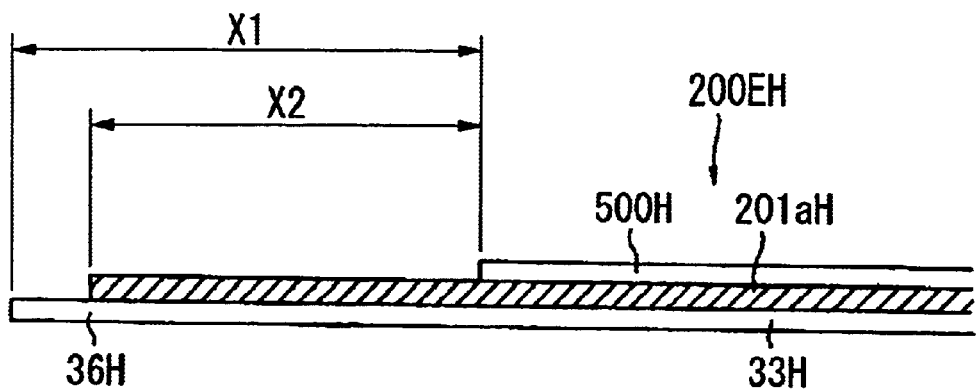
FIG. 64 is a sectional view showing a contact probe in a twenty-fifth embodiment of a probe device according to the present invention.
Figure 65:
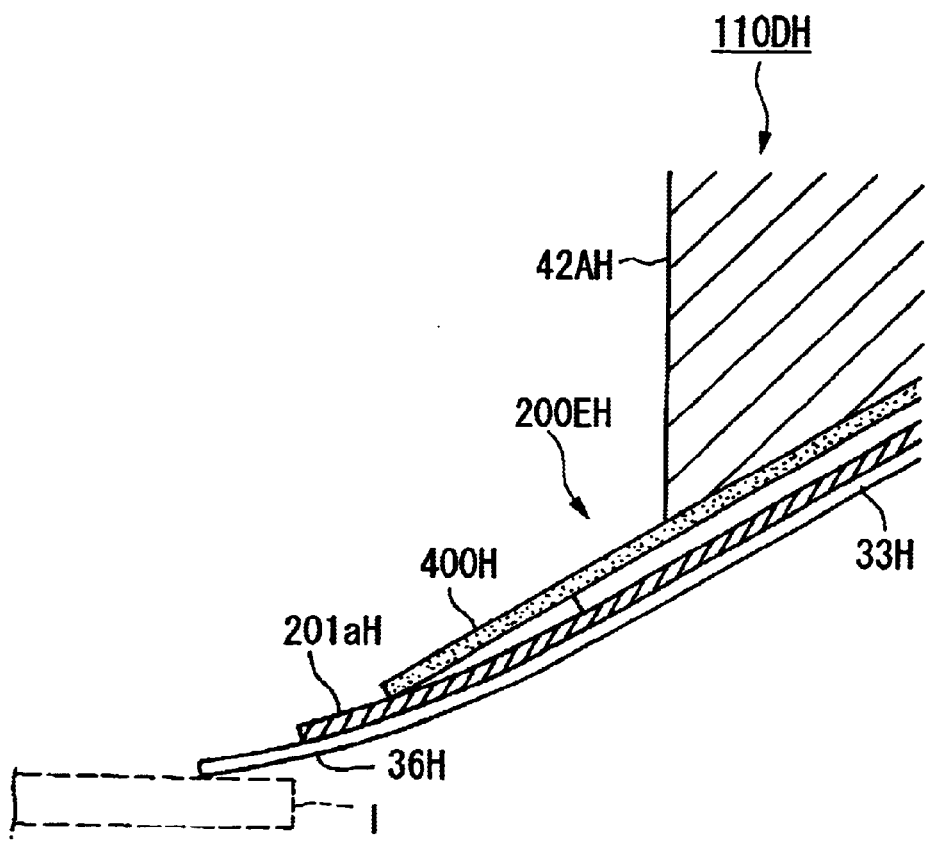
FIG. 65 is a sectional view showing the twenty-fifth embodiment of the probe device according to the present invention.
Figure 66:
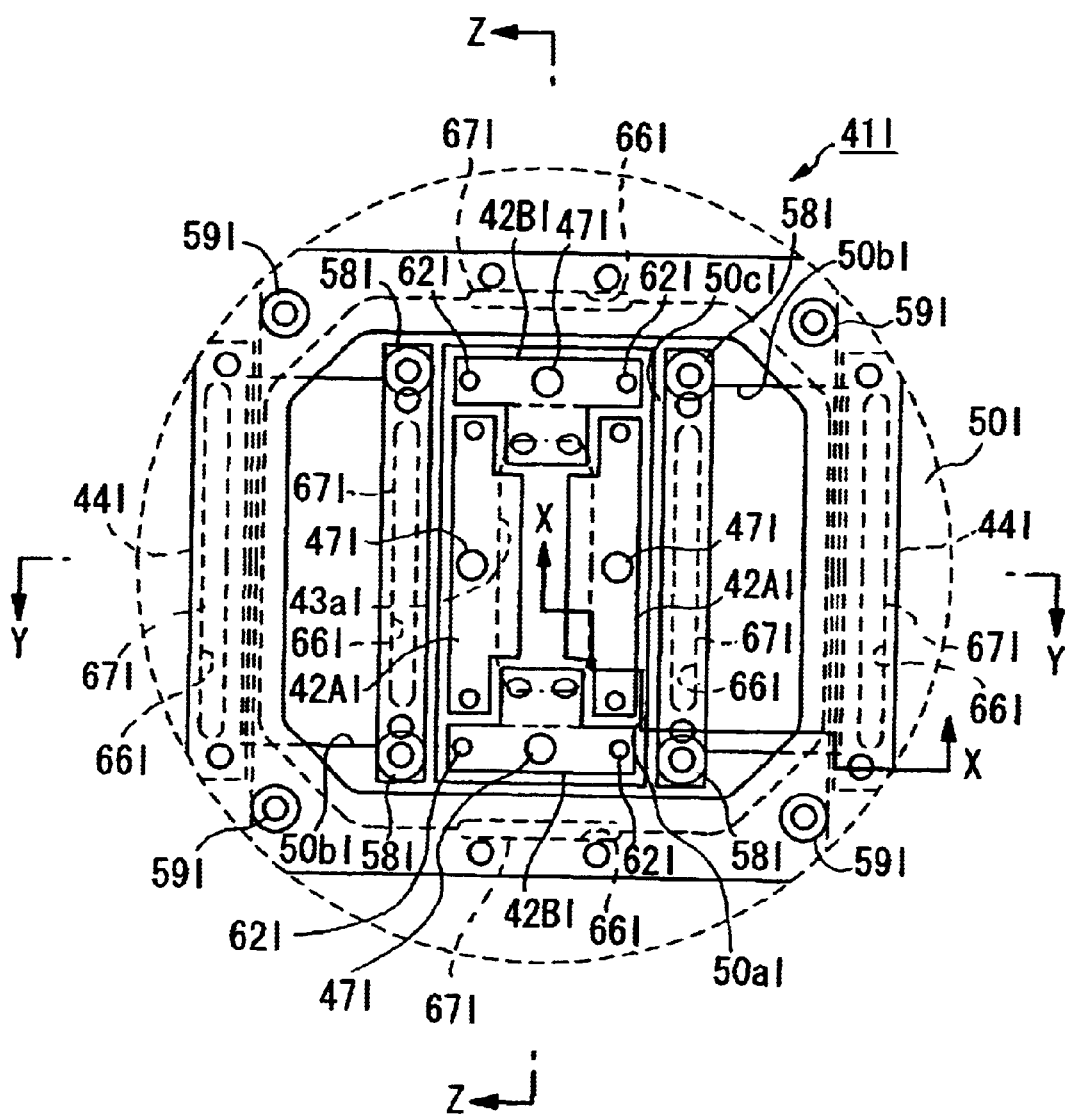
FIG. 66 is a bottom view showing a probe device integrated with a twenty-sixth embodiment of a contact probe according to the present invention.

A twenty-fifth embodiment will now be described with reference to FIGS. 64 and 65.

According to the twenty-second and the twenty-fourth embodiments, the highly elastic film 400H is pressed against the contact pins 36H. Thus, friction between the highly elastic film 400H and the contact pins 36H due to repeated use causes a distortion in the contact pins 36H resulting in shifted contact points. Therefore, according to the twenty-fifth embodiment, as shown in FIG. 64, a film 201aH is provided having a width wider than that in the conventional example, wherein X1>X2, where X1 designates a length of the contact pin 36H projecting from the metal film 500H, and X2 designates a length of the wide resin film 201aH projecting from the metal film 500H. Furthermore, as shown in FIG. 65, when the high elastic film 400H projects a shorter distance than the wide resin film 201aH, the highly elastic film 400H is brought into contact with the soft and wide resin film 201aH. In this way, the elastic film 400H is not brought into direct contact with the contact pins 36H and accordingly, the contact pins 36H can be prevented from bending to the left and right direction. According to the probe device 110DH, the wide resin film 201aH is formed longer on the front end side than the highly elastic film 400H and serves as a buffer when the highly elastic film 400H presses the contact pins 36H. Therefore, even with repeated use, the contact pins 36H are not warped and bent by friction due to the highly elastic film 400H and stable contact can be maintained with respect to the terminals of the IC chip I. Furthermore, the contact probe 200EH of the probe device 110DH comprises the contact probe main body 33H and the contact probe branch portions 34H and advantages thereof are provided.

According to the above-described respective embodiments, the contact probe is applied to a probe device that is a probe card, however, the contact probe may be adapted in other measurement jigs, etc. For example, the contact probe is applicable to a socket, etc. for testing an IC chip wherein the socket protects the IC chip by holding the IC chip therein and wherein the socket is mounted in a device for a bum-in test of the IC chip, etc. Furthermore, the contact probe may be cut off in a predetermined shape for an LCD and may be integrated to a probe device for an LCD. For example, the probe device for an LCD may include a contact probe pinching body for pinching a contact probe, and a frame in a shape of a picture frame for fixing the contact probe pinching body. In this case, front ends of contact pins of the contact probe may project from the contact probe pinching body and the front ends may be brought into contact with terminals of the LCD whereby measurement is performed.

Although the contact probe branch portions are branched from the contact probe main body, the contact probe portions branched from the contact probe branch portions may integrally be formed.

Although the contact pins of the contact probe are arranged only on one side of an IC chip to be tested, the contact probe may be arranged similarly on of the IC. Furthermore, a contact probe that is integrally formed such that a plurality of contact pins are simultaneously arranged at a plurality of sides of an IC chip, may be adopted. Thereby, a number of parts of the probe device can be reduced.

Figure 67:
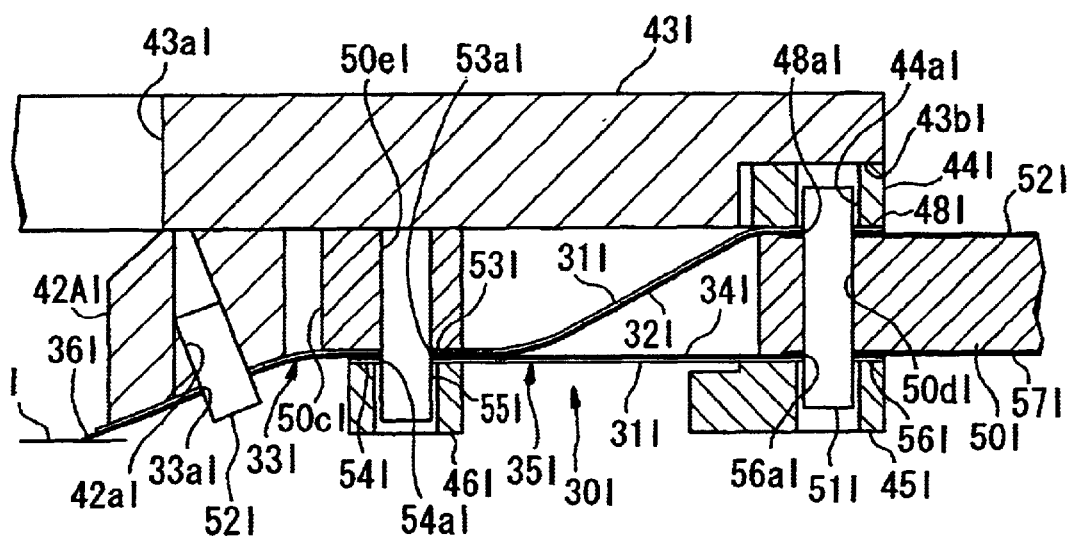
FIG. 67 is a sectional view taken along a line X—X of FIG. 66.

A twenty-sixth embodiment of a contact probe according to the present invention will now be described with reference to FIGS. 66–70. In FIGS. 66–70, notation 30I designates a contact probe for long sides, notation 31I designates a resin film, notation 32I designates main wiring patterns, notation 33I designates a contact probe main body, notation 34I designates branch wiring patterns, notation 35I designates a branch wiring plate and notation 36I designates contact pins for long sides. The contact probe 30I for long sides, according to the twenty-sixth embodiment, is used to perform electrical measurements by being brought into contact with electrodes on long sides of an IC chip I having a rectangular shape on a wafer. As shown in FIG. 67, the contact probe 30I comprises the contact probe main body 33I where a plurality of the main wiring patterns 32I made of Ni or a Ni alloy are pasted on one face of the polyimide resin film 31I and the branch wiring plate 35I of a flexible print substrate having the branch wiring patterns 34I formed from Cu (copper). The main wiring patterns 32I have the contact pins 36I for a long side, front end portions of the contact pins 36I projecting from an end portion of the resin film 31I. In addition, with respect to the main wiring patterns 32I, the surfaces of the contact pins 36I for a long side are coated with Au (gold) for preventing oxidation of the Ni or Ni alloy.

Figure 68:
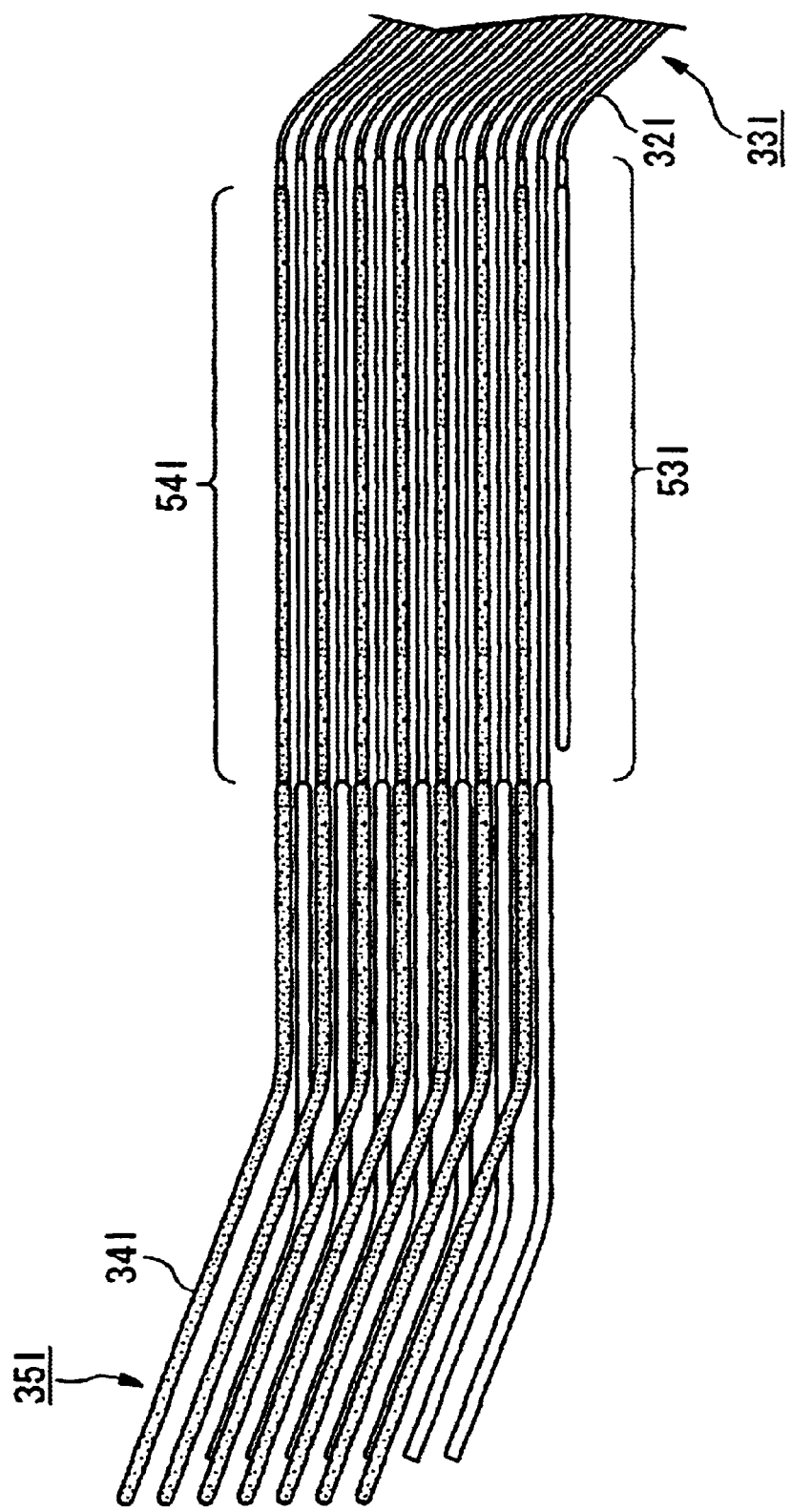
FIG. 68 is a plane view showing connection between a main pattern wiring and a branch pattern wiring in the probe device integrated with the twenty-sixth embodiment of the contact probe according to the present invention.
Figure 69:
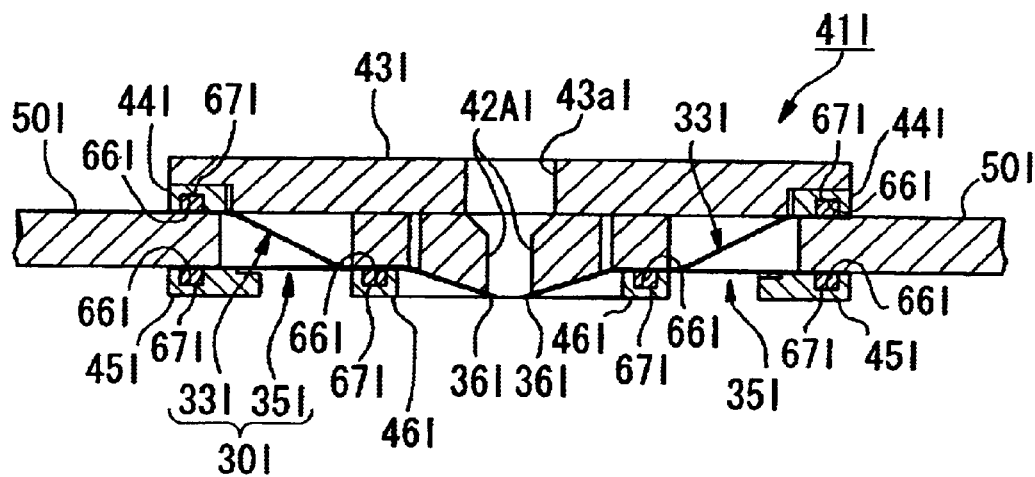
FIG. 69 is a sectional view taken along a line Y—Y of FIG. 66.
Figure 70:
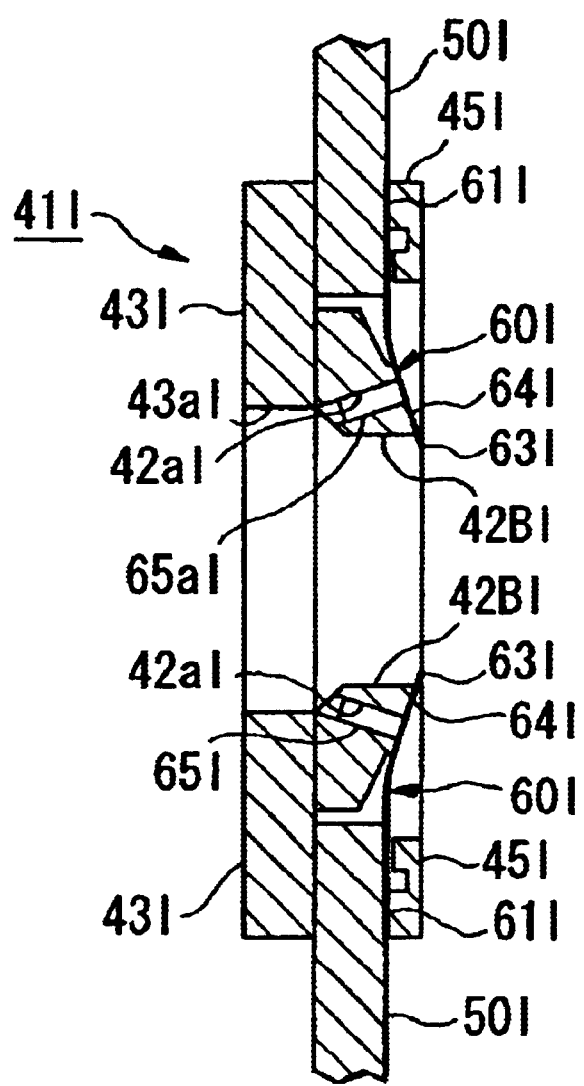
FIG. 70 is a sectional view taken along a line Z—Z of FIG. 66.

As shown in FIG. 68, the branch wiring plate 35I is connected to the contact probe main body 33I by pasting the front end portion of the branch wiring plate 35I to a middle portion of the contact probe main body 33I. The front end portions of the branch pattern wirings 34I are electrically connected to portions of the main wiring patterns 32I (every other wiring according to the embodiment).

The fabrication steps of the contact probe main body 33I of the contact probe 30I for long sides will now be explained. The base metal layer forming step, the pattern forming step, the electrolytic plating step, the film pasting step, the separating step, and the gold coating step are the same as those in the above-described first embodiment. The difference between the present embodiment and the first embodiment is as follows.

Fabrication of Branch Wiring Plate

The branch wiring plate 35I is fabricated by forming a Cu thin film on one face of the resin film 31I. The Cu thin film is selectively removed by etching so that the branch wiring patterns 34I of Cu are formed and by cutting the film in a predetermined shape corresponding to the contact probe main body 33I.

A probe device (probe card) 41I formed by integrating the contact probe 30I to mechanical parts will now be described with reference to FIGS. 66–70. The contact probe 30I corresponds to a long side of an IC chip I, and comprises the contact probe main body 33I and the branch wiring plate 35I. In addition, according to the contact probe 30I of the present invention, the main wiring patterns 32I are formed on the thin resin film 31I so that the resulting structure is soft, flexible and easy to integrate in a probe device, etc. As shown in FIGS. 66, 67, 69 and 70, the mechanical parts comprise mounting bases (support members) 42AI and 42BI, a top clamp 43I, sub top clamps 44I, bottom clamps 45I, and sub bottom clamps 46I.

First, the mounting bases 42AI and 42BI are attached to the lower face surrounding a central window 43aI of the top clamp 43I by bolts 47I and the two sub top clamps 44I are arranged at stepped portions 43bI at the external sides of the top clamp 43I formed in parallel to long sides of the central window 43aI. Next, a rear end connecting portion 48I of the contact probe main body 33I is arranged on the lower face of the sub top clamp 44I with the side of the main wiring patterns 32I directed downwardly and axial lines of rear end positioning holes 48aI formed at the rear end connecting portion 48I aligned with axial lines of top side positioning holes 44aI formed at the sub top clamp 44I.

Furthermore, a printed wiring board (substrate for wiring) 50I is arranged at the lower face of the top clamp 43I to interpose the sub top clamp 44I and the rear end portion of the contact probe main body 33I. The printed wiring board 50I is respectively formed with a central substrate window 5aI arranged at a central portion thereof so as to surround the respective mounting bases 42AI and 42BI, two long side windows 50bI separated from each other at the two long sides of the central substrate window 50aI, and long side supporting portions 50cI between the central substrate window 50aI and the long side windows 50bI.

In attaching the printed wiring board 50I, axial lines of substrate side positioning holes 50D1 formed in the vicinities of the long side windows 50bI are aligned with the axial lines of the rear end positioning holes 48aI and the top side positioning holes 44aI. Furthermore, first adjusting pins 51I are inserted through the substrate side positioning holes 50dI and the rear end positioning holes 48aI into the top side positioning holes 44aI, thereby positioning the sub top clamp 44I, the contact probe main body 33I and the printed wiring board 50I. In this way, the rear end portion of the main wiring patterns 32I of the contact probe main body 33I are electrically connected to surface side wiring patterns (wiring patterns on the side of the substrate) 52I which are electrodes formed on the surface of the printed wiring board 50I. In addition, the contact probe main body 33I passes from the surface side to the back face of the long side window 50bI and is disposed on the lower face of the long side support portion 50cI. The long side contact pins 36I are arranged on the lower face of the mounting base 42AI.

Next, axial lines of front end positioning holes 33aI formed at the vicinities of the long side contact pins 36I are aligned with axial lines of base side positioning holes 42aI formed at the mounting base 42aI. The second adjusting pins 52I are inserted into the front end positioning holes 33aI and into the base side positioning holes 42aI, thereby positioning the front end side of the contact probe main body 33I and the mounting base 42AI. Furthermore, an intermediate connecting portion 53I formed at an intermediate portion of the contact probe main body 33I is arranged on the lower face of a long side supporting portion 50cI. Axial lines of intermediate positioning holes 53aI formed at the intermediate connecting portion 53I, are aligned with axial lines of support side positioning holes 50eI formed at the long side supporting portion 50cI.

In addition, a front end connecting portion 54I of the branch wiring plate 35 is made to overlap the intermediate connecting portion 53I of the contact probe main body 33I, by directing the side of the branch wiring patterns 34I to the side of the contact probe main body 43I. Axial lines of branch front end positioning holes 54aI formed at the front end connecting portion 54I are aligned with axial lines of the intermediate positioning holes 53aI. With this configuration, third adjusting pins 55I are inserted into the branch front end positioning holes 54aI and the intermediate positioning holes 53aI, and into the support portion side positioning holes 50eI, thereby positioning the branch wiring plate 35I, the contact probe main body 33I and the long side supporting portion 50cI. As shown in FIG. 68, the branch wiring patterns 34I of the front end connecting portion 54I are electrically connected to the predetermined ones of the main wiring patterns 32I (every other wiring according to the embodiment) at the intermediate connecting portion 53I. Furthermore, with respect to a rear end connecting portion 56I of the branch wiring plate 35I, the first adjusting pins 51I are inserted through branch rear end positioning holes 56aI formed at the rear end connecting portion 56I. The branch wiring patterns 34I of the rear end connecting portion 56I are electrically connected onto back face side of the wiring patterns (wiring patterns on the side of the substrate) 57 which are electrodes formed on the rear face of the printed wiring board 50I.

Next, the sub bottom clamp 46I is positioned and fixed to the lower face of the long side supporting portion 50cI by bolts 58I, pinching the intermediate connecting portion 53I of the contact probe main body 33I and the front end connecting portion 54I of the branch wiring plate 35I. Furthermore, the bottom clamp 45I is and positioned fixed to the top clamp 43I by bolts 59I, pinching the rear end connecting portion 48I of the contact probe main body 33I, the printed wiring board 50I, and the rear end connecting portion 56I of the branch wiring plate 35I which are positioned. In other words, the contact probe main body 33I and the branch wiring plate 35I comprise the long side contact probe 30I, by connecting the intermediate connecting portion 53I and the front end connecting portion. The main wiring patterns 32I are branched by the branch wiring patterns 34I and the both wirings are electrically connected respectively to the surface side wiring patterns 52I and the back face side wiring patterns 571I of the printed wiring board 50I.

In addition, short side contact probes 60I corresponding to electrodes at short sides of an IC chip I are arranged on the lower face of the printed wiring board 50I on the sides of short sides of the central window 43aI. The short side contact probes 60I are positioned by inserting short side rear end adjusting pins 62I into rear end connecting portions 61I of the short side contact probes 60I. Furthermore, the short side contact probes 60I are formed by fabrication steps similar to those of the above described contact probe main body 33I and short side wiring patterns (not shown) made of Ni or a nickel alloy are provided on a resin film. Front end portions of the short side wiring patterns projected from the resin film constitute short side contact pins 63I. In the above-described positioning state, the rear end connecting portions 61I of the short side contact probes 60I are fixed to the printed wiring board 50I by being pinched between the bottom clamp 45I and the printed wiring board 50I so that the short side wiring patterns formed at the rear end connecting portions 61I are connected to short side substrate wiring patterns (not shown) formed on the surface of the printed wiring board 50I.

Next, front end connecting portions 64I of the short side contact probes 60I are arranged on the lower faces of the mounting bases 42BI which are arranged on the sides of short sides of the central window 43aI. The short side front end adjusting pins 65I are inserted into the front end connecting portions 64I and into base side positioning holes 42aI formed on the sides of the short sides of the central window 43aI in the mounting base 42BI. Thereby, the front end connecting portions 64I of the short side contact probe 60I and the mounting base 42BI are positioned. In addition, pressing grooves 66I respectively directed toward the side of the printed wiring board 50I, are formed at the bottom clamps 45I. The sub top clamps 44I, the sub bottom clamps 46I, and elastic bodies 67I formed by rubber, etc. are embedded into the pressing grooves 66I. These elastic bodies 67I press the contact probe main body 33I, the branch wiring plate 35I, and the short side contact probes 60I. Thus, the side contact probes 60I are brought into contact with the elastic bodies on the side of the printed wiring board 50I, whereby the wiring patterns which are arranged opposed to each other are brought into contact and are electrically connected.

According to the probe device 41I constituted by the above-described integrating operation, the long side contact probes 30I and the short side contact probes 60I are pressed by the sub bottom clamps 46I and the bottom clamps 45I. In this way, the respective front end portions are brought into constant inclined states by the mounting bases 42AI and 42BI and the long side contact pins 36I and the short side contact pins 63I are respectively brought into contact with electrodes on the long sides and the short sides of the IC chip I at predetermined angles.

When a probe test of the IC chip I is performed using the probe device 41I that is constructed as described above, the probe device 41I is inserted and attached to a prober and is electrically connected to a tester and predetermined electric signals (input signal) are respectively sent to the main wiring patterns 32I, the branch wiring patterns 34I, and the short side wiring patterns via the surface side wiring patterns 52I, back face side wiring patterns 57I, and the short side substrate wiring patterns of the printed wiring board 50I. In this way, the input signals at the branch wiring patterns 34I are transmitted to the main wiring patterns 32I of the intermediate connecting portion 53I at the front end connecting portion 54I and are sent to the IC chip I on a wafer from the long side contact pins 36I of the main wiring patterns 32I along with the input signals from the surface side wiring patterns 52I.

Conversely, the output signals outputted from the IC chip I to the long side contact pins 36I, are transmitted to the main wiring patterns 32I and are transmitted to the branch wiring patterns 34I where only the output signals at predetermined ones of the main wiring patterns 32I are transmitted at the intermediate connecting portion 53I. Furthermore, the output signals from the IC chip I to the short side contact pins 63I are transmitted to the short side wiring patterns. In this way, the output signals transmitted through main wiring patterns 32I, the branch wiring patterns 34I, and the short side wiring patterns, are transmitted to a tester via the surface side wiring patterns 52I, the back face side wiring patterns 57I, and the short side substrate wiring patterns so that electric properties of the IC chip I are measured.

The long side contact probe 30I comprises the contact probe main body 33I and the branch wiring plate 35I. The contact probe main body 33I includes the main wiring patterns 32I formed thereon. The branch wiring plate 35I is connected to the contact probe main body 33I and the branch wiring patterns 34I are connected to the main wiring patterns 32I. The branch wiring patterns 34I are formed in the branch wiring plate 35I. Therefore, portions of the main wiring patterns 32I are distributed to the branch wiring patterns 34I and accordingly, the branch wiring patterns 34I can be connected to locations separately from those of the main wiring patterns 32I. In other words, even if electrodes of the IC chip I are concentrated on one side (long side) of the IC chip I, the main wiring patterns 32I connected to the side with the electrodes are branched and divided by the branch wiring patterns 34I and are connected to other locations. Therefore, according to the probe device 41I integrated with the long side contact probe 30I, the contact probe main body 33I and the branch wiring plate 35I are distributed to the surface and the back face of the printed wiring board 50I. The main wiring patterns 32I and the branch wiring patterns 34I can separately be connected to the surface side wiring patterns 52I and the back face wiring patterns 57I of the printed wiring board 50I. Accordingly, even with an IC chip I where a number of electrodes are concentrated on one side, wiring is not concentrated on one face of the printed circuit board 50I and connection is facilitated by the doubled arrangement without reducing the pitch of the wiring patterns (electrodes) of the printed wiring board 50I.

Figure 71:
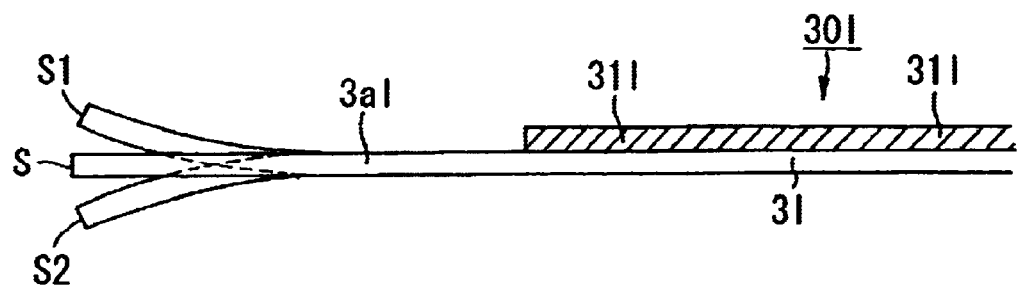
FIG. 71 is a sectional view showing a conventional drawback of a contact probe in relation to a twenty-seventh embodiment of a probe device according to the present invention.
Figure 72:
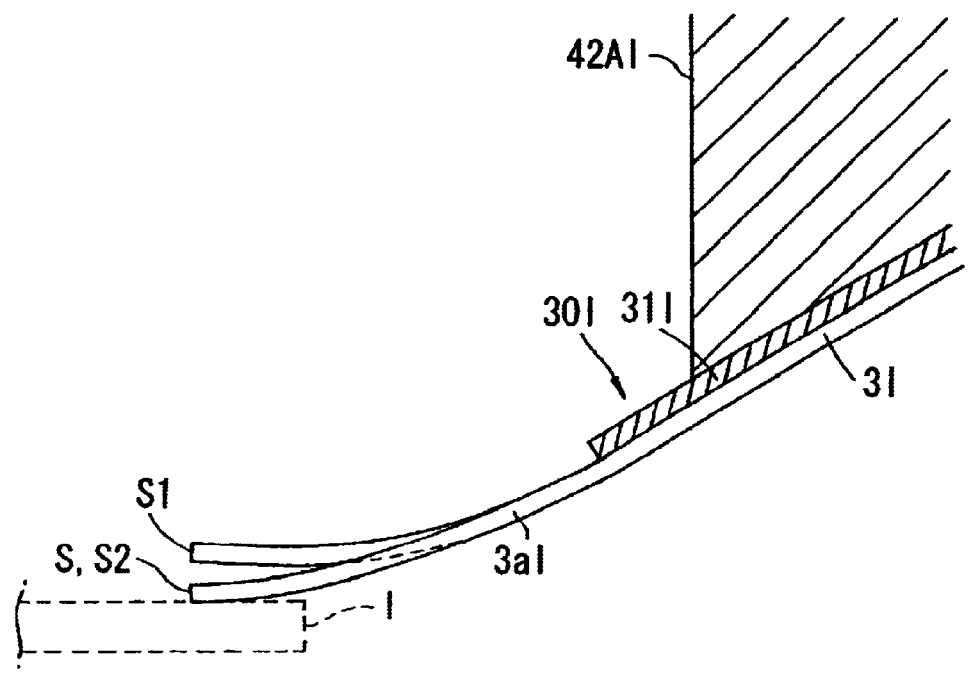
FIG. 72 is a sectional view showing the conventional drawback of the contact probe in relation to the twenty-seventh embodiment of the probe device according to the present invention.
Figure 73:
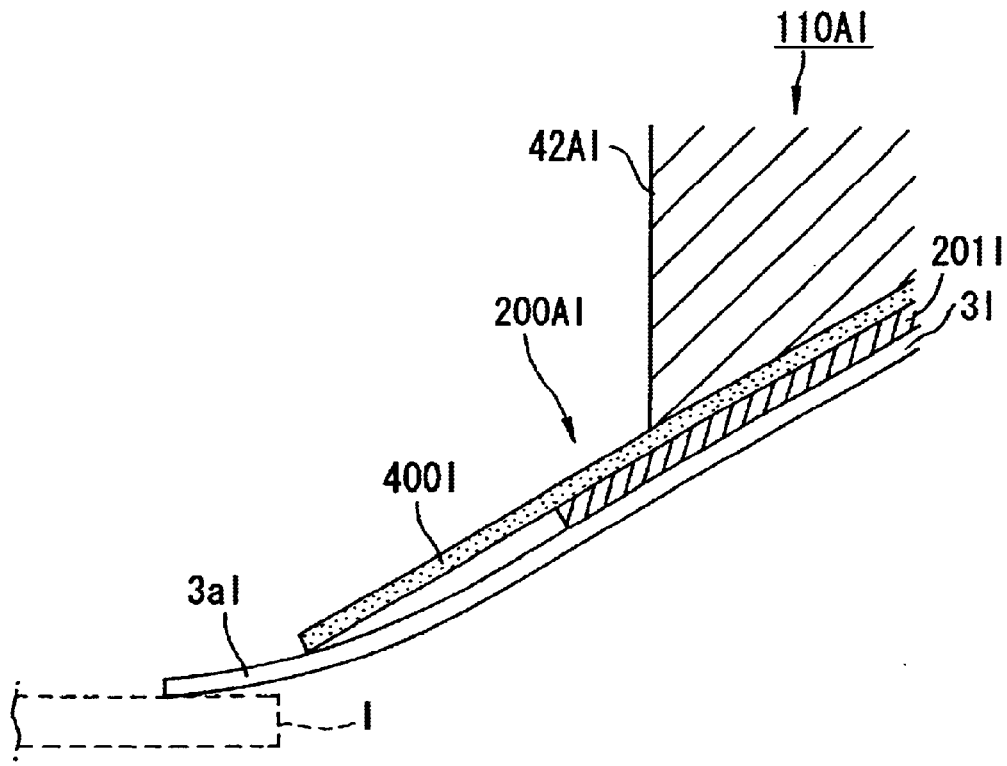
FIG. 73 is a sectional view showing the twenty-seventh embodiment of the probe device according to the present invention.

A twenty-seventh embodiment will now be described with reference to FIGS. 71–73. In FIG. 71, a front end portion of the contact pin 3aI of the contact probe 30I, as explained in the twenty-sixth embodiment, may be bent in the S (normal), S1 (bent upward), S2 (bent downward) positions. In FIG. 72, although the resin film 31I arranged on the lower face of the mounting base allows the contact pins 3aI to press against terminals of an IC chip I in the S and S2 positions, in the S1 position sufficient contact pressure may not be obtained. Therefore, contact failure of the contact pin 3aI with the IC chip I may occur resulting in inaccurate electrical testing of the IC chip I. Accordingly, the probe device 110AI of the twenty-seventh embodiment includes a highly elastic film 400I comprising an organic or inorganic material, as shown in FIG. 73. The elastic film 400I aligns contact pins 3a' bent in any one of the S, S1 and S2 positions so that they make positive contact with the terminals of the IC chip I. The highly elastic film 400I is provided on a resin film 201I (e.g., by lamination, adhesion, or a fixing means, etc.) of the contact probe 200AI. The elastic film 400I projects from the resin film 201I over the top portion of the contact pin 3aI and is arranged on a lower face of the mounting base 42AI. It is preferable that the highly elastic film 400I comprises ceramics or polyethylene terephthalate if it is an organic material and comprises ceramics, particularly alumina film if it is an inorganic material. Furthermore, when the contact pins 3aI are pressed against the terminals of the IC chip I, the highly elastic film 400I presses from above the contact pins 3aI and even with respect to position S1 allows for a firm contact between the terminal of the IC chip I and the contact pins 3aI. Thereby, a uniform contact pressure can be obtained at the front ends of the respective contact pins 3aI. Moreover, the front ends of the contact pins 3aI can be firmly brought into contact with the terminals of the IC chip I and accordingly, measurement failure due to contact failure can be eliminated. Furthermore, the contact probe 200AI of the probe device 110AI comprises the contact probe main body 33I and the branch wiring plate 35I and accordingly, advantages of the structure thereof can be obtained. In addition, the contact pressure on the contact pins 3aI can be adjusted by changing how far the elastic film 400H projects over the contact pins 3aI.

Figure 74:
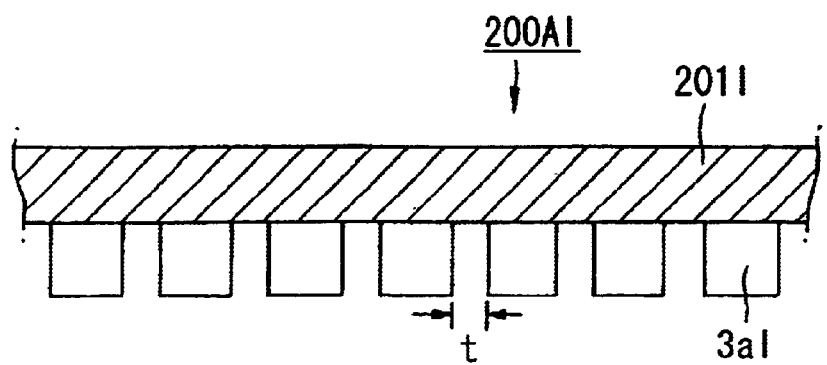
FIG. 74 is a sectional view in a direction orthogonal to contact pins in relation to a twenty-eighth embodiment of a contact probe according to the present invention.
Figure 75:
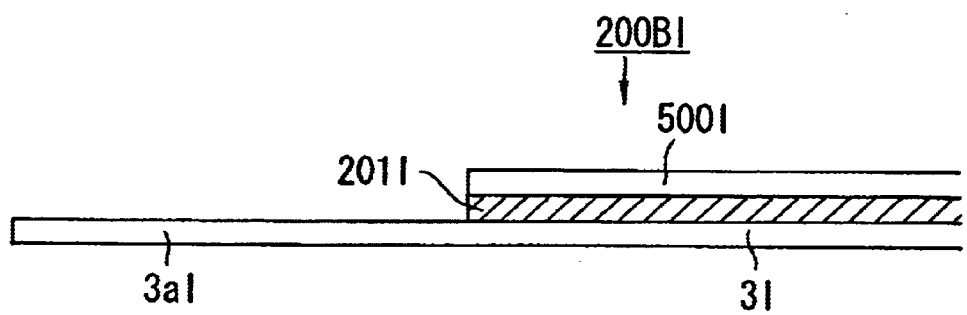
FIG. 75 is a sectional view showing the twenty-eighth embodiment of the contact probe according to the present invention.

A twenty-eighth embodiment of the present invention will now be described with reference to FIGS. 74 and 75. In FIG. 74, the resin film 201I of the contact probe 200AI which has been explained with reference to the twenty-seventh embodiment, is made of, for example, polyimide resin. With this construction an elongation may occur due to absorbed moisture causing an interval t between the contact pins 3aI to change. This results in the contact pins 3aI not making good contact with predetermined positions of the terminals of the IC chip I and accordingly accurate electrical testing cannot be performed. Hence, according to the twenty-eighth embodiment, as shown in FIG. 75, a metal film 500I is provided on top of the resin film 201I (e.g., by pasting) and the change in the interval t between the contact pins 3aI is decreased even during a change in humidity. In this way, the contact pins 3aI are firmly brought into contact with predetermined positions of the terminals of the IC chip I. Accordingly, positional shift of the respective contact pins 3aI does not typically occur even with a change in humidity and the front end portions of the contact pins 3aI are brought into contact with the terminals of the IC chip I with fine precision. Also, positional shift of the main wiring patterns 32I with respect to the branch wiring patterns 34I of the branch wiring plate 35I does not typically occur. In addition, it is preferable that the metal film 500I is made of a material, such as Ni, a Ni alloy, Cu, or a Cu alloy.

Figure 76:
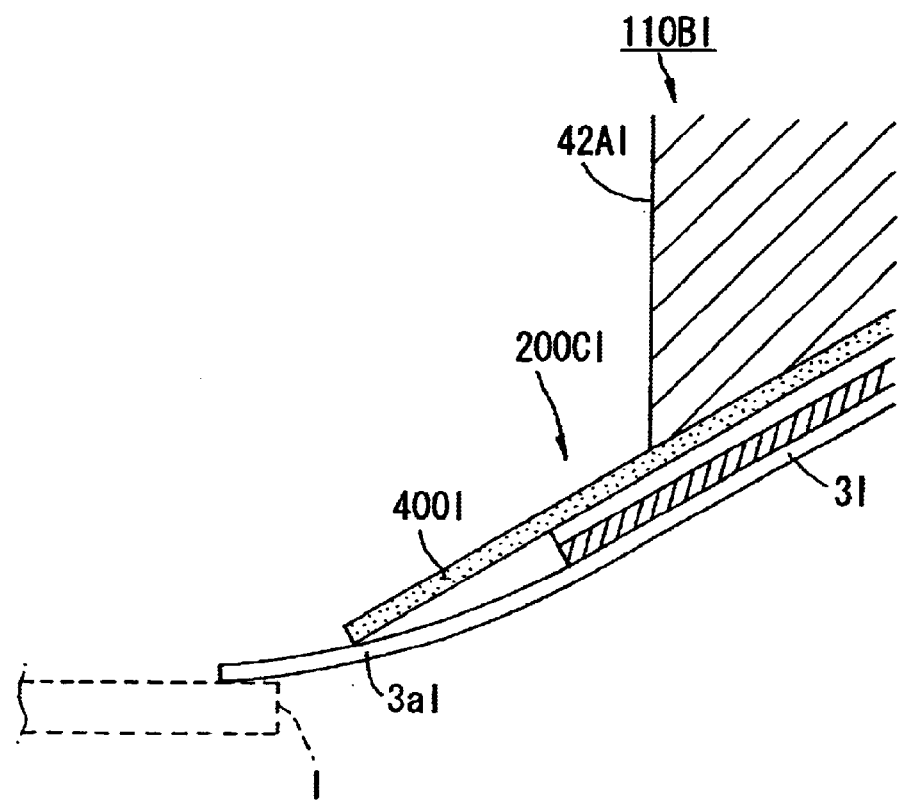
FIG. 76 is a sectional view showing a probe device in a twenty-ninth embodiment of a probe device according to the present invention.

A probe device 110BI according to a twenty-ninth embodiment will now be described with reference to FIG. 76. The contact probe 200CI includes the metal film 500I provided on the resin film 201I (e.g., by pasting), similar to the twenty-eighth embodiment. In addition, a highly elastic film 400I is arranged on the metal film 500I by adhesion or a fixing means (not shown), similar to the twenty-eighth embodiment. In this way, a uniform contact pressure is obtained irrespective of bending state of the front end of the contact pin 3aI and further, a change in the interval t between the contact pins 3aI is minimized so that electrical testing can be accurately performed.

Figure 77:
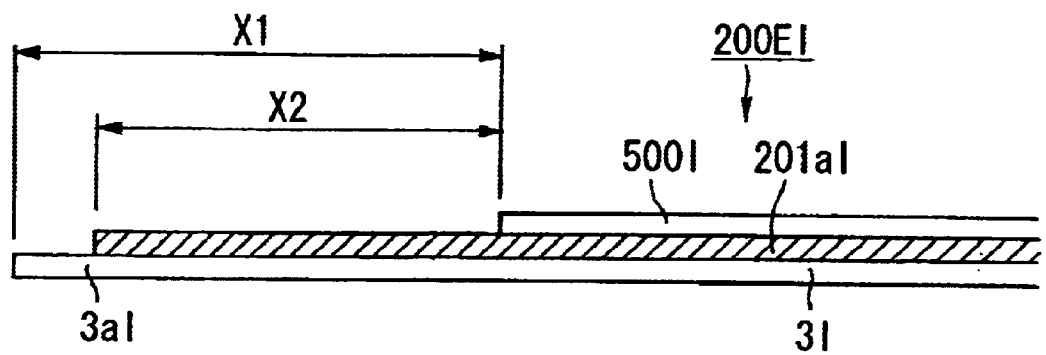
FIG. 77 is a sectional view showing a contact probe in a thirtieth embodiment of a probe device according to the present invention.
Figure 78:
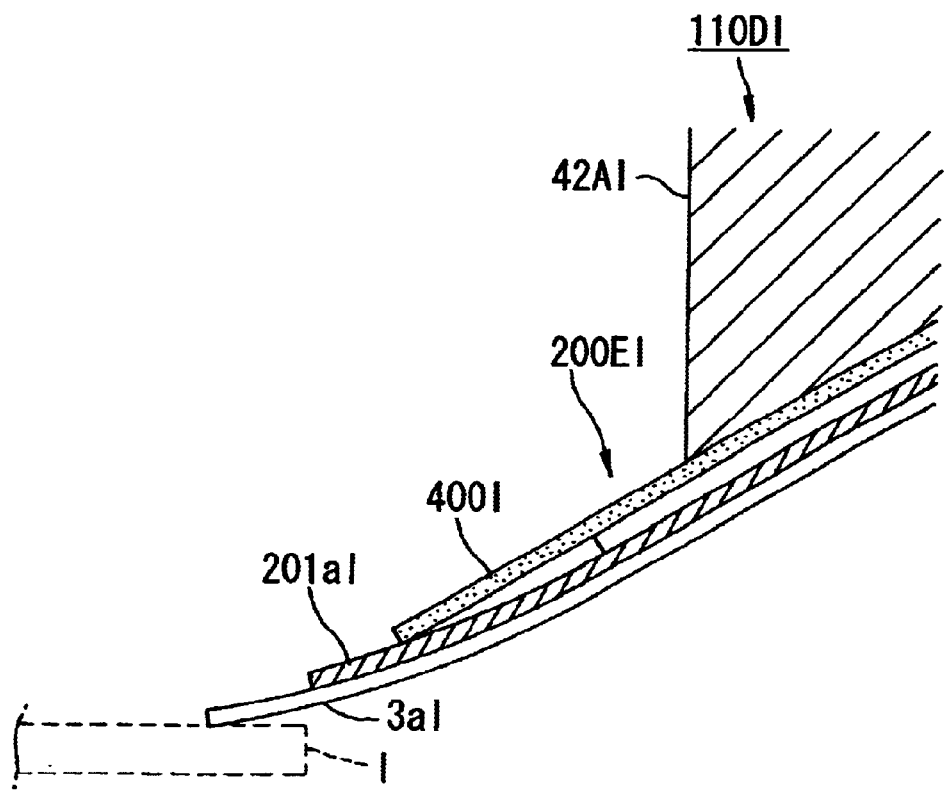
FIG. 78 is a sectional view showing the thirtieth embodiment of the probe device according to the present invention.

A thirtieth embodiment will now be described with reference to FIGS. 77 and 78. According to the twenty-seventh and the twenty-ninth embodiments, the highly elastic film 400I is pressed against the contact pins 3aI. Thus, friction between the highly elastic film 400I and the contact pins 3aI due to repeated use causes a distortion in the contact pins 3aI resulting in shifted contact points. Therefore, according to the thirtieth embodiment, as shown in FIG. 77, a film 201aI is provided having a width wider than that in the conventional example, wherein X1>X2, where X1 designates a length of the contact pin 3aI projecting from the metal film 500I, and X2 designates a length of the wide resin film 201aI projecting from the metal film 500I. Furthermore, as shown in FIG. 78, when the high elastic-film 400I projects a shorter distance than the wide resin film 201aI, the highly elastic film 400I is brought into contact with the soft and wide resin film 201aI. In this way, the elastic film 400I is not brought into direct contact with the contact pins 3aI and accordingly, the contact pins 3aI can be prevented from bending to the left and right direction. According to the probe device 110DI, the wide resin film 201aI is formed longer on the front end side than the highly elastic film 400I and serves as a buffer when the highly elastic film 400I presses the contact pins 3aI. Therefore, even with repeated use, the contact pins 3aI are not warped and bent by friction due to the highly elastic film 400I and stable contact can be maintained with respect to the terminals of the IC chip I. Furthermore, the contact probe 200EI of the probe device 110DI comprises the contact probe main body 33I and the branch wiring portions 35I and advantages thereof are provided.

According to the above-described respective embodiments, the contact probe for long sides is applied to a probe device that is a probe card, however, the contact probe for long sides may be adapted in other measurement jigs, etc. For example, the contact probe for long sides is applicable to a socket, etc. for testing an IC chip wherein the socket protects the IC chip by holding the IC chip therein and wherein the socket is mounted in a device for a burn-in test of the IC chip, etc. Furthermore, the contact probe for long sides may be cut off in a predetermined shape for an LCD and may be integrated into a probe device for an LCD. For example, the probe device for an LCD may include a contact probe pinching body for pinching a contact probe, and a frame in a shape of a picture frame for fixing the contact probe pinching body. In this case, front ends of contact pins of the contact probe may project from the contact probe pinching body and the front ends may be brought into contact with terminals of the LCD whereby measurement is performed.

Although with respect to the connection between the contact probe main body 33I and the branch wiring plate 35I, the main wiring patterns 32I and the branch wiring patterns 34I are electrically connected by bringing them in direct contact with each other, the connection may be performed by other methods. For example, the connection may be means of transmitting electric signals by arranging an anisotropic conduction sheet for conducting electricity between the contact probe main body and the branch wiring plate, whereby overlapped portions of the main wiring patterns and the branch wiring patterns conduct so that electrical signals are transmitted.

Although only one of the branch wiring plate 35I is connected to the contact probe main body 33I, a plurality of branch wiring plates may be connected and the contact probe main body 33I may further be branched into a plurality contact probe main bodies.

Although the branch wiring patterns 34I are connected to the main wiring patterns 32I at every other winding thereof, the connection may be performed by other arrangement. For example, the main wiring patterns may be divided by two in the left and right direction and one of them may be connected to the branch wiring patterns.

Although the branch wiring patterns 34I of the branch wiring plate 35I are formed by etching a Cu thin film on the resin film, the branch wiring patterns 34I may be formed by using other metals having low resistance and may be formed by Ni or a Ni alloy similar to the contact probe main body 33I. However, if the branch wiring plate comprises a flexible substrate having the branch wiring patterns of Cu, more flexibility and a degree of freedom with respect to portions for connecting to a printed circuit board, etc. result as compared with a contact probe main body where the main wiring patterns are made of Ni, or a Ni alloy.

Figure 79:
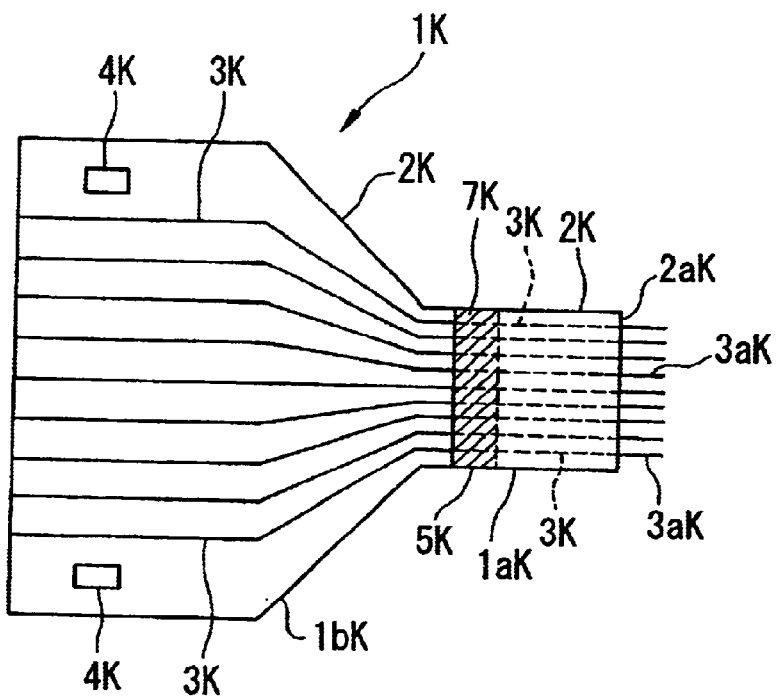
FIG. 79 is a plane view showing a contact probe in a thirty-first embodiment of a contact probe according to the present invention.

As shown in FIG. 79, a contact probe 1K of a thirty-first embodiment of the present invention is provided with a structure in which wiring patterns 3K made of a metal are pasted on one face of a polyimide resin film 2K. Contact pins 3aK comprise projecting front ends of the wiring patterns 3K from an end portion 2aK of the resin film 2K. The contact probe 1K includes a first contact probe 1aK having narrow pitch wiring patterns 3K densely formed and a second contact probe 1bK having wide pitch wiring patterns 3K coarsely formed. The wiring patterns 1aK and 1bK are separately formed are both connected to laminate film faces of a bonding face 5K such that the wiring patterns are connected to each other.

Figure 80:
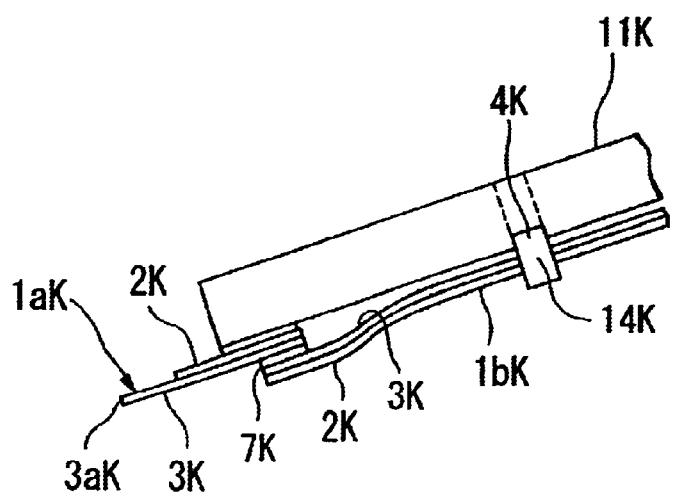
FIG. 80 is a side view in the thirty-first embodiment of the contact probe according to the present invention.

As shown in FIG. 80, the first contact probe 1aK and the second contact probe 1bK are adhered to each other by thermal compression with an interposing anisotropic conductive tape 7K at the bonding face 5K. Furthermore, the contact probe 1K is connected to a mechanical part 11K by a fixing member 14K at a positions of positioning holes 4K provided at the second contact probe 1bK.

The fabrication steps of the contact probe 1K, that is, the first contact probe 1aK and the second contact probe 1bK will now be described. The base metal layer forming step, the pattern forming step, the electrolytic plating step, the film pasting step, the separating step and the gold coating step are the same as those in the first embodiment. Using above-described steps, the contact probe 1K, that is, the first contact probe 1aK and the second contact probe 1bK shown in FIG. 79 and FIG. 80 are separately fabricated and thereafter, they are both adhered to each other via the anisotropic conductive tape 7K as described above.

Figure 81:
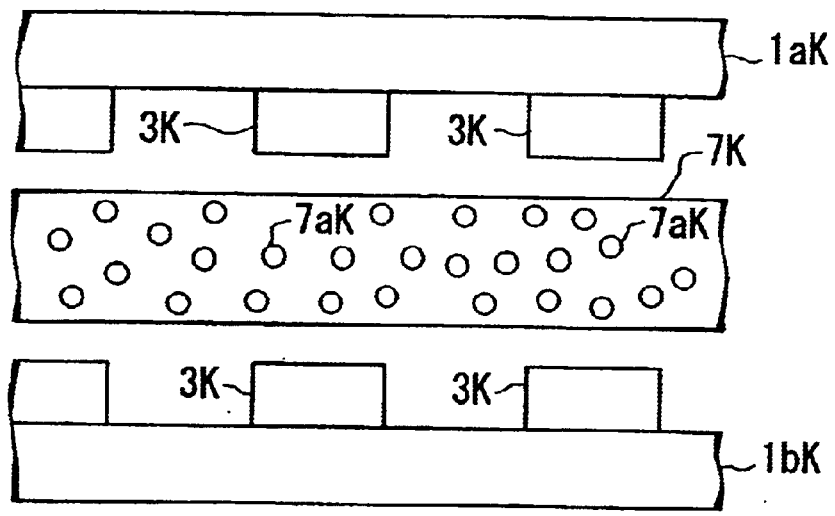
FIG. 81 is a principle diagram showing a principle of electrically connecting a pattern wiring of a first contact probe to a pattern wiring of a second contact probe using an anisotropic conductive tape in the thirty-first embodiment of the contact probe according to the present invention.
Figure 82:
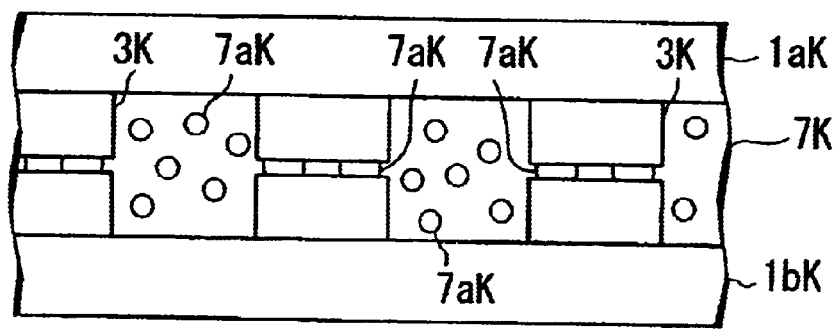
FIG. 82 is a principle diagram showing a principle of electrically connecting the pattern wiring of the first contact probe to the pattern wiring of the second contact probe using the anisotropic conductive tape in the thirty-first embodiment of the contact probe according to the present invention.

FIG. 81 and FIG. 82 are outline views showing a method of adhering the first contact probe 1aK and the second contact probe 1bK using the anisotropic conductive tape 7K. In FIG. 81, the anisotropic conductive tape 7K is placed between the first contact probe 1aK and the second contact probe 1bK and the both probes are moved towards each other by positioning them to approximately align the wiring patterns 3K with each other. Next, both probes are pressed together by thermal compression. Before the thermal compression, a number of conductive particles 7aK are present in the tape 7K and are substantially randomly disposed. In FIG. 82, electrical conduction occurs between the first conductive probe 1aK and the second conductive probe 1bK via the conductive particles 7aK and the wiring patterns 3K. Since the above-described anisotropic conductive tape is used, according to the positioning operation illustrated by FIG. 82, an electrical connection between the wiring patterns 3K can be achieved if there is no deviation in positioning by an amount that is equal to or more than a difference of the pitch between the respective wiring patterns 3K. Therefore, the degree of allowance in positioning the first contact probe 1aK and the second contact probe 1bK is enhanced and the electrical connection of the contact probes 1aK and 1bK is facilitated by an adhesive force of the tape.

Figure 83:
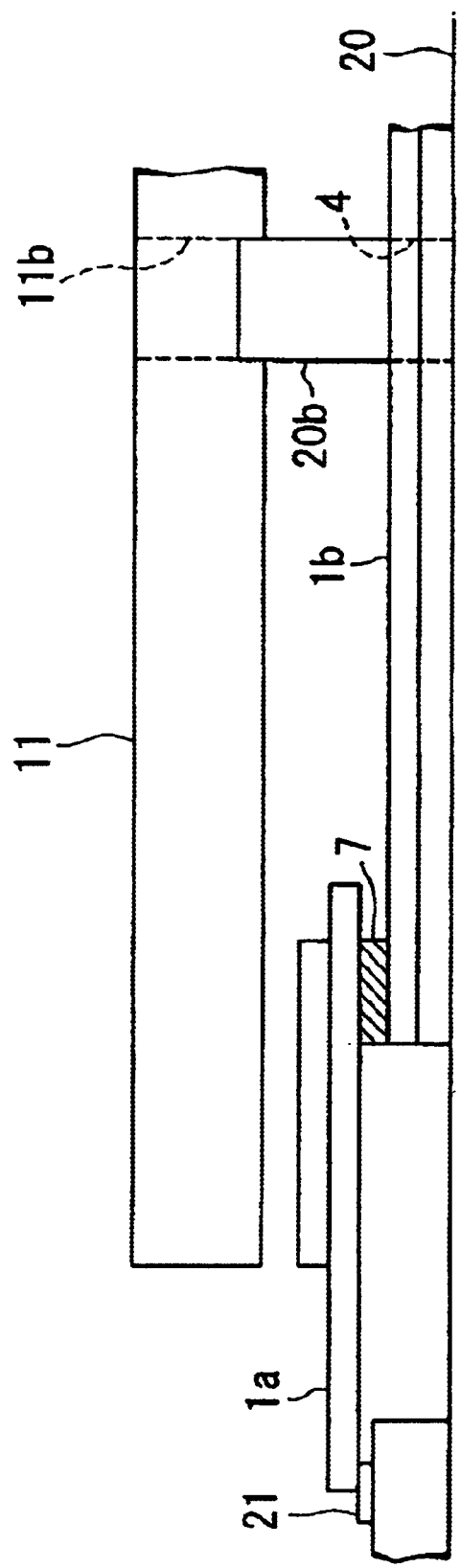
FIG. 83 is an outline view showing a way of positioning in connecting the first contact probe, the second contact probe and mechanical parts showing the thirty-first embodiment of the contact probe according to the present invention.

The procedure for positioning the first contact probe 1aK, the second contact probe 1bK and the mechanical part 11K to contact pads 21K of an IC, or a glass plate having the same pattern of the contact pads 21K, etc. will be described with reference to FIG. 83 as follows:

(1) The IC, or a glass plate having the same pattern of the contact pads 21K, etc. is mounted at a predetermined position on an integration jig 20K.

(2) The second contact probe 1bK is tacked with the anisotropic conductive tape 7K and is fitted to positioning pins 20bK of the integration jig 20K such that the positioning holes 4K are aligned. The positions in X and Y directions of the positioning pins 20bK can be arbitrarily be set by a manipulator at every time of operation.

(3) The positioning of the contact pads 21K and the second contact probe 1bK is conducted by moving the first contact probe 1aK using a microscope since the first and second contact probes 1aK and 1bK are tacked to each other and thermally compressed with the anisotropic conductive tape 7K.

(4) The mechanical part 11K for fixing the contact probe is fitted to the integration jig 20K in alignment with positioning holes 11bk and the second contact probe 1bK is pasted on the mechanical part 11K using an adhesive agent. In addition, the first contact probe 1aK is adhered to the mechanical part 11K by using removable two face tape, etc. (not shown).

(5) The mechanical part 11K is integrated to a PCB (Printed Circuit Board, not shown) and thereafter, the integration jig 20K is removed.

As mentioned above, in connecting the first contact probe 1aK and the second contact probe 1bK and connecting the wiring patterns 3K, the anisotropic conductive tape 7K is used and accordingly, a deviation in positioning is alleviated and positional shift to some degree is absorbed. Therefore, the degree of allowance in positioning is enhanced whereby accuracy of positioning is promoted and also, the positioning is facilitated. Furthermore, in the case of damaged probe contacts 3aK or a changing of the probe contacts 3aK pressure, a portion of the bond face 5K adhered by the anisotropic conductive tape 7K is removed and only the first contact probe 1aK is exchanged, whereby maintenance is facilitated.

Furthermore, with respect to the area of the first contact probe 1aK having densely formed wiring patterns 3K as compared to the second contact probe 1bK having coarsely formed wiring patterns 3K, the occupied area of the first contact probe 1aK is very small. Therefore, in fabricating the first contact probe 1aK and the second contact probe 1bK, the area of the first contact probe 1aK is much smaller than the total area of a conventional contact probe. In addition, the general fabrication yield of the contact probe is governed by whether the pitch of the wiring patterns 3K is wide or narrow and when many portions having the narrow pitch are included, the yield is deteriorated. Therefore, the fabrication yield of the first contact probe 1aK is not much different from the fabrication yield of a conventional contact probe, whereas the fabrication yield of the second contact probe 1bK having a wide area is much improved compared with the yield of the conventional contact probe. Accordingly, the fabrication yield of the contact probe 1K of the present invention as a whole is improved as compared with the fabrication yield of a contact probe having only narrow pitch portions.

Although according to the thirty-first embodiment, an adhesive material such as epoxy resin or the like is used in bonding the second contact probe 1bK and the mechanical part 11K, the bonding can be conducted mechanically.

Although the above-described embodiment includes a case where the first contact probe 1aK and the second contact probe 1bK are connected to each other, the present invention is not limited to that embodiment and there are cases where the contact probe 1K comprises a first contact probe, a second contact probe, a third contact probe, etc. and the number of connections can pertinently be determined in accordance with the use.

Furthermore, as illustrated in FIG. 80, the first contact probe 1aK is connected to the second contact probe 1bK and the wiring patterns 3K of the second contact probe 1bK are formed on the resin film 2K. Accordingly, this structure inconvenient, for example, in a case where the electrical wiring is intended to lead out from a downward direction. In such a case, at an end of the second contact probe 1bK opposed to an end at the bond face with respect to the first contact probe 1aK and the second contact probe 1bK, another contact probe similar to the second contact probe 1bK is provided. In this way, the wiring patterns are arranged at the lower side of the resin film in the third contact probe, whereby wiring can be led out from the lower direction.

In addition, when the pitch of the wiring patterns 3K in the vicinity of the bond face of the first contact probe 1aK and the second contact probe 1bK is wide, the wiring of both contact probes can be connected by bonding wires and the wiring patterns of the second contact probe can be led out from the lower side.

Figure 84:
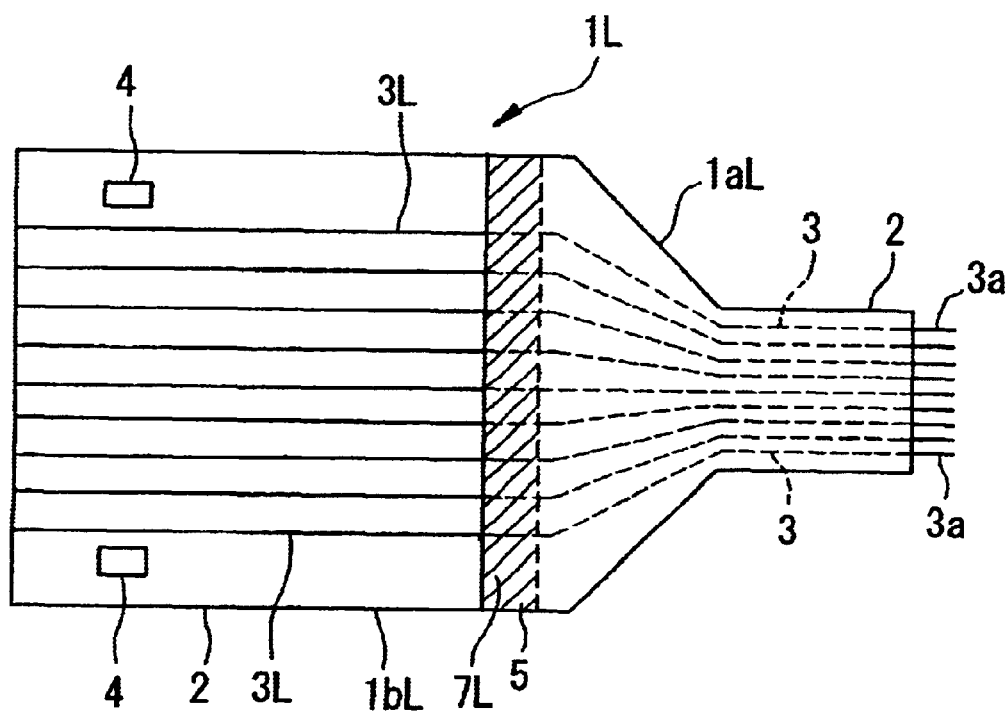
FIG. 84 is a plane view of a contact probe showing a thirty-second embodiment of a contact probe according to the present invention.

A thirty-second embodiment of the present invention will now be described with reference to FIG. 84. According to a contact probe 1L, similar to the contact probe 1K shown in the thirty-first embodiment, a first contact probe 1aL and a second contact probe 1bL are separately fabricated and are connected by an anisotropic conductive tape 7L. The difference between the contact probe 1L shown in the thirty-second embodiment and the contact probe 1K shown in the thirty-first embodiment is that wiring patterns 3L of the first contact probe 1aL includes a portion having a narrow pitch and a portion having a wide pitch. In this case, the bonding between the first contact probe 1aL and the second contact probe 1bL is performed at the portion of the wiring patterns having the wider pitch. In this way, the allowance of positional shift of the first contact probe 1aL and the second contact probe 1bL in the positioning operation is further increased as compared with the case of the contact probe shown in the thirty-first embodiment.

A thirty-third embodiment of a contact probe according to the present invention will now be described. Although not illustrated, the difference between a contact probe of the thirty-third embodiment and the contact probe 1K or 1L explained the thirty-first or the thirty-second embodiment is that different from the contact probe using the above-described fabrication steps with respect to the second contact probe, a conventional flexible printed circuit (FPC) is used. In this case, when the pitch of the wiring patterns 3 at the bond face 5 of the first contact probe 1a is about 100 $\mu$m, an FPC is included as the second contact probe 1b. Therefore, the contact probe can be formed inexpensively without using the second contact probe so that fabrication cost and complexity is reduced.

In addition, according to the thirty-first and the thirty-second embodiments, the contact probes 1K and 1L are applied to a probe device that is a probe card, however, the contact probes 1K and 1L may be adapted in other measurement jigs, etc. For example, the contact probes 1K and 1L are applicable to a socket, etc. for testing an IC chip wherein the socket protects the IC chip by holding the IC chip therein and wherein the socket is mounted in a device for a bum-in test of the IC chip, etc.

Figure 85:
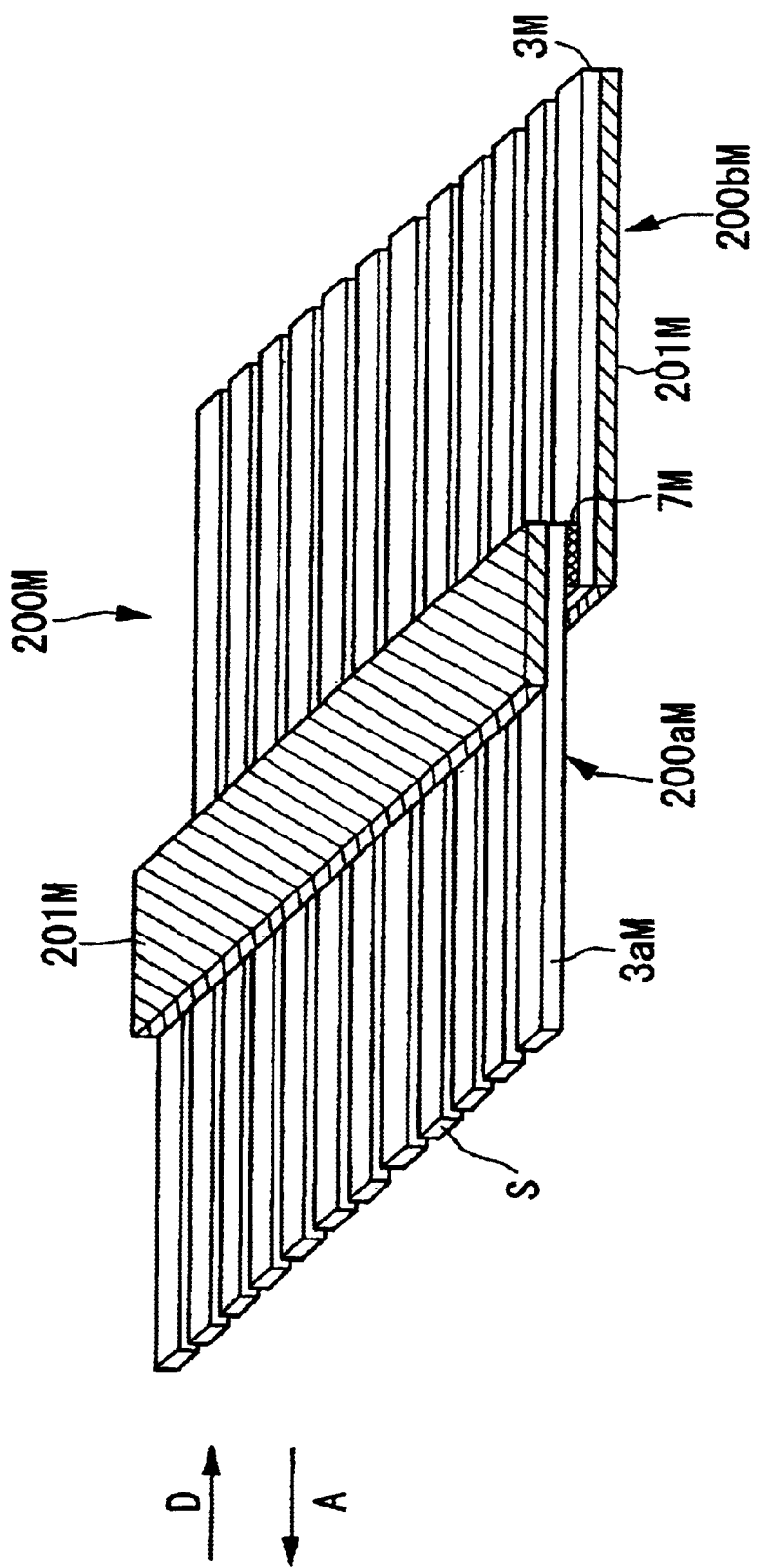
FIG. 85 is a perspective view showing a contact probe in a thirty-fourth embodiment of a probe device according to the present invention.
Figure 86:
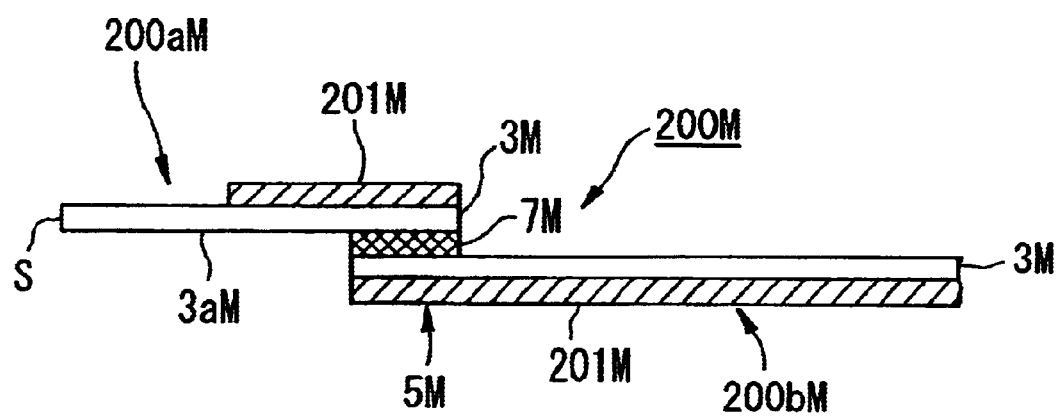
FIG. 86 is a sectional view taken along a line A—A of FIG. 85.

A thirty-fourth embodiment will now be described with reference to FIGS. 85 and 86. According to the present embodiment, the contact probes 1K and 1L cut out in a predetermined shape so as to form an IC probe in the thirty-first and the thirty-second embodiments, are cut in a predetermined shape so as to form an LCD probe. Naturally, the following explanation is applicable to a contact probe for an IC probe as well. A contact probe for an LCD is designated by notation 200M and notation 201M designates a resin film. As shown in FIG. 86, similar to the contact probe 1M of the above-described embodiments, a first contact probe 200aM and a second contact probe 200bM are adhered to each other using anisotropic conductive tape 7M at a bond face 5M. In this way, wiring patterns 3M are electrically connected. Furthermore, the integration of the contact probe 200M as a probe device for an LCD is the same as in previous embodiments concerning the above-describe probe device for an LCD. Also, with respect to the above-described probe device for an LCD, a contact probe 200M is formed by connecting the first contact probe 200aM and the second contact probe 200bM. Accordingly, the positioning operation is facilitated as described with respect to the contact probes for an IC of the thirty-first and the thirty-second embodiments. In addition, only the first contact probe 200aM needs to be exchanged in order to change a contact probe tip or contact probe pressure. Accordingly, maintenance is facilitated in a similar way as in the thirty-first and the thirty-second embodiments.

Figure 87:
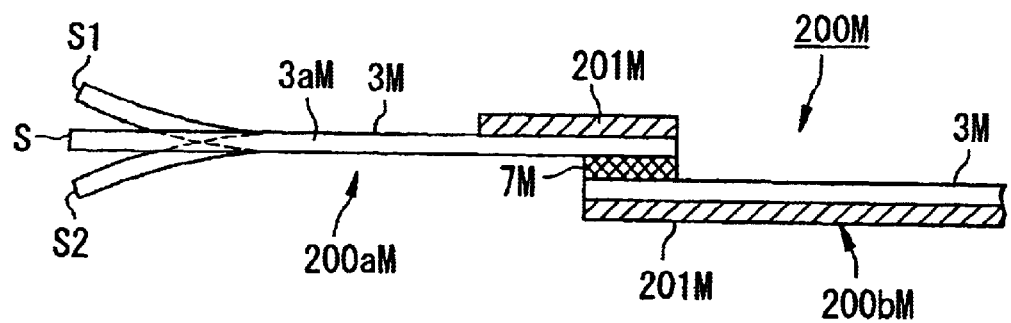
FIG. 87 is a side view showing a conventional drawback of a contact probe in relation to a thirty-fifth embodiment of a probe device according to the present invention.
Figure 88:
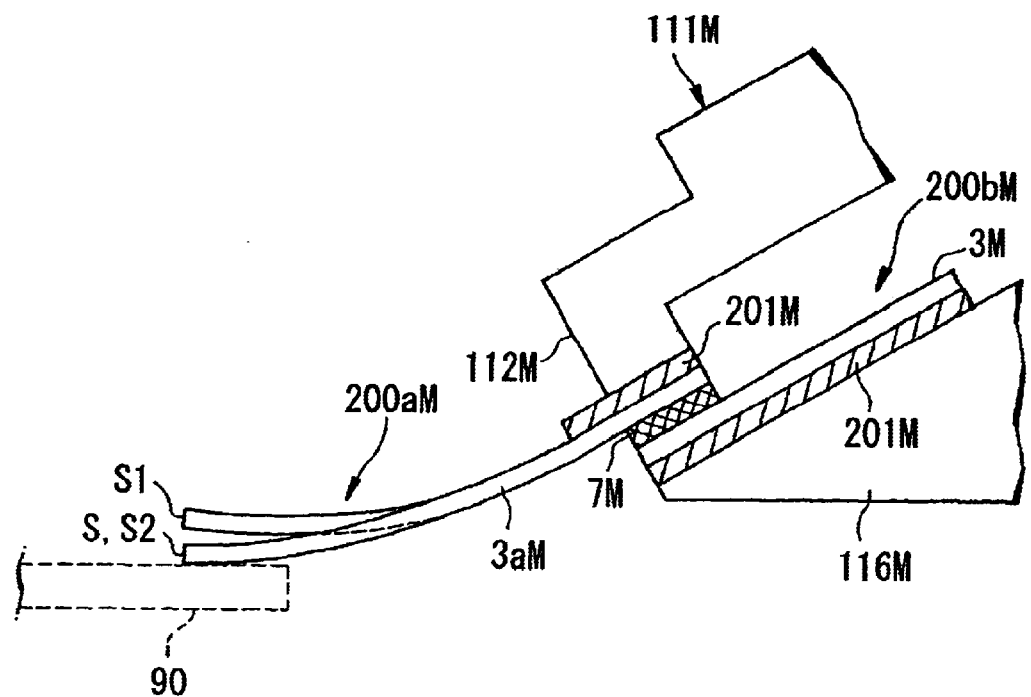
FIG. 88 is a side view showing the conventional drawback of the probe device in relation to the thirty-fifth embodiment of the probe device according to the present invention.
Figure 89:
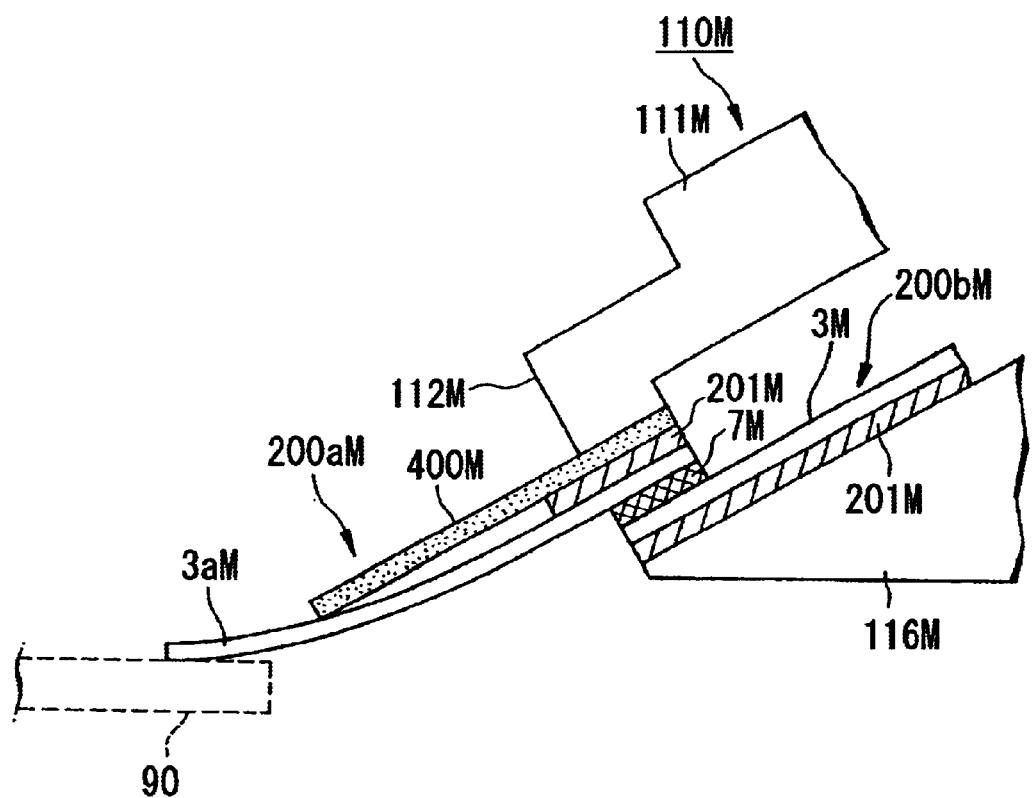
FIG. 89 is a side view showing the probe device in the thirty-fifth embodiment of the probe device according to the present invention.

A thirty-fifth embodiment will now be described with reference to FIGS. 87–89. In FIG. 87, a front end portion of the contact pins 3aM of the first contact probe 200aM of the contact probe 200M, as explained in the thirty-fourth embodiment, may be bent in the S (normal), S1 (bent upward), S2 (bent downward) positions. In FIG. 88, although the resin film 201M arranged on the lower face of the mounting base 111M allows the contact pins 3aM to press against terminals of an LCD 90 in the S and S2 positions, in the S1 position sufficient contact pressure may not be obtained. Therefore, even when single abnormal contact pin is present, contact failure of the contact pin 3aM with the LCD 90 may occur resulting in inaccurate electrical testing of the LCD 90. Accordingly, the probe device 110M of the thirty-fifth embodiment includes a highly elastic film 400M comprising an organic or inorganic material, as shown in FIG. 89. The elastic film 400M aligns contact pins 3aM bent in any one of the S, S1 and S2 positions so that they make positive contact with the terminals of the LCD 90. The highly elastic film 400M is provided on a resin film 201M (e.g., by lamination, adhesion, or a fixing means, etc.) of the contact probe 200aM. The elastic film 400M projects from the resin film 201M over the top portion of the contact pin 3aM and is arranged on a lower face of the mounting base 111M. It is preferable that the highly elastic film 400M comprises ceramics or polyethylene terephthalate if it is an organic material and comprises ceramics, particularly alumina film if it is an inorganic material. Furthermore, when the contact pins 3aM are pressed against the terminals of the LCD 90, the highly elastic film 400M presses from above the contact pins 3aM and even with respect to position S1 allows for a firm contact between the terminal of the LCD 90 and the contact pins 3aM. Thereby, a uniform contact pressure can be obtained at the front ends of the respective contact pins 3aM. Moreover, the front ends of the contact pins 3aM can be firmly brought into contact with the terminals of the LCD 90 and accordingly, measurement failure due to contact failure can be eliminated. In addition, the contact pressure on the contact pins 3aM can be adjusted by changing how far the elastic film 400M projects over the contact pins 3aM. According to the probe device for an LCD of the thirty-fifth embodiment, even if several pins 3aM included in the total of pins 3aM are bent in the S1 position, the positions of the pins 3aM when they are brought into contact with the LCD 90, are corrected by the highly elastic film 400M and the positions of all of the pins 3aM are aligned. Accordingly, the contact with respect to the terminals of the LCD 90 can be performed accurately and easily by a synergistic effect derived also from the easiness in positioning which has been shown in the thirty-first and the thirty-second embodiments.

Figure 90:
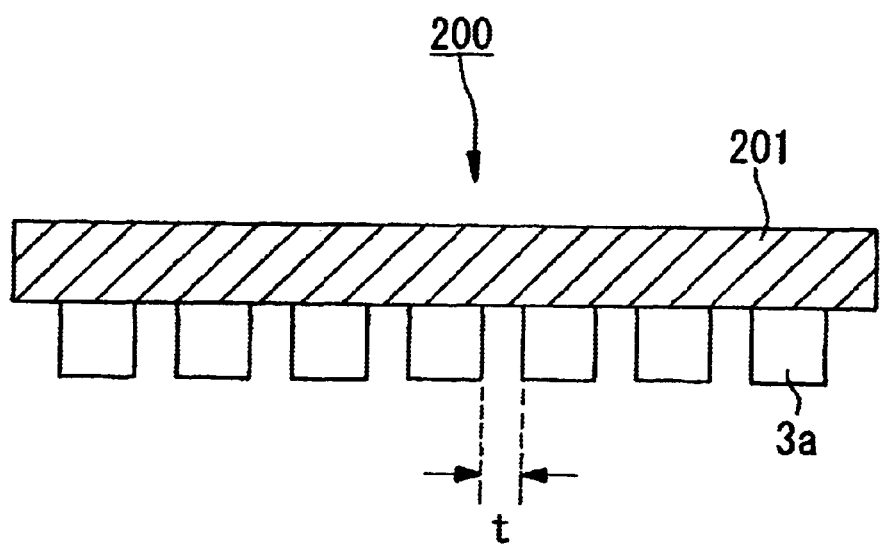
FIG. 90 is a view in a direction D of FIG. 85 in relation to a thirty-sixth embodiment of a contact probe according to the present invention.
Figure 91:
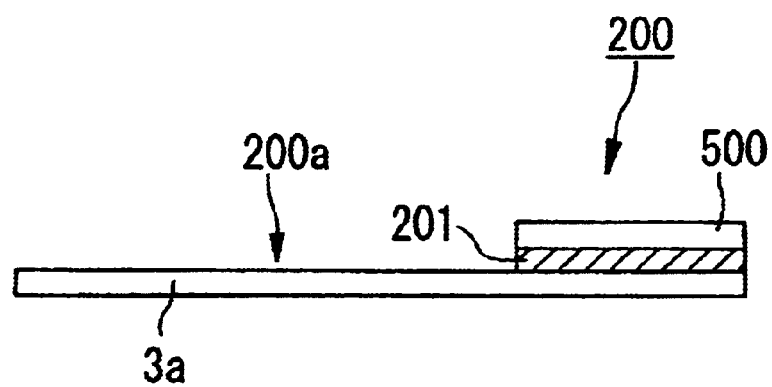
FIG. 91 is a side view showing the contact probe in the thirty-sixth embodiment of the contact probe according to the present invention.

A thirty-sixth embodiment of the present invention will now be described with reference to FIGS. 90 and 91. In FIG. 90, the resin film 201M of the contact probe 200M which has been explained with reference to the thirty-third embodiment, is made of, for example, polyimide resin. With this construction an elongation may occur due to absorbed moisture causing an interval t between the contact pins 3aM to change. This results in the contact pins 3aM not making good contact with predetermined positions of the terminals of the LCD 90 and accordingly accurate electrical testing cannot be performed. Hence, according to the thirty-sixth embodiment, as shown in FIG. 91, a metal film 500M is provided on top of the resin film 201M (e.g., by pasting) and the change in the interval t between the contact pins 3aM is decreased even during a change in humidity. In this way, the contact pins 3aM are firmly brought into contact with predetermined positions of the terminals of the LCD 90. Accordingly, positional shift of the respective contact pins 3aM does not typically occur even with a change in humidity and the front end portions of the contact pins 3aM are brought into contact with the terminals of the LCD 90 with fine precision. The metal film 500M may be used as a ground and preferably that the metal film 500M is made of a material, such as Ni, a Ni alloy, Cu, or a Cu alloy. The reason why the above-described materials are preferable as the materials for the metal film 500M, is that as described above, when the metal film 500M is used as a ground, an excellent electric property can be obtained. Even with the probe device for an LCD according to the thirty-sixth embodiment, the positions of the contact pins do not deviate regardless of respective bent pins. Therefore, the contact can be performed accurately with respect to the terminals of the LCD 90 and a synergistic effect is also derived from the easiness in positioning.

Figure 92:
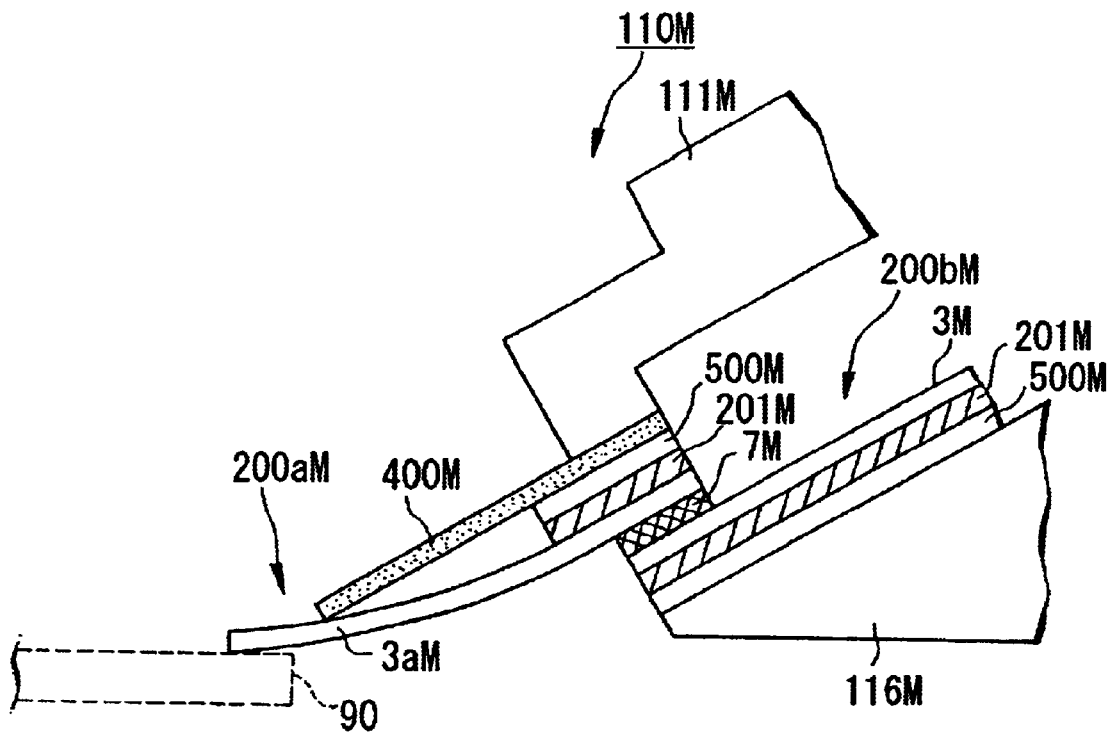
FIG. 92 is a side view showing a probe device in a thirty-seventh embodiment of a probe device according to the present invention.

A thirty-seventh embodiment will now be described with reference to FIG. 92. According to the embodiment, similar to the above-described thirty-fifth embodiment, the metal film 500M is attached on the resin film 201M and further, the highly elastic film 400M is used similar in a manner similar to that of the thirty-fourth embodiment. In this way, a uniform conduct pressure is obtained regardless of the bending state of the front end portions of the contact pin 3aM and the change in the interval t between the contact pins 3aM is minimized, whereby electrical testing can be performed accurately. Even with the probe device for an LCD according to the thirty-seventh embodiment, similar to the above-described respective embodiments, accurate positioning can be conducted and the similar operation and effect can be achieved.

Figure 93:
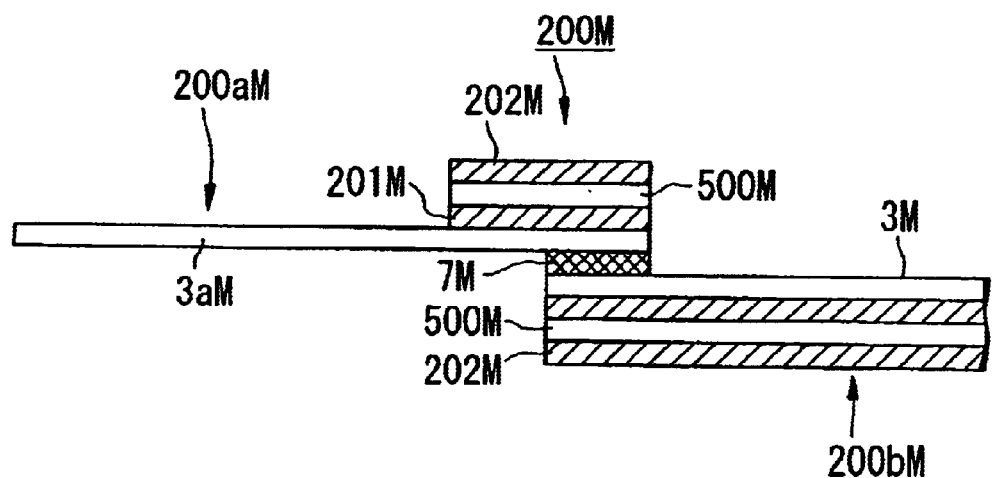
FIG. 93 is a side view showing a contact probe in a thirty-eighth embodiment of a probe device according to the present invention.
Figure 94:
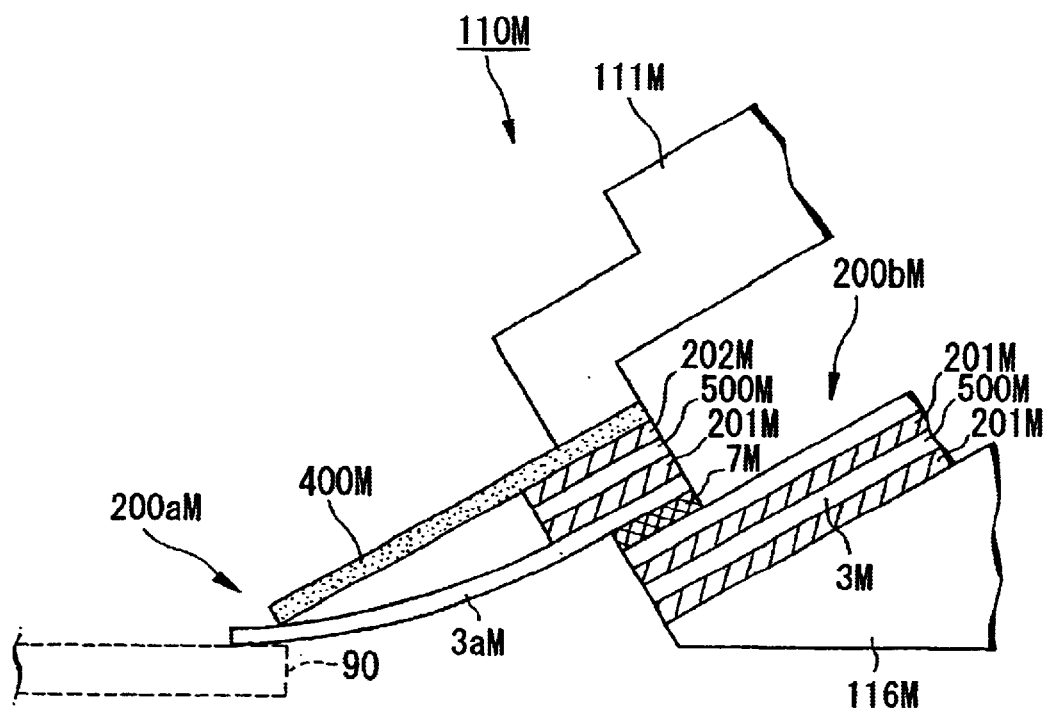
FIG. 94 is a side view showing the probe device in the thirty-eighth embodiment of the probe device according to the present invention.

A thirty-eighth embodiment will now be described with reference to FIGS. 93 and 94. As shown in FIG. 93, the structure includes a second resin film 202M pasted onto the metal film 500M that is attached on the resin film 201M. In FIG. 94, the highly elastic film 400M is provided on the second resin film 202M. The reason for providing the second resin film 202M, is that short circuit between the metal film 500M and a terminal 301M of a TABIC 300M is prevented when the terminal 301M is pressed by the projection 113M of the top clamp 111M in order to connect the contact probe 200M and the terminal 301M of the TABIC 300M. Furthermore, the surface of the metal film 500M is covered by the second resin film 202M so that oxidation can effectively be restrained. Also with the probe device for an LCD according to the thirty-eighth embodiment, the effect similar to those in the thirty-first through the thirty-sixth embodiments can be achieved and the effect of preventing short circuit and preventing oxidation can also be achieved.

Figure 95:
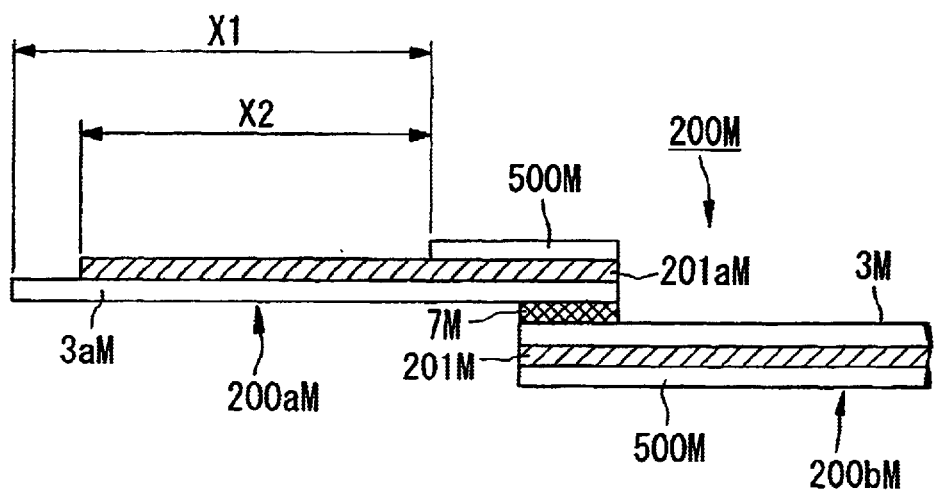
FIG. 95 is a side view showing a contact probe in a thirty-ninth embodiment of a probe device according to the present invention.
Figure 96:
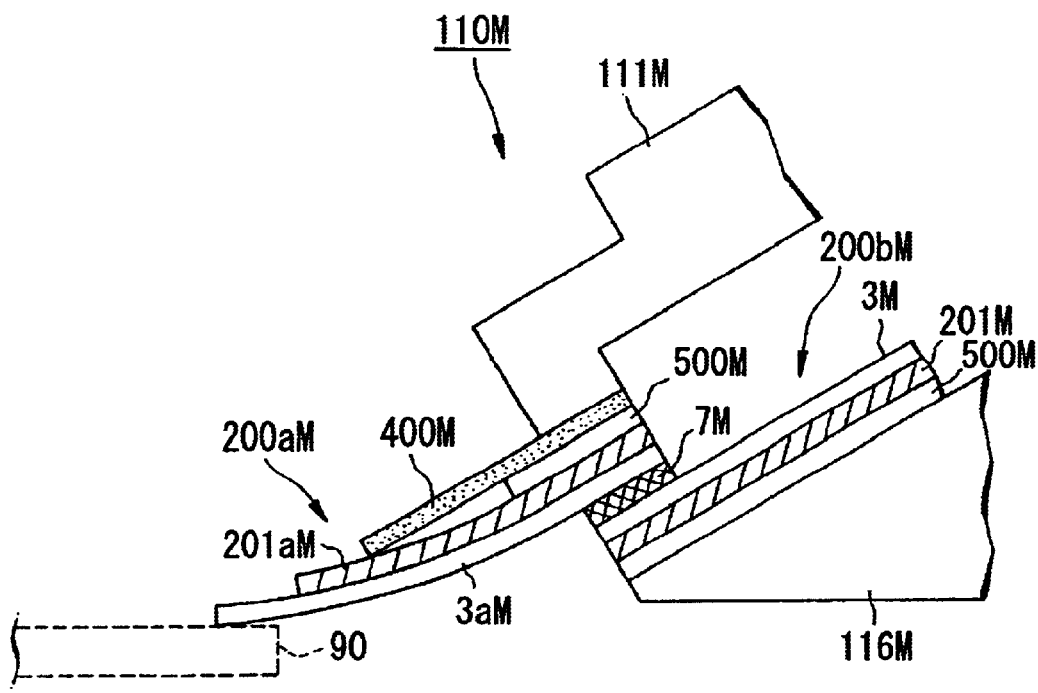
FIG. 96 is a side view showing the probe device in the thirty-ninth embodiment of the probe device according to the present invention.

According to the thirty-fourth, the thirty-sixth and the thirty-seventh embodiments, the highly elastic film 400M is pressed against the contact pins 3aM. Thus, friction between the highly elastic film 400M and the contact pins 3aM due to repeated use causes a distortion in the contact pins 3aM resulting in shifted contact points. Therefore, according to the thirty-ninth embodiment, as shown in FIG. 95, a film 201aM is provided having a width wider than that in the conventional example, wherein X1>X2, where X1 designates a length of the contact pin 3aM projecting from the metal film 500M, and X2 designates a length of the wide resin film 201aM projecting from the metal film 500M. Furthermore, as shown in FIG. 96, when the high elastic film 400I projects a shorter distance than the wide resin film 201aI, the highly elastic film 400M is brought into contact with the soft and wide resin film 201aM. In this way, the elastic film 400M is not brought into direct contact with the contact pins 3aM and accordingly, the contact pins 3aM can be prevented from bending to the left and right direction. Also in the probe device for an LCD according to the thirty-ninth embodiment, owing to a synergistic effect of preventing the contact pin 3aM from bending in the left and right direction and the above described easiness in positioning, the contact of the contact pin 3aM with respect to the terminal of the LCD 90 can be conducted more finely.

Figure 97:
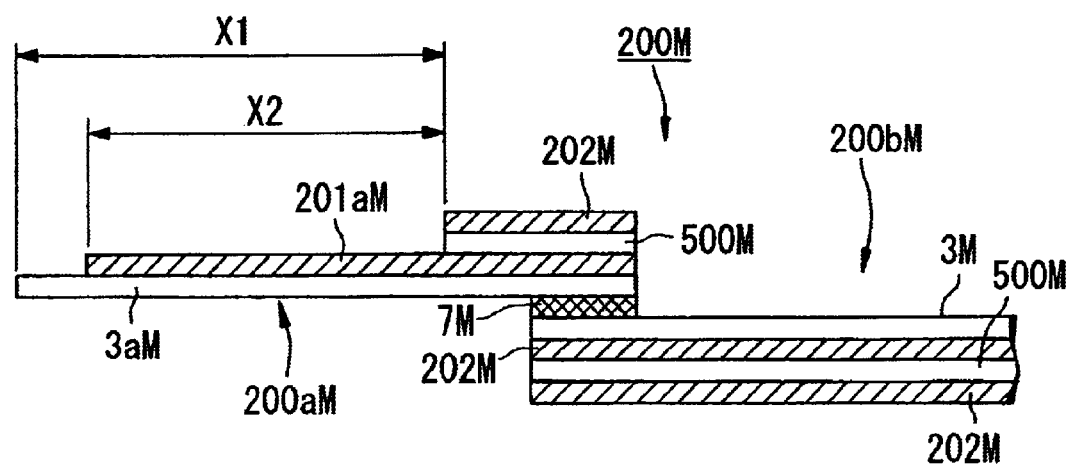
FIG. 97 is a side view showing a contact probe in a fortieth embodiment of a probe device according to the present invention.
Figure 98:
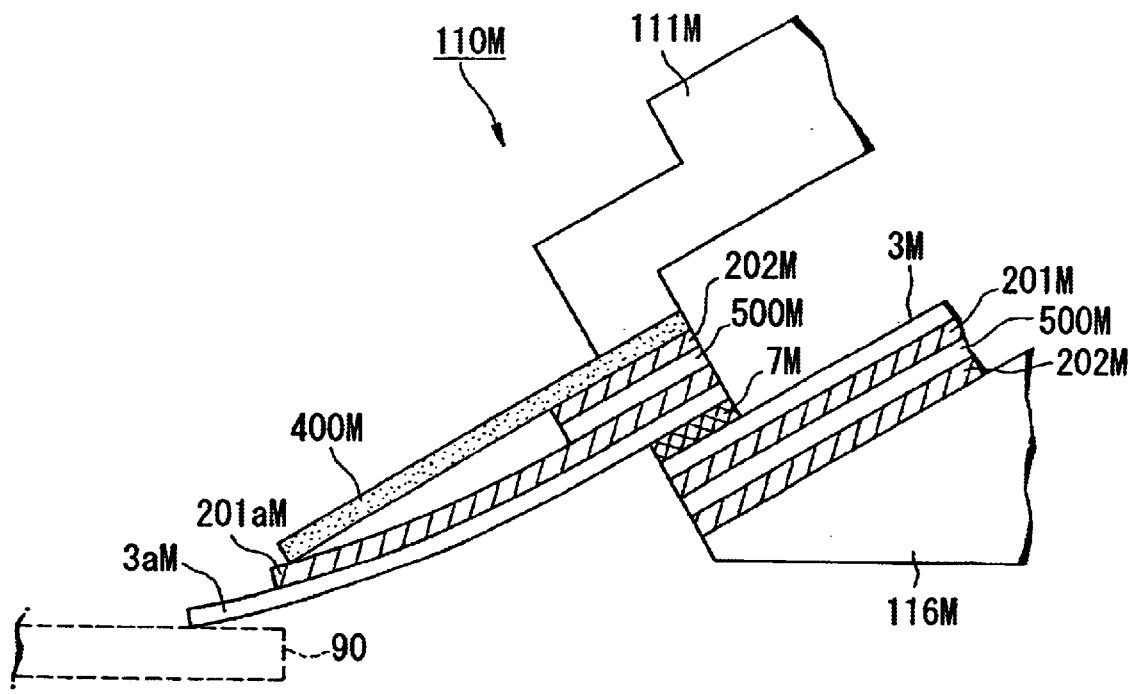
FIG. 98 is a side view showing the probe device in the fortieth embodiment of the probe device according to the present invention.
Figure 99:
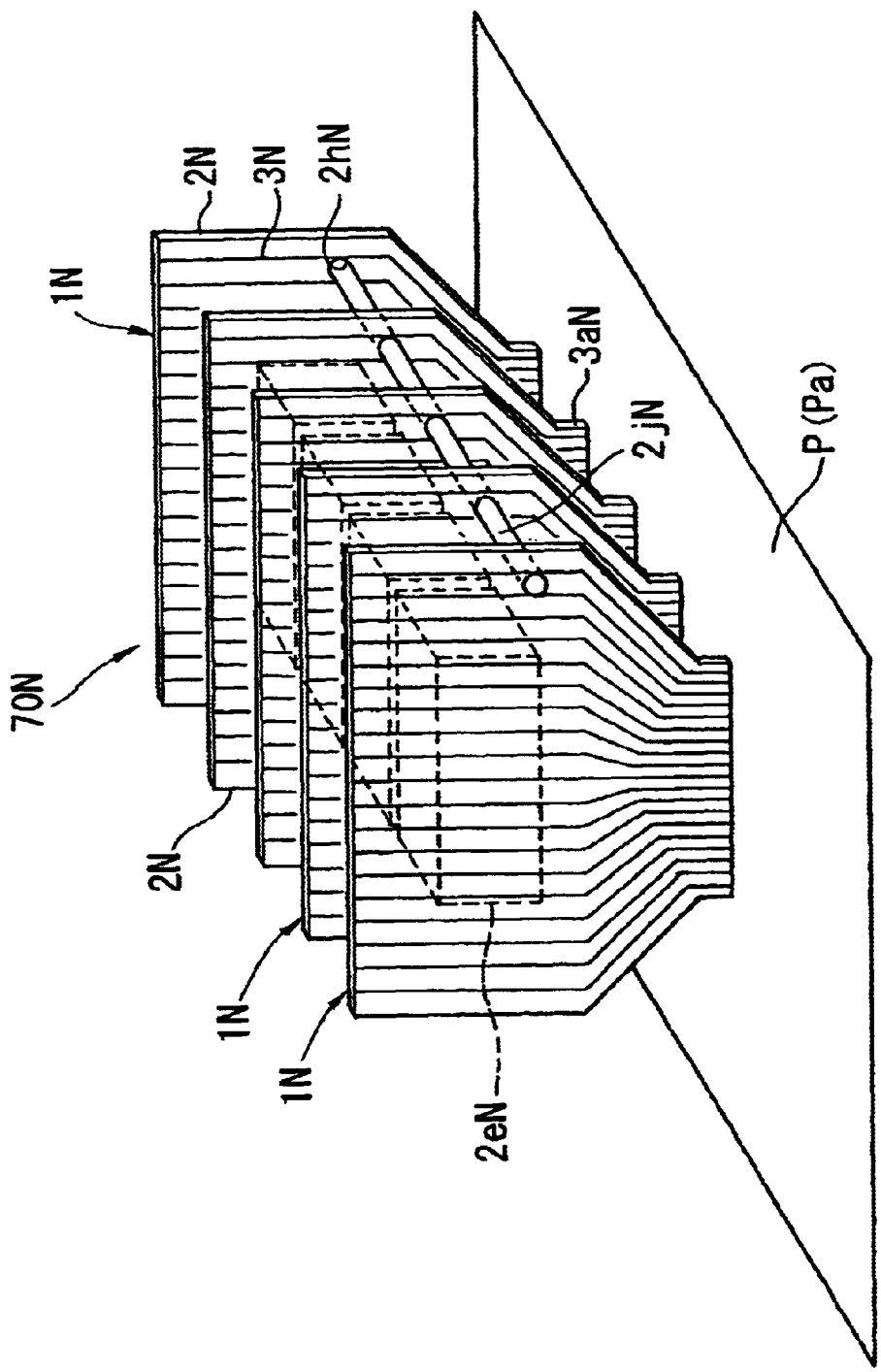
FIG. 99 is a perspective view of essential portions showing a forty-first embodiment of a probe device according to the present invention.

A fortieth embodiment will now be described with reference to FIGS. 97 and 98. According to the embodiment, a second resin film 202M is attached on the metal film 500M. In this embodiment X1>X2, where X1 designates a length of the contact pin 3aM projecting from the metal film 500M, and X2 designates a length of the wide resin film 201aM projecting from the metal film 500M. Furthermore, as shown in FIG. 98, the highly elastic film 400M provided on the second resin film 202M is laminated such that it projects a shorter distance over the contact pins 3aM than the wide resin film 201aM. Also in the probe device for an LCD according to the fortieth embodiment, short circuit between the metal film 500M and the terminal 301M of the TABIC 300M can be prevented. Furthermore, by providing the second resin film 202M, the surface of the metal film 500M is covered so that oxidation can effectively be restrained.

Figure 101:
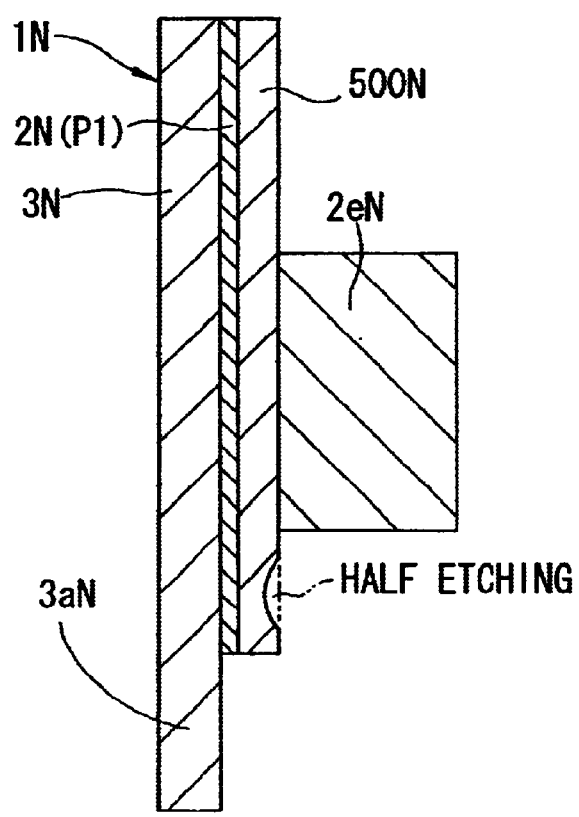
FIG. 101 is a magnified side view thereof.
Figure 102:
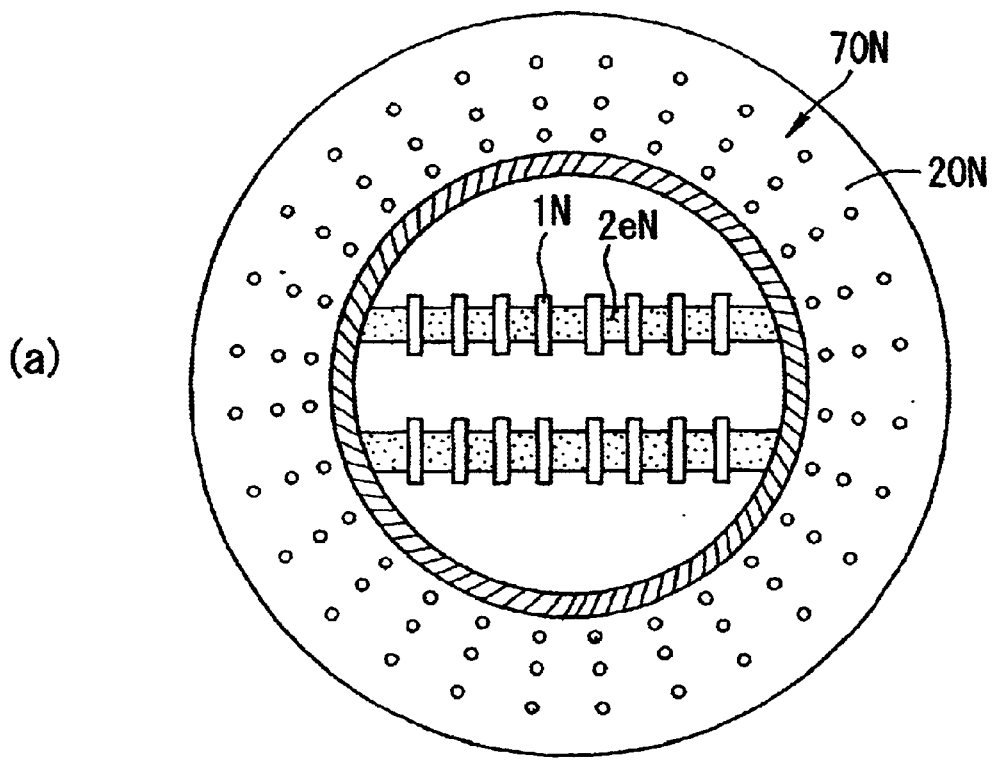
FIG. 102(a) is a plane view showing the forty-first embodiment of the probe device according to the present invention and FIG. 102(b) is a side view thereof.
Figure 102:
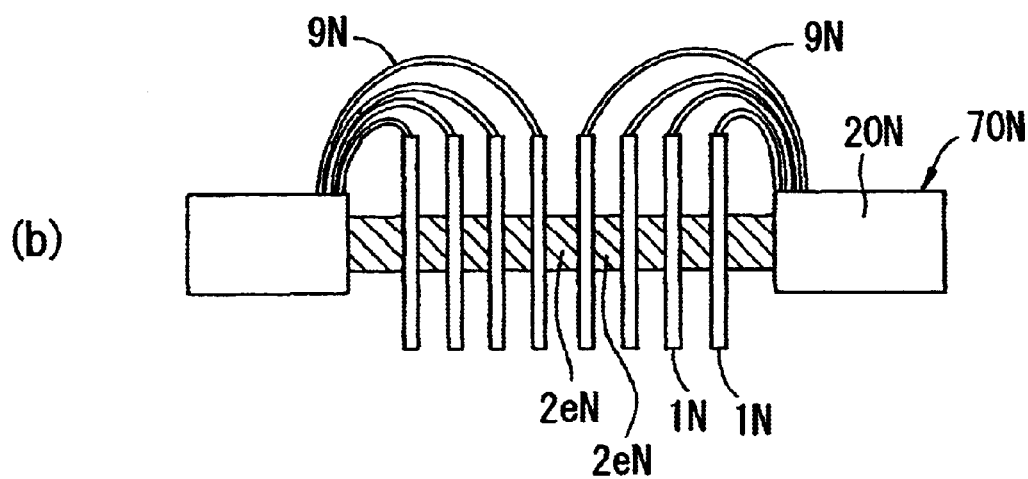
Figure 103:
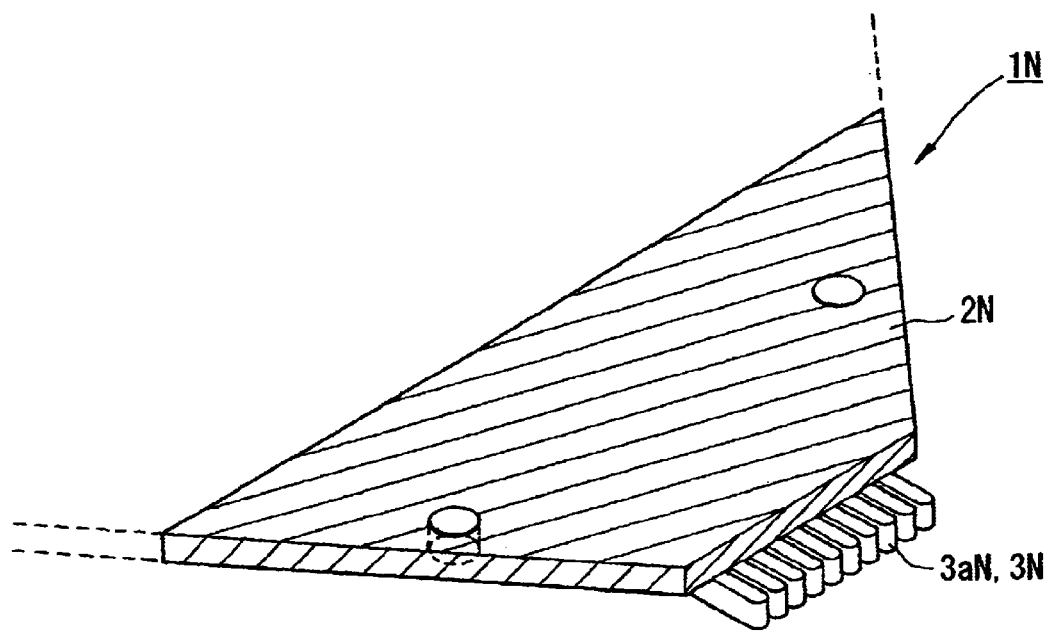
FIG. 103 is a perspective view of essential portions showing the forty-first embodiment of the contact probe according to the present invention.

A forty-first embodiment of the probe device according to the present invention will now be described with reference to FIGS. 99–106. In FIGS. 99–106, notation 1N designates a contact probe, notation 2N designates a resin film (film), notation 3N designates wiring patterns, and notation 70N designates a probe device (probe card). As shown in FIG. 103, the contact probe 1N of the present embodiment is provided with the structure where the wiring patterns 3N made of a metal are attached on one face of the polyimide resin film 2N and the front ends of the wiring patterns 3N are projected from an end portion of the resin film 2N so as to form contact pins 3aN. As shown in FIGS. 99–102, according to the probe device 70N, the contact probes 1N are arranged such that axial lines of the respective contact pins 3aN are substantially vertical to a contact face Pa of terminal electrodes (object of measurement). The contact probes 1N are arranged parallel to each other with interposing spacers 2eN between faces of the resin films 2N. The spacers 2eN comprise a nonconductive material, for example, ceramics etc. and function also as supporting bodies for supporting the contact probes 1N. At side portions of resin films 2N, positioning holes 2hN are provided and ceramic rods 2jN are inserted through the positioning holes by which the positioning of the contact probes 1N is performed. As shown in FIG. 101, a metal film (metal thin plate) 500N is provided opposed to wiring patterns 3N with the resin film 2N therebetween. Furthermore, half-etching is performed on the back side of the metal film 500N at a predetermined position in the axial line direction of the contact pin 3aN.

The fabrication steps of the contact probes 1N will now be described. The base metal layer forming step, the pattern forming step, the electrolytic plating step, the film pasting step, and the separating step are the same as those in the first embodiment. The difference resides in that the following additional step:

Half-etching Step

A portion of the metal film 500N is half-etched as shown in FIG. 101. The half-etching process in this case, is performed in the step of etching the metal film 500N by using a photolithography technology, where all of a metal (copper) is not etched but the etching process is finished in the middle of the processing. Thereafter, the gold coating step is performed similar to the above-described first embodiment.

Figure 100:
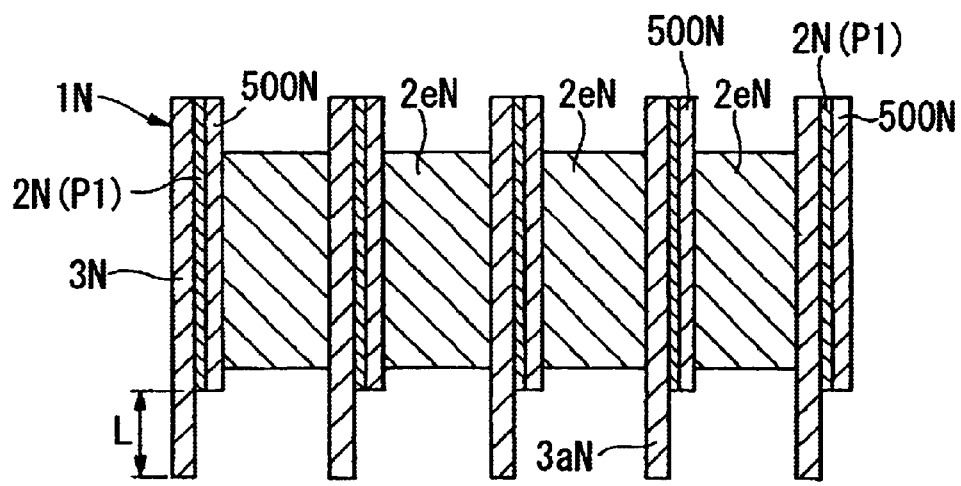
FIG. 100 is a side view thereof.
Figure 105:
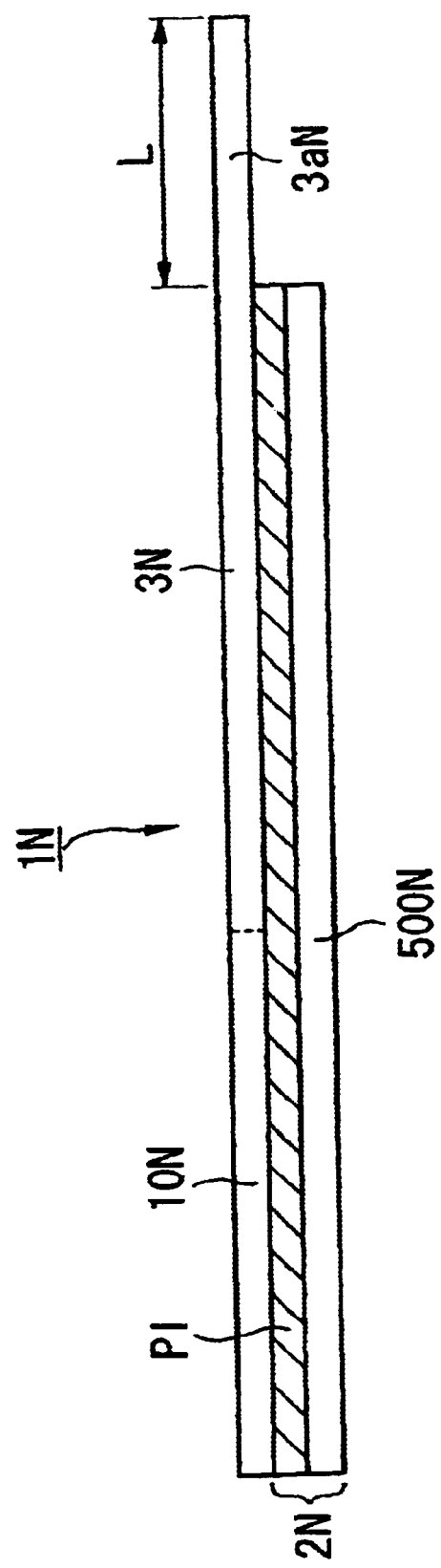
FIG. 105 is a sectional view taken along a line C—C of FIG. 104.
Figure 106:
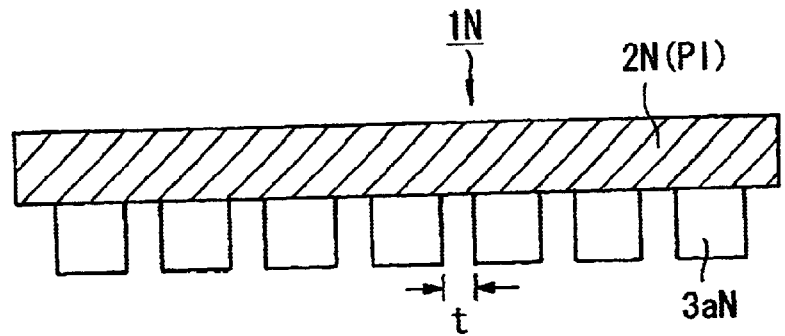
FIG. 106 is a front view for explaining a metal thin plate in the forty-first embodiment of the contact probe according to the present invention.

As shown in FIG. 100 and FIG. 105, the metal film 500N is provided up to the vicinity of the contact pin 3aN with a length L of contact pin 3aN projecting past the metal film 550N. The length L is fixed to 5 mm or less and the metal film 500N can be used as a ground, whereby a design taking an impedance matching up to the vicinity of the front end of the probe device 70N can be performed and adverse influence caused by reflection noise can be prevented in performing a test at a high frequency region. Furthermore, the metal film 500N attached on the resin film 2N (polyimide resin PI) further provides the following advantages. That is, when the metal film 500N is not present, since the resin film 2N comprises polyimide resin, as shown in FIG. 106, an elongation is caused due to absorbed moisture and the interval t between the contact pins 3aN may changed. Therefore, the contact pins 3aN cannot be brought into contact with predetermined positions of the terminal electrodes and an accurate electrical testing cannot be performed. According to the embodiment, by pasting the metal film 500N on the resin film 2N, the change in the interval t is reduced even with changes in the humidity, whereby the contact pins 3aN can firmly be brought into contact with the predetermined positions of terminal electrodes.

Figure 104:
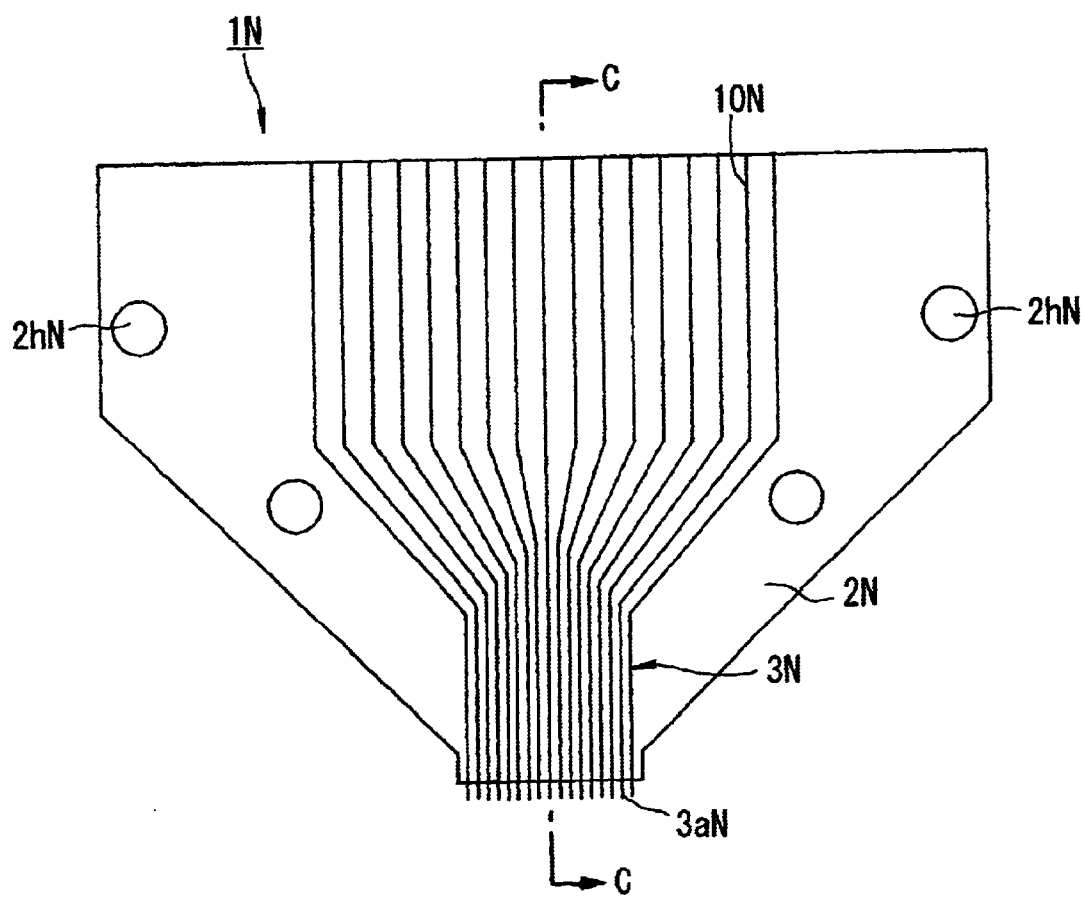
FIG. 104 is a plane view showing the forty-first embodiment of the contact probe according to the present invention.

FIG. 104 is a drawing showing the contact probe 1N cut in a predetermined shape so as to form an IC probe and FIG. 105 is a sectional view taken along a line C—C of FIG. 104. As shown in FIG. 104, the resin film 2N is provided with the positioning holes 2hN for inserting the rods 2jN. As shown in FIGS. 102(*a*) and 102(*b*) and FIG. 105, the wiring patterns 3N are connected to an end portion of a flexible substrate (FPC) 9N via lead-out wirings 10N and the other end portion of the flexible substrate 9N is connected to a printed circuit board 20N thereby constituting the probe device 70N.

In carrying out a probe test of an IC chip by using the probe device 70N constructed as described above, the probe device 70N is bonded to a prober and electrically connected to a tester, predetermined electric signals are sent to the IC chip on a wafer from the contact pins 3aN of the wiring patterns 3N, whereby the output signals from the IC chip are transmitted to the tester from the contact pins 3aN and electric properties of IC chip are measured. According to the probe device 70N of the present embodiment, a plurality of the contact probes 1N are provided. Each probe 1N includes the contact pins 3aN projecting from the resin film 2N. The axial lines of the contact pins 3aN are arranged to be substantially orthogonal to the contact face Pa of the terminal electrodes P. The resin films 2N are arranged in parallel intervals with interposing spacers 2eN. Accordingly, the device can correspond to planarly arranged terminals and a multi pin formation can be realized. In this case, according to the embodiment, the material of the wiring patterns 3N (contact pin 3aN) is Ni or a Ni alloy. Therefore, as compared with the conventional device using tungsten, the contact pins 3aN are flexible even if they are arranged substantially vertically. In this way, the contact of all pins, including long the short pins 3aN, with the terminal electrodes P can be ensured.

Also, by conducting the half-etching at a predetermined position of the metal film 500N at the back side of the contact pin 3aN, the directions for bending and the positions for bending of the contact pins 3aN in the overdriving operation can be made to be the same as each other and the pin is highly flexible by a smaller buckling load. Accordingly, contiguous ones of the contact pins 3aN can be prevented from being erroneously brought into contact with each other. In addition, although according to the forty-first embodiment, the probe device 70N is used as a probe card, the device may be adapted to be used in other measurement jigs, etc. For example, device may be used in a socket, etc. for testing an IC chip wherein the socket protects the IC chip by holding the IC chip therein and wherein the socket is mounted in a device for a burn-in test of the IC chip, etc.

Figure 107:
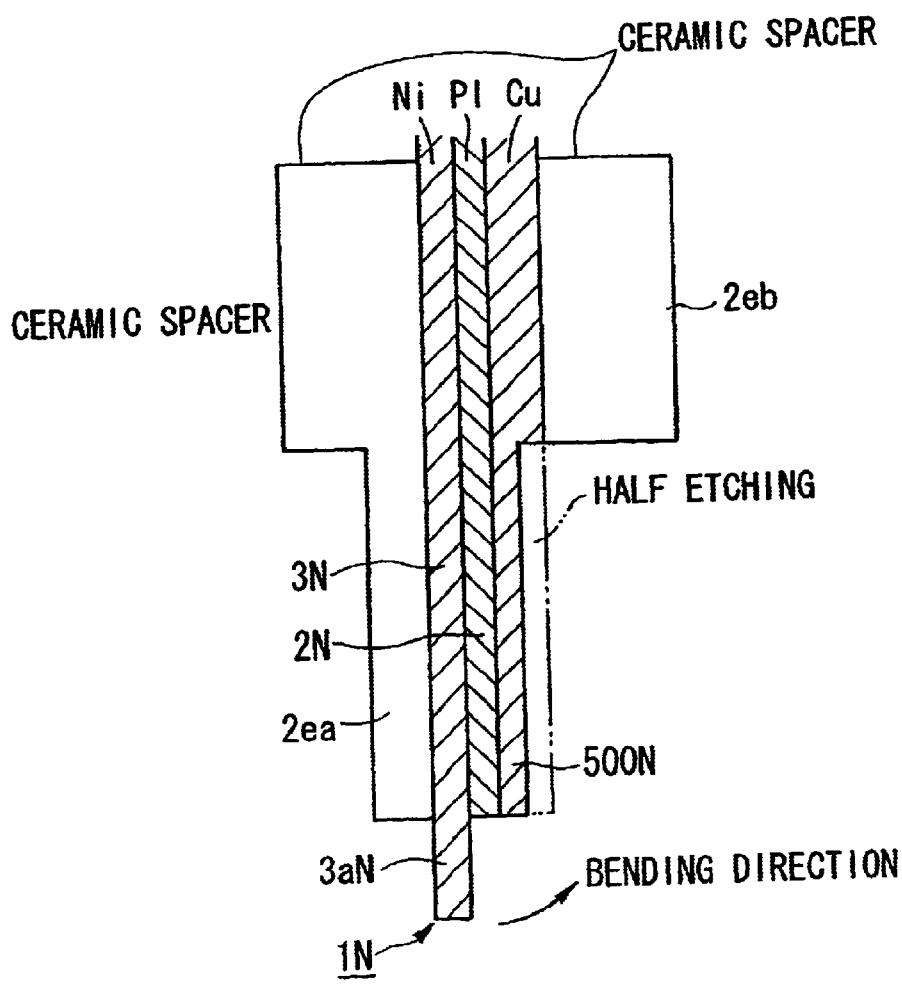
FIG. 107 is a magnified side view of essential portions showing a forty-second embodiment of a probe device according to the present invention.

A forty-second embodiment will now be described with reference to FIG. 107. According to a probe device of the present embodiment, the contact probe 1N is supported by a couple of spacers 2ea and 2eb from both face sides of the resin film 2N. With respect to one of the pair of the spacers 2ea, a length in the axial line direction of the wiring patterns 3N is formed to be longer than that of the other spacer 2eb. Further, the other spacer 2eb is provided contiguous to the metal film 500N and with respect to the metal film 500N, a front end side that is not brought into contact with (supported by) the other spacer 2eb, is subjected to half-etching (refer to two dotted chain line). According to the embodiment, the contact pin 3aN is not bent toward the face of the resin film 2N supported by the longer one of the spacer 2ea (left side in the drawing) but is necessarily bent to the side of the resin film supported by the shorter one of the spacer 2eb (right side in the drawing). Therefore, the direction of bending can be made constant. Furthermore, the support force of the respective resin film 2N can be adjusted by the magnitudes of the lengths of the spacers 2ea and 2eb. Accordingly, the bending amount can also be made constant. Thereby, both the bending direction and the bending amount can be adjusted to be constant. In addition, a second resin film may further and directly be attached on the face of the metal film 500N in contact with the other spacer 2eb. Thereby, in tightening the contact probe in the integrating operation of the contact probe 1N by the spacers 2ea and 2eb, the operation and the effect where the spacer constitutes a buffer member, is provided. Accordingly, damage which the wiring patterns 3N suffer in the integrating operation can be alleviated.

Figure 108:
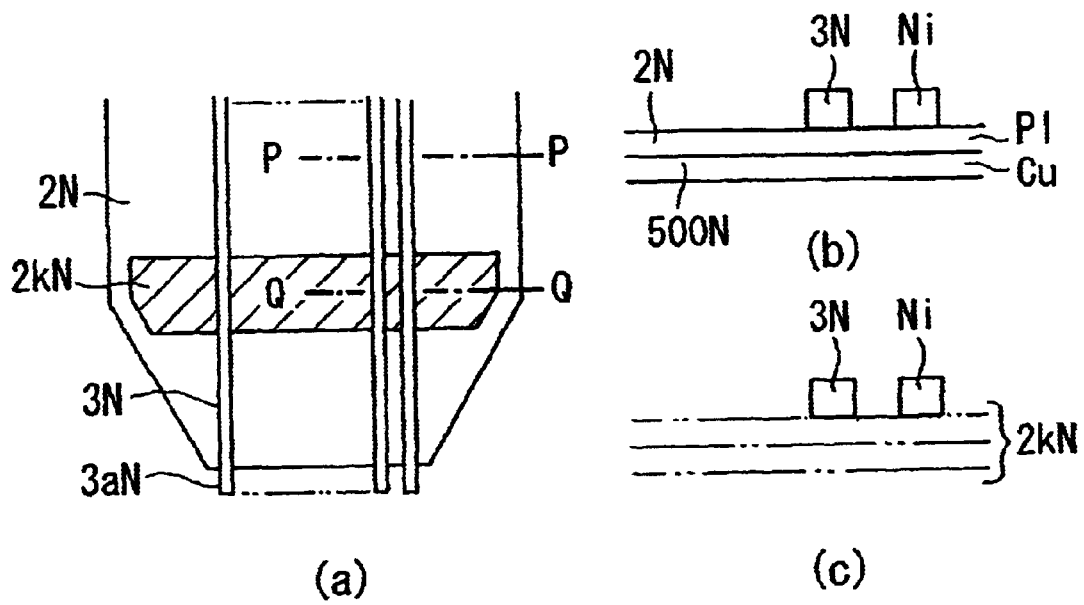
FIGS. 108(a), 108(b) and 108(c) illustrate a forty-third embodiment of a contact probe according to the present invention where

A forty-third embodiment will now be described with reference to FIGS. 108(*a*), 108(*b*) and 108(*c*). According to the embodiment, a punched-out region 2kN in a direction substantially orthogonal to the axial lines of the wiring patterns 3N is provided in the resin film 2N. The formation of the punched-out region 2kN is performed by etching a predetermined portion of the metal film 500N and irradiating a laser beam on the portion so that the resin film 2N and the adhesive agent (not shown) are removed. According to the embodiment, compared with other regions of the resin film 2N where the wiring patterns 3N are formed, a force for supporting the wiring patterns 3N is weakened due to the punched-out region 2kN. Accordingly, in the overdriving operation the wiring patterns 3N (contact pin 3aN) are bent at the portion of the punched-out region 2kN. Thereby, the bending position can be made constant and the pin can be made flexible. Furthermore, a force of the resin film 2N for supporting the wiring patterns 3N is weakened approximately in a constant relationship to the punched-out region 2kN. Accordingly, the amount of bending of the wiring patterns 3N can be made substantially constant.

According to a forty-fourth embodiment (not illustrated), the resin film 2N is bent centering on a virtual line substantially orthogonal to the axial lines of the wiring patterns 3N. That is, a portion of the resin film 2N lower than the portion supported by the spacer 2eN is bent by using a jig, etc. so that the resin film is elastically bent. Thereby, the contact pins 3aN are bent centering on the imaginary lines of the resin films 2N and long or short ones of the total of pins 3aN can firmly be brought into contact with terminals.

Figure 109:
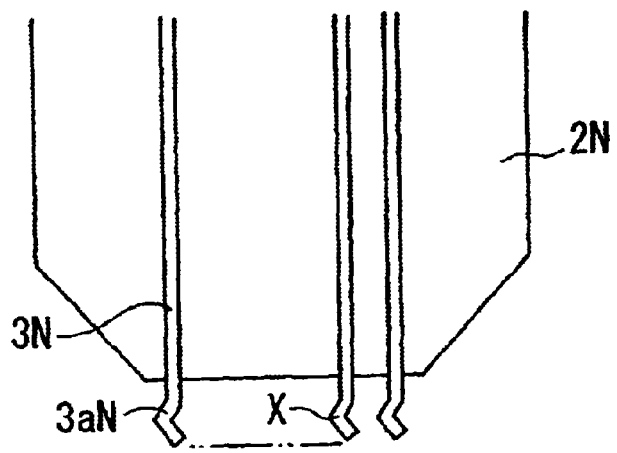
FIG. 109 is a plane view showing a forty-fifth embodiment of a contact probe according to the present invention.

A forty-fifth embodiment will now be described with reference to FIG. 109. According to the embodiment, the photomask used in the pattern forming step, is formed such that the shape at a portion corresponding to the contact pin 3aN is bent at a middle portion X in the axial line direction. By using the photomask, with respect to the photoresist layer (mask) which has been subjected to mask exposure and development, the shape of the portion corresponding to the contact pin 3aN in the unmasked portions is formed to be bent at the middle position X in the axial line direction. Furthermore, the contact pin 3aN fabricated by a Ni plating treatment thereafter, is formed to be bent at the middle portion X in the axial line direction. Therefore, in the overdriving operation, the pin is bent at the bending point X. In this case, since the mask exposure technology is used, with respect to the bending point X of the contact pin 3aN, adjustment of the bending angle or the pin width can be performed accurately. As a result, the direction and the amount of the bending can be controlled accurately. Furthermore, the photomask can be repeatedly used after it is prepared. A Accordingly, compared with the device where, for example, the pin 3aN and the resin film 2N are bent by using jigs, etc. after fabricating the contact pin 3aN, products with high accuracy can be produced in a large amount. Furthermore, compared with products where, for example, half-etching or pin bending is performed after fabricating the contact pin 3aN, only the mask shape is changed according to the present embodiment.

Obviously, numerous modifications and variations of the present invention are possible in light of the above teachings. It is therefore to be understood that within the scope of the appended claims, the invention may be practiced otherwise than as specifically described herein.

What is claimed as new and is desired to be Secured by Letters Patent of the United States is:

1. In a probe device, an improved contact probe device including a plurality of contact probes, each contact probe comprising:

a film;

a plurality of wiring patterns formed on a first surface of the film, each wiring pattern having a front end portion projecting out from the first surface of the film in a direction parallel to the first surface of the film so as to form contact pins; and a metal layer provided on a second surface of the film;

wherein the plurality of contact probes are arranged such that the axial lines of the contact pins are substantially vertical to a contact face of an object of measurement, and the plurality of contact probes are disposed in parallel so as to provide spaces between respective faces of the films of the plurality of contact probes, wherein the plurality of contact pins include a fabricated bending point at a middle portion in an axial line direction with a Ni plating treatment, and wherein the fabricated bending point bends in an overdriving operation.

2. The probe device according to claim 1, wherein a direction of bending of the contact pins of the plurality of the contact probes when a buckling load is applied is configured to be substantially constant.

* * * * *

UNITED STATES PATENT AND TRADEMARK OFFICE
CERTIFICATE OF CORRECTION

PATENT NO. : 6,710,608 B2  
DATED : March 23, 2004  
INVENTOR(S) : Yoshida et al.

It is certified that error appears in the above-identified patent and that said Letters Patent is hereby corrected as shown below:

<u>Title page,</u>  
Item [73], Assignee, should read:  
-- [73] Assignee: Genesis Technology Incorporated, Hyogo, (JP) --  
Item [30], Foreign Application Priority Data, should read:  
-- [30]               Foreign Application Priority Data

| May 23, 1996 | (JP) | ................ | 8-128570 |
| Sep. 30, 1996 | (JP) | ................ | 8-259829 |
| Sep. 30, 1996 | (JP) | ................ | 8-259831 |
| Nov. 14, 1996 | (JP) | ................ | 8-303322 |
| Nov. 18, 1996 | (JP) | ................ | 8-306829 |
| Dec. 4, 1996 | (JP) | ................ | 8-324430 |
| Dec. 26, 1996 | (JP) | ................ | 8-349119 -- |

Signed and Sealed this

Twenty-first day of December, 2004

JON W. DUDAS  
*Director of the United States Patent and Trademark Office*